(12) United States Patent
Vandermeulen et al.

(10) Patent No.: US 11,624,517 B2
(45) Date of Patent: Apr. 11, 2023

(54) LIQUID DESICCANT AIR CONDITIONING SYSTEMS AND METHODS

(71) Applicant: Emerson Climate Technologies, Inc., Sidney, OH (US)

(72) Inventors: Peter F. Vandermeulen, Newburyport, MA (US); Jack I. Hanoka, Brookline, MA (US)

(73) Assignee: Emerson Climate Technologies, Inc., Sidney, OH (US)

( * ) Notice: Subject to any disclaimer, the term of this patent is extended or adjusted under 35 U.S.C. 154(b) by 134 days.

(21) Appl. No.: 17/002,371

(22) Filed: Aug. 25, 2020

(65) Prior Publication Data

US 2020/0386421 A1 Dec. 10, 2020

Related U.S. Application Data

(60) Continuation of application No. 16/189,518, filed on Nov. 13, 2018, now Pat. No. 10,753,624, which is a
(Continued)

(51) Int. Cl.
*F24F 3/14* (2006.01)
*H01L 31/052* (2014.01)
(Continued)

(52) U.S. Cl.
CPC .......... *F24F 3/1417* (2013.01); *B01D 53/263* (2013.01); *F24F 13/02* (2013.01); *F28D 21/0015* (2013.01); *F28F 3/10* (2013.01); *F28F 19/00* (2013.01); *H01L 31/042* (2013.01); *H01L 31/052* (2013.01); *H01L 31/0521* (2013.01);
(Continued)

(58) Field of Classification Search
CPC .......... H02S 40/44; H02S 10/30; H02S 20/00; F24F 13/02; F24F 3/1417; F24F 2003/144; F24F 2003/1458; F24F 2003/1435; H01L 31/052; B01D 53/263; B01D 2252/103; B01D 2259/4508; F28F 3/10; Y10T 29/49815; Y02B 10/70
See application file for complete search history.

(56) References Cited

U.S. PATENT DOCUMENTS 1,791,086 A  2/1931 Sperr
2,221,787 A  11/1940 Downs et al.
(Continued)

FOREIGN PATENT DOCUMENTS

CN   86208861 U   11/1987
CN   1284613 A    2/2001
(Continued)

OTHER PUBLICATIONS

Ashrae, et al., "Desiccant Dehumidification and Pressue Drying Equipment," 2012 ASHRAE Handbook—HVAC Systems and Equipment, Chapter 24, pp. 24.1-24.12.
(Continued)

*Primary Examiner* — Frantz F Jules
*Assistant Examiner* — Martha Tadesse
(74) *Attorney, Agent, or Firm* — Armstrong Teasdale LLP

(57) ABSTRACT

Methods and systems are provided for air conditioning, capturing combustion contaminants, desalination, and other processes using liquid desiccants.

20 Claims, 44 Drawing Sheets

Related U.S. Application Data continuation of application No. 15/177,755, filed on Jun. 9, 2016, now Pat. No. 10,168,056, which is a division of application No. 13/115,776, filed on May 25, 2011, now Pat. No. 9,429,332.

(60) Provisional application No. 61/430,692, filed on Jan. 7, 2011, provisional application No. 61/348,076, filed on May 25, 2010.

(51) Int. Cl.
| | |
|---|---|
| H02S 20/00 | (2014.01) |
| B01D 53/26 | (2006.01) |
| H01L 31/042 | (2014.01) |
| H02S 40/44 | (2014.01) |
| F24F 13/02 | (2006.01) |
| F28D 21/00 | (2006.01) |
| F28F 3/10 | (2006.01) |
| F28F 19/00 | (2006.01) |
| H02S 10/30 | (2014.01) |

(52) U.S. Cl.
CPC ............. *H02S 10/30* (2014.12); *H02S 20/00* (2013.01); *H02S 40/44* (2014.12); *B01D 2252/103* (2013.01); *B01D 2259/4508* (2013.01); *F24F 2003/144* (2013.01); *F24F 2003/1435* (2013.01); *F24F 2003/1458* (2013.01); *Y02B 10/70* (2013.01); *Y10T 29/49815* (2015.01)

(56) References Cited

U.S. PATENT DOCUMENTS

| | | | |
|---|---|---|---|
| 2,235,322 A | 3/1941 | Arthur | |
| 2,433,741 A | 12/1947 | Crawford | |
| 2,634,958 A | 4/1953 | Simpelaar | |
| 2,660,159 A | 11/1953 | Hughes | |
| 2,708,915 A | 5/1955 | Mandelburg | |
| 2,939,686 A | 6/1960 | Wildermuth | |
| 2,988,171 A | 6/1961 | Arnold et al. | |
| 3,119,446 A | 1/1964 | Weiss | |
| 3,193,001 A | 7/1965 | Meckler | |
| 3,276,634 A | 10/1966 | Arnot | |
| 3,409,969 A | 11/1968 | Simons et al. | |
| 3,410,581 A | 11/1968 | Christensen | |
| 3,455,338 A | 7/1969 | Pollit | |
| 3,718,181 A | 2/1973 | Reilly et al. | |
| 3,800,515 A | 4/1974 | Asker et al. | |
| 3,853,475 A | 12/1974 | Gordon et al. | |
| 4,100,331 A | 7/1978 | Fletcher et al. | |
| 4,164,125 A | 8/1979 | Griffiths | |
| 4,176,523 A | 12/1979 | Rousseau | |
| 4,205,529 A | 6/1980 | Ko | |
| 4,209,368 A | 6/1980 | Coker et al. | |
| 4,222,244 A | 9/1980 | Meckler | |
| 4,235,221 A | 11/1980 | Murphy | |
| 4,239,507 A | 12/1980 | Benoit et al. | |
| 4,259,849 A | 4/1981 | Griffiths | |
| 4,324,947 A | 4/1982 | Dumbeck | |
| 4,399,862 A | 8/1983 | Hile | |
| 4,429,545 A * | 2/1984 | Steinberg | F24S 10/753 62/235.1 |
| 4,435,339 A | 3/1984 | Kragh | |
| 4,444,992 A | 4/1984 | Cox | |
| 4,583,996 A | 4/1986 | Sakata et al. | |
| 4,607,132 A | 8/1986 | Jarnagin | |
| 4,612,019 A | 9/1986 | Langhorst | |
| 4,649,899 A | 3/1987 | Moore | |
| 4,659,899 A | 4/1987 | Welkie et al. | |
| 4,660,390 A | 4/1987 | Worthington | |
| 4,691,530 A | 9/1987 | Meckler | |
| 4,703,629 A | 11/1987 | Moore | |
| 4,730,600 A | 3/1988 | Harrigill | |
| 4,744,414 A | 5/1988 | Schon | |
| 4,766,952 A | 8/1988 | Onodera | |
| 4,786,301 A | 11/1988 | Rhodes | |
| 4,832,115 A | 5/1989 | Albers et al. | |
| 4,872,578 A | 10/1989 | Fuerschbach et al. | |
| 4,882,907 A | 11/1989 | Brown | |
| 4,887,438 A | 12/1989 | Meckler | |
| 4,900,448 A | 2/1990 | Bonne et al. | |
| 4,910,971 A | 3/1990 | McNab | |
| 4,939,906 A | 7/1990 | Spatz et al. | |
| 4,941,324 A | 7/1990 | Peterson et al. | |
| 4,955,205 A | 9/1990 | Wilkinson | |
| 4,971,142 A | 11/1990 | Mergler | |
| 4,976,313 A | 12/1990 | Dahlgren et al. | |
| 4,979,965 A | 12/1990 | Sannholm | |
| 4,984,434 A | 1/1991 | Peterson et al. | |
| 4,987,750 A | 1/1991 | Meckler | |
| 5,005,371 A | 4/1991 | Yonezawa et al. | |
| 5,123,481 A | 6/1992 | Albers et al. | |
| 5,181,387 A | 1/1993 | Meckler | |
| 5,182,921 A | 2/1993 | Yan | |
| 5,186,903 A | 2/1993 | Cornwell | |
| 5,191,771 A | 3/1993 | Meckler | |
| 5,221,520 A | 6/1993 | Cornwell | |
| 5,351,497 A | 10/1994 | Lowenstein | |
| 5,361,828 A | 11/1994 | Lee et al. | |
| 5,375,429 A | 12/1994 | Tokizaki et al. | |
| 5,448,895 A | 9/1995 | Coellner et al. | |
| 5,462,113 A | 10/1995 | Wand | |
| 5,471,852 A | 12/1995 | Meckler | |
| 5,528,905 A | 6/1996 | Scarlatti | |
| 5,534,186 A | 7/1996 | Walker et al. | |
| 5,582,026 A | 12/1996 | Barto et al. | |
| 5,595,690 A | 1/1997 | Filburn et al. | |
| 5,605,628 A | 2/1997 | Davidson et al. | |
| 5,606,865 A | 3/1997 | Caron | |
| 5,638,900 A | 6/1997 | Lowenstein et al. | |
| 5,641,337 A | 6/1997 | Arrowsmith et al. | |
| 5,661,983 A * | 9/1997 | Groten | B01D 53/261 62/57 |
| 5,685,152 A | 11/1997 | Sterling | |
| 5,685,485 A | 11/1997 | Mock et al. | |
| 5,797,272 A | 8/1998 | James | |
| 5,816,065 A | 10/1998 | Maeda | |
| 5,832,993 A | 11/1998 | Ohata et al. | |
| 5,860,284 A | 1/1999 | Goland et al. | |
| 5,860,285 A | 1/1999 | Tulpule | |
| 5,928,808 A | 7/1999 | Eshraghi | |
| 5,933,702 A | 8/1999 | Goswami | |
| 5,950,442 A | 9/1999 | Maeda et al. | |
| 6,012,296 A | 1/2000 | Shah | |
| 6,018,954 A | 2/2000 | Assaf | |
| 6,035,657 A | 3/2000 | Dobak et al. | |
| 6,083,387 A | 7/2000 | Leblanc et al. | |
| 6,103,969 A | 8/2000 | Bussey | |
| 6,130,263 A | 10/2000 | Hekal | |
| 6,131,649 A | 10/2000 | Pearl et al. | |
| 6,134,903 A | 10/2000 | Potnis et al. | |
| 6,138,470 A | 10/2000 | Potnis et al. | |
| 6,156,102 A | 12/2000 | Conrad et al. | |
| 6,171,374 B1 | 1/2001 | Barton et al. | |
| 6,216,483 B1 | 4/2001 | Potnis et al. | |
| 6,216,489 B1 | 4/2001 | Potnis et al. | |
| 6,244,062 B1 | 6/2001 | Prado | |
| 6,247,604 B1 | 6/2001 | Taskis et al. | |
| 6,266,975 B1 | 7/2001 | Assaf | |
| 6,417,423 B1 | 7/2002 | Koper et al. | |
| 6,442,951 B1 | 9/2002 | Maeda et al. | |
| 6,463,750 B2 | 10/2002 | Assaf | |
| 6,487,872 B1 | 12/2002 | Forkosh et al. | |
| 6,488,900 B1 | 12/2002 | Call et al. | |
| 6,497,107 B2 | 12/2002 | Maisotsenko et al. | |
| 6,497,749 B2 | 12/2002 | Kesten et al. | |
| 6,502,807 B1 | 1/2003 | Assaf et al. | |
| 6,514,321 B1 | 2/2003 | Lehto et al. | |
| 6,539,731 B2 | 4/2003 | Kesten et al. | |
| 6,546,746 B2 | 4/2003 | Forkosh et al. | |
| 6,557,365 B2 | 5/2003 | Dinnage et al. | |
| 6,660,069 B2 | 12/2003 | Sato et al. | |

(56) References Cited

U.S. PATENT DOCUMENTS

| | | |
|---|---|---|
| 6,684,649 B1 | 2/2004 | Thompson |
| 6,739,142 B2 | 5/2004 | Korin |
| 6,745,826 B2 | 6/2004 | Lowenstein et al. |
| 6,766,817 B2 | 7/2004 | Da Silva |
| 6,848,265 B2 | 2/2005 | Lowenstein et al. |
| 6,854,278 B2 | 2/2005 | Maisotsenko et al. |
| 6,854,279 B1 | 2/2005 | Digiovanni et al. |
| 6,918,404 B2 | 7/2005 | Da Silva |
| 6,938,434 B1 | 9/2005 | Fair |
| 6,945,065 B2 | 9/2005 | Lee et al. |
| 6,976,365 B2 | 12/2005 | Forkosh et al. |
| 6,986,428 B2 | 1/2006 | Hester et al. |
| 7,066,586 B2 | 6/2006 | Da Silva |
| RE39,288 E | 9/2006 | Assaf |
| 7,143,597 B2 | 12/2006 | Hyland et al. |
| 7,191,821 B2 | 3/2007 | Gronwall |
| 7,197,887 B2 | 4/2007 | Maisotsenko et al. |
| 7,228,891 B2 | 6/2007 | Shin et al. |
| 7,258,923 B2 | 8/2007 | Van den Bogerd et al. |
| 7,269,966 B2 | 9/2007 | Lowenstein et al. |
| 7,279,215 B2 | 10/2007 | Hester et al. |
| 7,306,650 B2 * | 12/2007 | Slayzak ............... B01D 47/14 95/91 |
| 7,326,363 B2 | 2/2008 | Faust et al. |
| 7,337,615 B2 | 3/2008 | Reidy |
| 7,430,878 B2 | 10/2008 | Assaf |
| 7,758,671 B2 | 7/2010 | Kesten et al. |
| 7,930,896 B2 | 4/2011 | Matsui et al. |
| 7,938,888 B2 | 5/2011 | Assaf |
| 3,141,379 A1 | 3/2012 | Al-Hadhrami et al. |
| 8,337,590 B2 | 12/2012 | Herencia et al. |
| 8,353,175 B2 | 1/2013 | Wohlert |
| 8,496,732 B2 | 7/2013 | Culp et al. |
| 3,500,960 A1 | 8/2013 | Ehrenberg et al. |
| 8,499,576 B2 | 8/2013 | Meijer |
| 8,622,231 B2 | 1/2014 | Wooldridge |
| 8,623,210 B2 | 1/2014 | Manabe et al. |
| 8,641,806 B2 | 2/2014 | Claridge et al. |
| 8,648,209 B1 | 2/2014 | Lastella |
| 8,695,363 B2 | 4/2014 | Tang et al. |
| 8,696,805 B2 | 4/2014 | Chang et al. |
| 8,769,971 B2 | 7/2014 | Kozubal et al. |
| 8,790,454 B2 | 7/2014 | Lee et al. |
| 8,800,308 B2 | 8/2014 | Vandermeulen et al. |
| 8,876,943 B2 | 11/2014 | Gottlieb et al. |
| 8,881,806 B2 | 11/2014 | Xie et al. |
| 8,943,844 B2 | 2/2015 | Forkosh |
| 8,943,850 B2 | 2/2015 | Vandermeulen et al. |
| 8,968,945 B2 | 3/2015 | Fasold et al. |
| 9,000,289 B2 | 4/2015 | Vandermeulen et al. |
| 9,086,223 B2 | 7/2015 | Vandermeulen et al. |
| 9,101,874 B2 | 8/2015 | Vandermeulen |
| 9,101,875 B2 | 8/2015 | Vandermeulen et al. |
| 9,243,810 B2 | 1/2016 | Vandermeulen et al. |
| 9,273,877 B2 | 3/2016 | Vandermeulen et al. |
| 9,308,490 B2 | 4/2016 | Vandermeulen et al. |
| 9,377,207 B2 | 6/2016 | Vandermeulen et al. |
| 9,429,332 B2 | 8/2016 | Vandermeulen et al. |
| 9,470,426 B2 | 10/2016 | Vandermeulen |
| 9,506,697 B2 | 11/2016 | Vandermeulen |
| 9,631,823 B2 | 4/2017 | Vandermeulen et al. |
| 9,631,824 B1 | 4/2017 | Maisey et al. |
| 9,631,848 B2 | 4/2017 | Vandermeulen et al. |
| 9,709,285 B2 | 7/2017 | Vandermeulen |
| 9,709,286 B2 | 7/2017 | Vandermeulen |
| 9,835,340 B2 | 12/2017 | Vandermeulen et al. |
| 10,006,648 B2 | 6/2018 | Vandermeulen et al. |
| 10,024,558 B2 | 7/2018 | Vandermeulen |
| 10,024,601 B2 | 7/2018 | Vandermeulen |
| 10,168,056 B2 | 1/2019 | Vandermeulen et al. |
| 10,323,867 B2 | 6/2019 | Vandermeulen |
| 2001/0008148 A1 | 7/2001 | Ito et al. |
| 2001/0013226 A1 | 8/2001 | Potnis et al. |
| 2001/0015500 A1 | 8/2001 | Shimanuki et al. |
| 2002/0023740 A1 | 2/2002 | Lowenstein et al. |
| 2002/0026797 A1 | 3/2002 | Sundhar |
| 2002/0038552 A1 | 4/2002 | Maisotsenko et al. |
| 2002/0098395 A1 | 7/2002 | Shimanuki et al. |
| 2002/0104439 A1 | 8/2002 | Komkova et al. |
| 2002/0139245 A1 | 10/2002 | Kesten et al. |
| 2002/0139320 A1 | 10/2002 | Shimanuki et al. |
| 2002/0148602 A1 | 10/2002 | Nakamura |
| 2003/0000230 A1 | 1/2003 | Kopko |
| 2003/0029185 A1 | 2/2003 | Kopko |
| 2003/0033821 A1 | 2/2003 | Maisotsenko et al. |
| 2003/0051498 A1 | 3/2003 | Sanford |
| 2003/0106680 A1 | 6/2003 | Serpigo et al. |
| 2003/0121271 A1 | 7/2003 | Dinnage et al. |
| 2003/0209017 A1 | 11/2003 | Maisotsenko et al. |
| 2003/0230092 A1 | 12/2003 | Lowenstein et al. |
| 2004/0040697 A1 | 3/2004 | Pierre et al. |
| 2004/0061245 A1 | 4/2004 | Maisotsenko et al. |
| 2004/0101698 A1 | 5/2004 | Aka et al. |
| 2004/0109798 A1 | 6/2004 | Chopard et al. |
| 2004/0112077 A1 | 6/2004 | Forkosh et al. |
| 2004/0118125 A1 | 6/2004 | Potnis et al. |
| 2004/0134212 A1 | 7/2004 | Lee et al. |
| 2004/0168462 A1 * | 9/2004 | Assaf ............... F28C 1/02 62/271 |
| 2004/0194944 A1 | 10/2004 | Hendricks et al. |
| 2004/0211207 A1 | 10/2004 | Forkosh et al. |
| 2004/0230092 A1 | 11/2004 | Fhierfelder et al. |
| 2004/0231512 A1 | 11/2004 | Slayzak et al. |
| 2004/0261440 A1 | 12/2004 | Forkosh et al. |
| 2005/0095433 A1 | 5/2005 | Bogerd et al. |
| 2005/0106021 A1 | 5/2005 | Bunker et al. |
| 2005/0109052 A1 | 5/2005 | Albers et al. |
| 2005/0133082 A1 | 6/2005 | Konold et al. |
| 2005/0210907 A1 | 9/2005 | Gillan et al. |
| 2005/0217485 A1 | 10/2005 | Olapinski et al. |
| 2005/0218535 A1 | 10/2005 | Maisotsenko et al. |
| 2005/0257551 A1 | 11/2005 | Landry |
| 2006/0042295 A1 * | 3/2006 | Assaf ............... F24F 3/1417 62/331 |
| 2006/0070728 A1 | 4/2006 | Shin et al. |
| 2006/0124287 A1 | 6/2006 | Reinders |
| 2006/0156750 A1 | 7/2006 | Lowenstein et al. |
| 2006/0156761 A1 | 7/2006 | Mola et al. |
| 2006/0278089 A1 | 12/2006 | Theilow |
| 2007/0169916 A1 | 7/2007 | Wand et al. |
| 2007/0175234 A1 | 8/2007 | Pruitt |
| 2007/0234743 A1 | 10/2007 | Assaf |
| 2007/0256430 A1 | 11/2007 | Prueitt |
| 2008/0110191 A1 | 5/2008 | Lowenstein et al. |
| 2008/0127965 A1 | 6/2008 | Burton |
| 2008/0156471 A1 | 7/2008 | Han et al. |
| 2008/0196758 A1 | 8/2008 | McGuire |
| 2008/0203866 A1 | 8/2008 | Chamberlain |
| 2008/0302357 A1 | 12/2008 | Denault |
| 2008/0314567 A1 | 12/2008 | Noren |
| 2009/0000732 A1 | 1/2009 | Jacobine et al. |
| 2009/0056919 A1 | 3/2009 | Hoffman et al. |
| 2009/0095162 A1 | 4/2009 | Hargis et al. |
| 2009/0126913 A1 | 5/2009 | Lee et al. |
| 2009/0173096 A1 | 7/2009 | Wohlert |
| 2009/0183857 A1 | 7/2009 | Pierce et al. |
| 2009/0200022 A1 | 8/2009 | Bravo et al. |
| 2009/0238685 A1 | 9/2009 | Santa Ana |
| 2010/0000247 A1 * | 1/2010 | Bhatti ............... F24F 3/1417 62/235.1 |
| 2010/0012309 A1 | 1/2010 | Uges |
| 2010/0018322 A1 | 1/2010 | Neitzke et al. |
| 2010/0051083 A1 | 3/2010 | Boyk |
| 2010/0077783 A1 | 4/2010 | Bhatti et al. |
| 2010/0084120 A1 | 4/2010 | Yin et al. |
| 2010/0170499 A1 | 7/2010 | Bar |
| 2010/0170776 A1 | 7/2010 | Ehrenberg et al. |
| 2010/0319370 A1 | 12/2010 | Kozubal et al. |
| 2011/0073290 A1 | 3/2011 | Chang et al. |
| 2011/0100618 A1 | 5/2011 | Carlson |
| 2011/0101117 A1 | 5/2011 | Miyauchi et al. |
| 2011/0126885 A1 | 6/2011 | Kokotov et al. |
| 2011/0132027 A1 | 6/2011 | Gommed et al. |
| 2012/0052785 A1 | 3/2012 | Nagamatsu et al. |

(56) References Cited

U.S. PATENT DOCUMENTS

| | | | |
|---|---|---|---|
| 2012/0114527 A1 | 5/2012 | Höglund et al. |
| 2012/0118148 A1 | 5/2012 | Culp et al. |
| 2012/0118155 A1 | 5/2012 | Claridge et al. |
| 2012/0125020 A1 | 5/2012 | Vandermeulen et al. |
| 2012/0125021 A1 | 5/2012 | Vandermeulen et al. |
| 2012/0125031 A1 | 5/2012 | Vandermeulen et al. |
| 2012/0125581 A1 | 5/2012 | Allen et al. |
| 2012/0131937 A1 | 5/2012 | Vandermeulen et al. |
| 2012/0131938 A1 | 5/2012 | Vandermeulen et al. |
| 2012/0131939 A1 | 5/2012 | Vandermeulen et al. |
| 2012/0132513 A1 | 5/2012 | Vandermeulen et al. |
| 2012/0152318 A1 | 6/2012 | Kee |
| 2012/0186281 A1 | 7/2012 | Vandermeulen et al. |
| 2013/0056177 A1 | 3/2013 | Coutu et al. |
| 2013/0101909 A1 | 4/2013 | Fasold et al. |
| 2013/0186121 A1 | 7/2013 | Erb et al. |
| 2013/0199220 A1 | 8/2013 | Ma et al. |
| 2013/0227982 A1 | 9/2013 | Forkosh |
| 2013/0255287 A1 | 10/2013 | Forkosh |
| 2013/0340449 A1 | 12/2013 | Kozubal et al. |
| 2014/0054004 A1 | 2/2014 | Lepoudre et al. |
| 2014/0054013 A1 | 2/2014 | Lepoudre et al. |
| 2014/0150481 A1 | 6/2014 | Vandermeulen |
| 2014/0150656 A1 | 6/2014 | Vandermeulen |
| 2014/0150657 A1 | 6/2014 | Vandermeulen et al. |
| 2014/0150662 A1 | 6/2014 | Vandermeulen et al. |
| 2014/0223947 A1 | 8/2014 | Ranjan et al. |
| 2014/0245769 A1 | 9/2014 | Vandermeulen et al. |
| 2014/0250935 A1 | 9/2014 | Prochaska et al. |
| 2014/0260367 A1 | 9/2014 | Coutu et al. |
| 2014/0260369 A1 | 9/2014 | Lepoudre |
| 2014/0260371 A1 | 9/2014 | Vandermeulen |
| 2014/0260398 A1 | 9/2014 | Kozubal et al. |
| 2014/0260399 A1 | 9/2014 | Vandermeulen |
| 2014/0262125 A1 | 9/2014 | Erb et al. |
| 2014/0262144 A1 | 9/2014 | Erb et al. |
| 2014/0264968 A1 | 9/2014 | Erb et al. |
| 2014/0360373 A1 | 12/2014 | Peacos et al. |
| 2014/0366567 A1 | 12/2014 | Vandermeulen |
| 2015/0107287 A1 | 4/2015 | Forkosh |
| 2015/0184876 A1 | 7/2015 | Vandermeulen et al. |
| 2015/0300754 A1 | 10/2015 | Vandermeulen et al. |
| 2015/0323216 A1 | 11/2015 | Wallin |
| 2015/0338140 A1 | 11/2015 | Vandermeulen |
| 2016/0187011 A1 | 6/2016 | Vandermeulen |
| 2016/0290665 A1 | 10/2016 | Vandermeulen et al. |
| 2016/0290666 A1 | 10/2016 | Coutu et al. |
| 2017/0074530 A1 | 3/2017 | Kozubal |
| 2017/0102155 A1 | 4/2017 | Vandermeulen |
| 2017/0106639 A1 | 4/2017 | Vandermeulen et al. |
| 2017/0167794 A1 | 6/2017 | Vandermeulen |
| 2017/0184319 A1 | 6/2017 | Vandermeulen et al. |
| 2017/0292722 A1 | 10/2017 | Vandermeulen |
| 2018/0051897 A1 | 2/2018 | Vandermeulen et al. |
| 2018/0163977 A1 | 6/2018 | Vandermeulen |
| 2020/0096241 A1 | 3/2020 | Vandermeulen |

FOREIGN PATENT DOCUMENTS

| | | |
|---|---|---|
| CN | 1516797 A | 7/2004 |
| CN | 1880858 A | 12/2006 |
| CN | 101000164 A | 7/2007 |
| CN | 100366981 C | 2/2008 |
| CN | 101187486 A | 5/2008 |
| CN | 101303149 A | 11/2008 |
| CN | 101336358 A | 12/2008 |
| CN | 100476308 C | 4/2009 |
| CN | 101614469 A | 12/2009 |
| CN | 101636630 A | 1/2010 |
| CN | 101644512 A | 2/2010 |
| CN | 102282426 A | 12/2011 |
| CN | 202229469 U | 5/2012 |
| CN | 202734094 U | 2/2013 |
| EP | 781972 A2 | 7/1997 |
| EP | 1120609 A1 | 8/2001 |
| EP | 1563229 A1 | 8/2005 |
| EP | 1781995 A1 | 5/2007 |
| EP | 2256434 A2 | 12/2010 |
| EP | 2306100 A1 | 4/2011 |
| EP | 2787293 A1 | 10/2014 |
| GB | 1172247 A | 11/1969 |
| JP | S54-77443 A | 6/1979 |
| JP | S62-297647 A | 12/1987 |
| JP | H02-306067 A | 12/1990 |
| JP | H03-125830 A | 5/1991 |
| JP | H03-213921 A | 9/1991 |
| JP | H08-105669 A | 4/1996 |
| JP | H09-184692 A | 7/1997 |
| JP | H10-220914 A | 8/1998 |
| JP | H11-132503 A | 5/1999 |
| JP | H11-137948 A | 5/1999 |
| JP | H11-197439 A | 7/1999 |
| JP | H11-351700 A | 12/1999 |
| JP | 2000230730 A | 8/2000 |
| JP | 2001517773 A | 10/2001 |
| JP | 2002206834 A | 7/2002 |
| JP | 2004524504 A | 8/2004 |
| JP | 2004245474 A | 9/2004 |
| JP | 2005134060 A | 5/2005 |
| JP | 2006263508 A | 10/2006 |
| JP | 2006529022 A | 12/2006 |
| JP | 2008020138 A | 1/2008 |
| JP | 2009517622 A | 4/2009 |
| JP | 04273555 B2 | 6/2009 |
| JP | 2009180433 A | 8/2009 |
| JP | 2009192101 A | 8/2009 |
| JP | 2009281668 A | 12/2009 |
| JP | 2009293831 A | 12/2009 |
| JP | 2010054136 A | 3/2010 |
| JP | 2010247022 A | 11/2010 |
| JP | 2011064359 A | 3/2011 |
| JP | 2011511244 A | 4/2011 |
| JP | 2011092815 A | 5/2011 |
| JP | 2011163682 A | 8/2011 |
| JP | 2012073013 A | 4/2012 |
| JP | 2013064549 A | 4/2013 |
| KR | 20010017939 A | 3/2001 |
| KR | 10-20040026242 A | 3/2004 |
| KR | 10-0510774 B1 | 8/2005 |
| KR | 10-20140022785 A | 2/2014 |
| TW | 201009269 A | 3/2010 |
| WO | 1997021061 A1 | 6/1997 |
| WO | 1999022180 A1 | 5/1999 |
| WO | 2000011426 A1 | 3/2000 |
| WO | 2000055546 A1 | 9/2000 |
| WO | 2002066901 A1 | 8/2002 |
| WO | 2002086391 A1 | 10/2002 |
| WO | 2003004937 A1 | 1/2003 |
| WO | 2004046618 A1 | 6/2004 |
| WO | 2004078322 A1 | 9/2004 |
| WO | 2005050116 A1 | 6/2005 |
| WO | 2006006177 A1 | 1/2006 |
| WO | 2008037079 A1 | 4/2008 |
| WO | 2009094032 A1 | 7/2009 |
| WO | 2009144880 A1 | 12/2009 |
| WO | 2009157277 A1 | 12/2009 |
| WO | 2011062808 A1 | 5/2011 |
| WO | 2011150081 A2 | 12/2011 |
| WO | 2011161547 A2 | 12/2011 |
| WO | 2011150081 A3 | 4/2012 |
| WO | 2012071036 A1 | 5/2012 |
| WO | 2012082093 A1 | 6/2012 |
| WO | 2013172789 A1 | 11/2013 |
| WO | 2014152905 A1 | 9/2014 |
| WO | 2014201281 A1 | 12/2014 |
| WO | 2015077364 A1 | 5/2015 |

OTHER PUBLICATIONS

Beccali, et al., "Energy and Economic Assessment of Desiccant Cooling," Solar Energy, Issue 83, pp. 1828-1846, Aug. 2009.
Conde-Petit, M. 2007. Liquid Desiccant-Based Air-Conditioning Systems—LDACS, Proc. Of the 1st European Conference on

(56) References Cited

OTHER PUBLICATIONS

Polygeneration—Technologies and Applications, 217-234, A. Coronas, ed., Tarragona—Spain, Oct. 16-17, Published by CREVER—Universitat Rovira I Virgili, Tarragona, Spain.
Conde-Petit, M. 2008. Open Absorption Systems for Air-Conditioning using Membrane Contactors,Proceedings '15. Schweizerisches Status-Seminar <Energie—and Umweltforschung im Bauwesen»', Sep. 11-12—EIH Zurich, Switzerland. Published by BRENET—Eggwilstr. 16a, CH-9552 Bronschhofen—Switzerland (brenet@vogel-tech.ch).
European Search Report for EP11787343.0, dated Nov. 27, 2013.
Extended European Search Report for EP Application No. EP 19187953 dated Dec. 11, 2019.
Fimbres-Weihs, et al., "Review of 3D CFD modeling of flow and mass transfer in narrow spacer-filled channels in membrane modules," Chemical Engineering and Processing 49 (2010) pp. 759-781.
International Search Report and Written Opinion PCT/US2011/037936, dated Feb. 9, 2012.
International Preliminary Report on Patentability PCT/US2011/037936, dated Feb. 9, 2012.
Japanese Patent Application 2016-068945, Office Action dated Dec. 26, 2016.
Lachner, "An Investigation into the Feasibility of the Use of Water as a Refrigerant," International Refrigeration and Air Conditioning Conference, 723:1-9 (2004).
Li, F., et al., "Novel spacers for mass transfer enhancement in membrane separations," Journal of Membrane Science, 253 (2005), pp. 1-12.
Li, Y., et al., "CFD simulation of fluid flow through spacer-filled membrane module: selecting suitable cell types for periodic boundary conditions," Desalination 233 (2008) pp. 351-358.
Liu, et al., "Research Progress in Liquid Desiccant Air Conditioning Devices and Systems," Frontiers of Energy and Power Engineering in China, vol. 4, Issue 1, pp. 55-65, Feb. 2010.
Lowenstein, "A Solar Liquid-Desiccant Air Conditioner," Solar 2003, Proceedings of the 32nd ASES Annual Conference, Austin, TX, Jul. 2003.
Mathioulakis, "Desalination by Using Alternative Energy," Desalination, Issue 203, pp. 346-365, 2007.
Open Absorption System for Cooling and Air Conditioning using Membrane Contactors—Annual Report 2005, Publication No. Publication 260097, Project: 101310—Open Absorption System for Cooling and Air Conditioning using Membrane Contactors, Date of publication: Jan. 31, 2006, Author: Manuel Conde-Petit, Robert Weber, Contractor: M. Conde Engineering.
Open Absorption System for Cooling and Air Conditioning using Membrane Contactors—Annual, Report 2006, Publication No. Publication 260098, Project: 101310—Open Absorption System for Cooling and Air Conditioning using Membrane Contactors, Date of publication: Nov. 14, 2006, Author: Manuel Conde-Petit, Robert Weber, Contractor: M. Conde Engineering.
Open Absorption System for Cooling and Air Conditioning Using Membrane Contactors—Final Report, Publication No. Publication 280139, Project: 101310—Open Absorption System for Cooling and Air Conditioning using Membrane Contactors, Date of publication: Jul. 8, 2008, Author: Viktor Dorer, Manuel Conde-Petit, Robert Weber, Contractor: M. Conde Engineering.
Perry "Perry's Chemical Engineers handbook" 1999 McGraw Hill p. 11-52,11-53.
Refrigerant—Random House Kemerman Webster's College Dictionary, "Refrigerant," Random House, <https://thefreedictionary.com/refrigerant> (2010).
Russell, et al., "Optimization of Photovolatic Thermal Collector Heat Pump Systems," ISES International Solar Energy Conference, Atlanta, GA, vol. 3, pp. 1870-1874, May 1979.
"Siphon." Encyclopedia Americana. Grolier Online, 2015. Web. Apr. 3, 2015. 1 page.
Third Party Observations for PCT/US2011/037936, dated Sep. 24, 2012.
Welty, "Liquid Desiccant Dehumidification," Engineered Systems, May 2010, vol. 27 Issue 5, p. 34.

\* cited by examiner

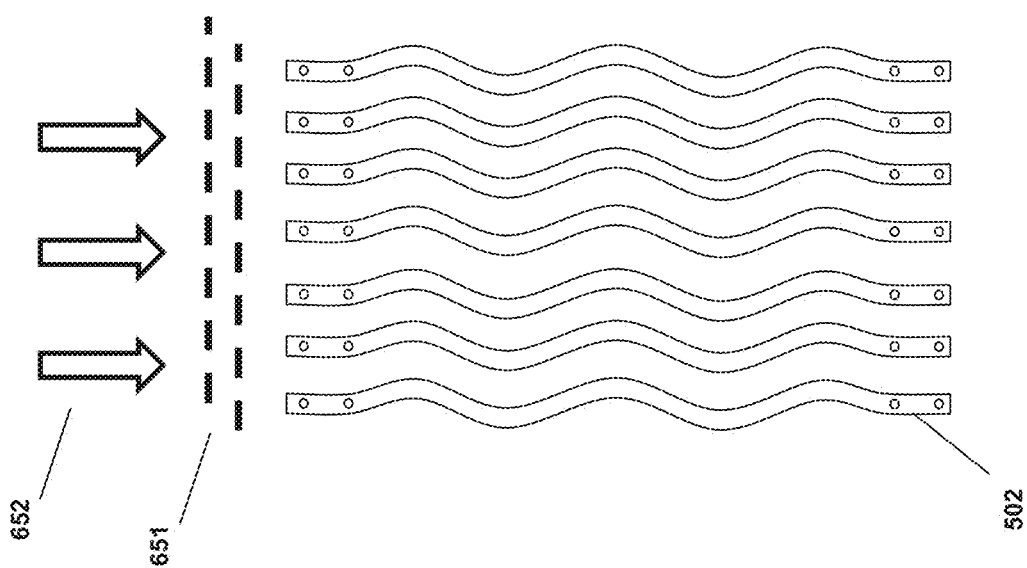

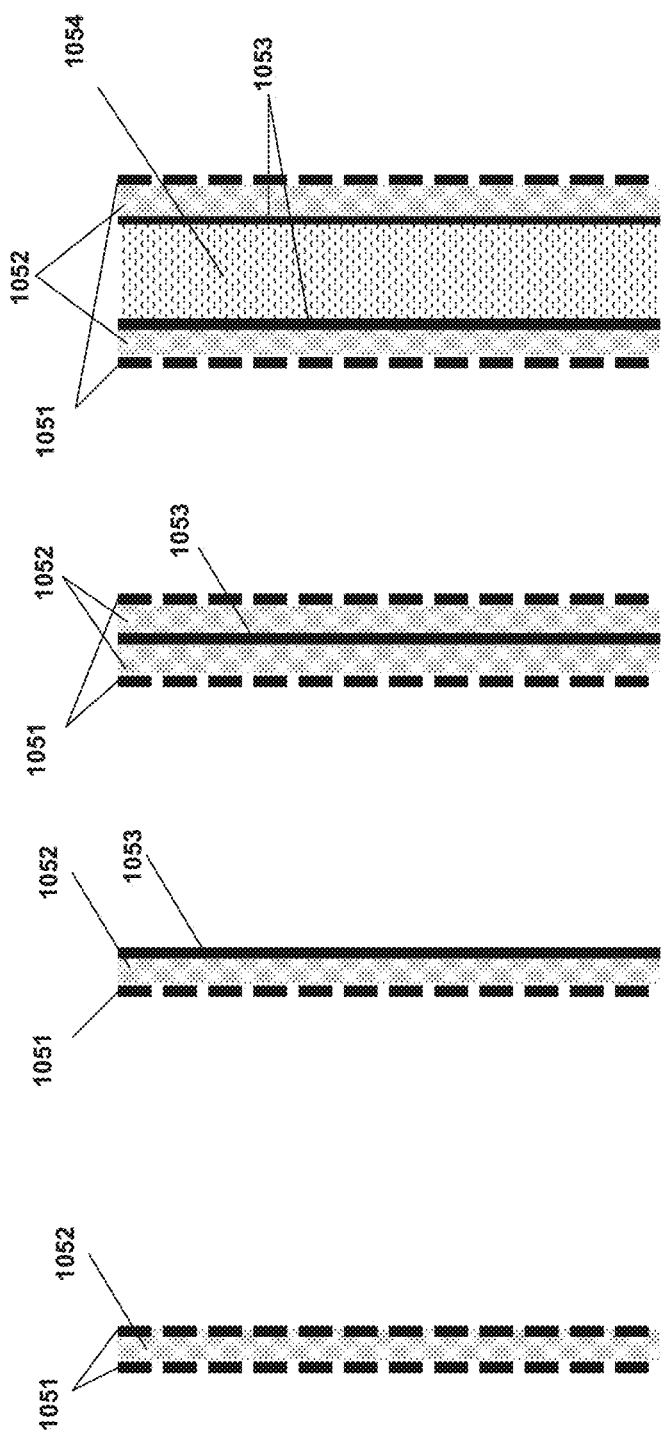

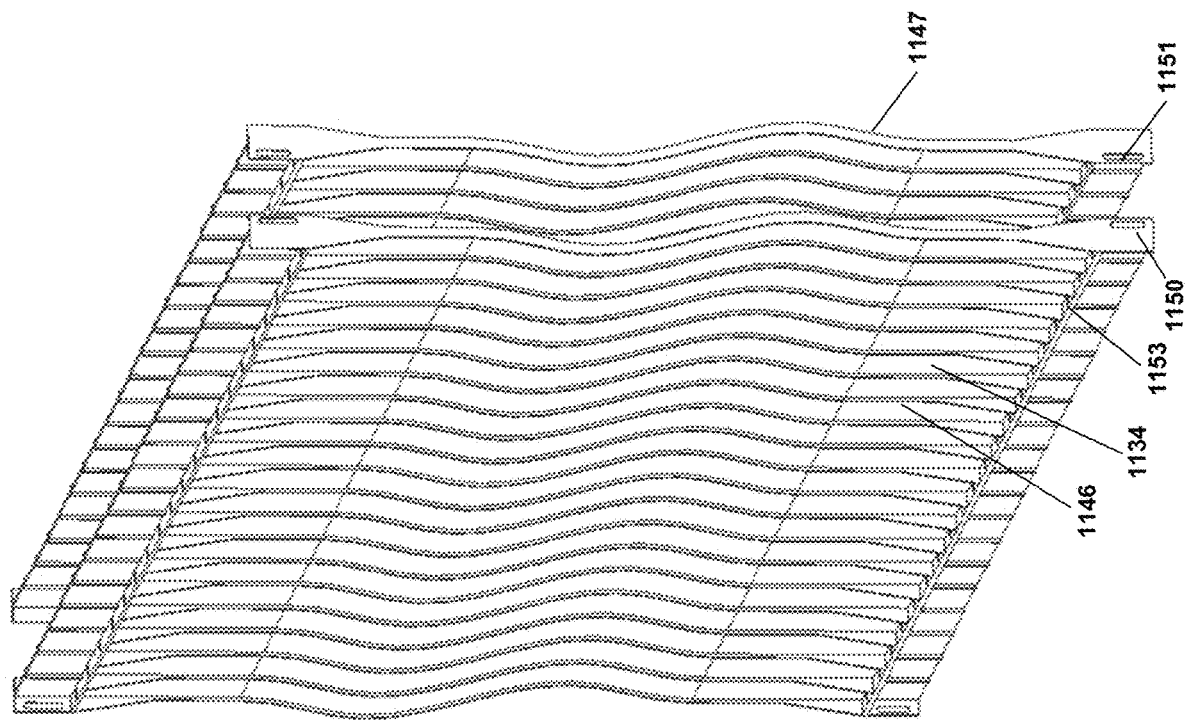

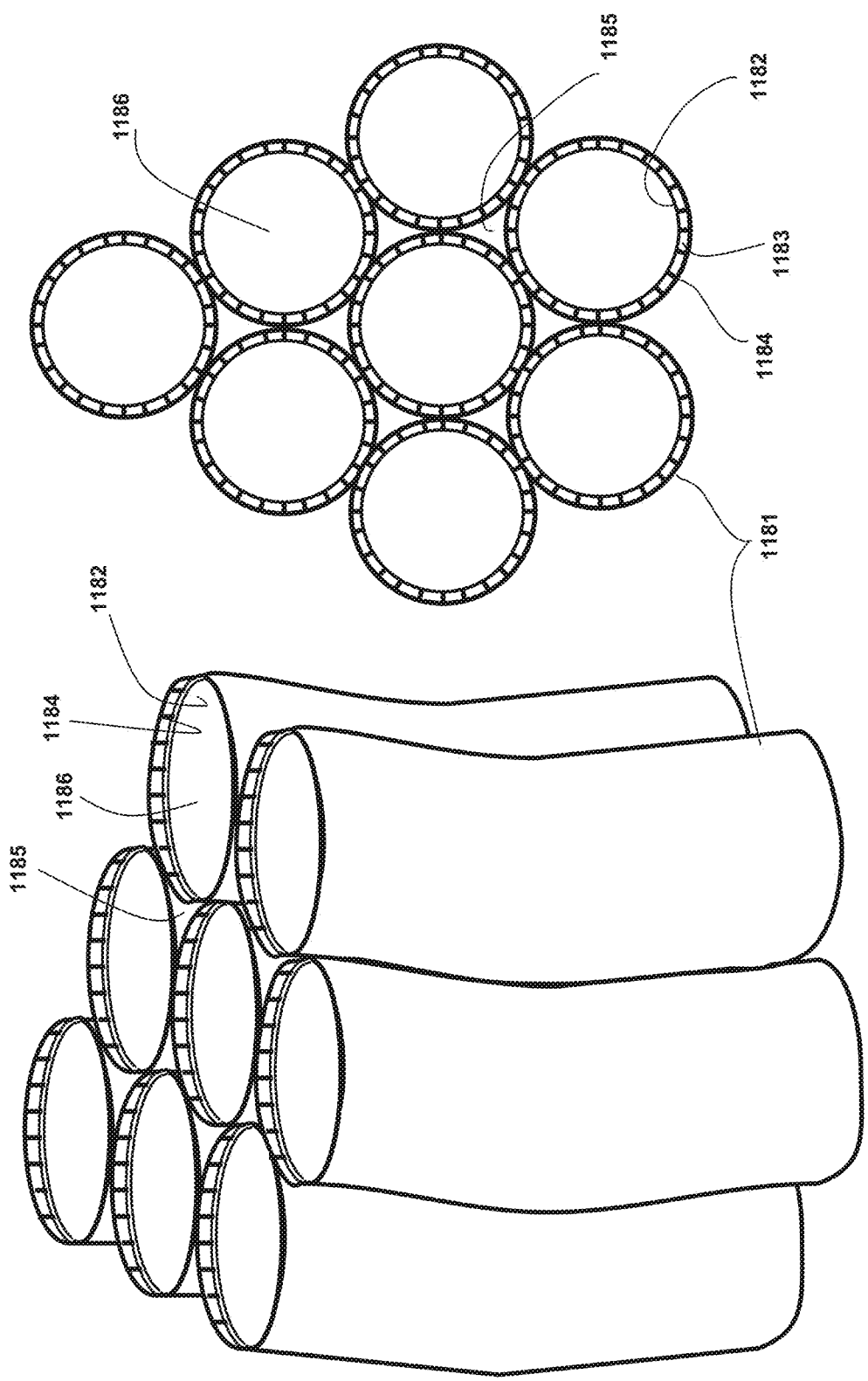

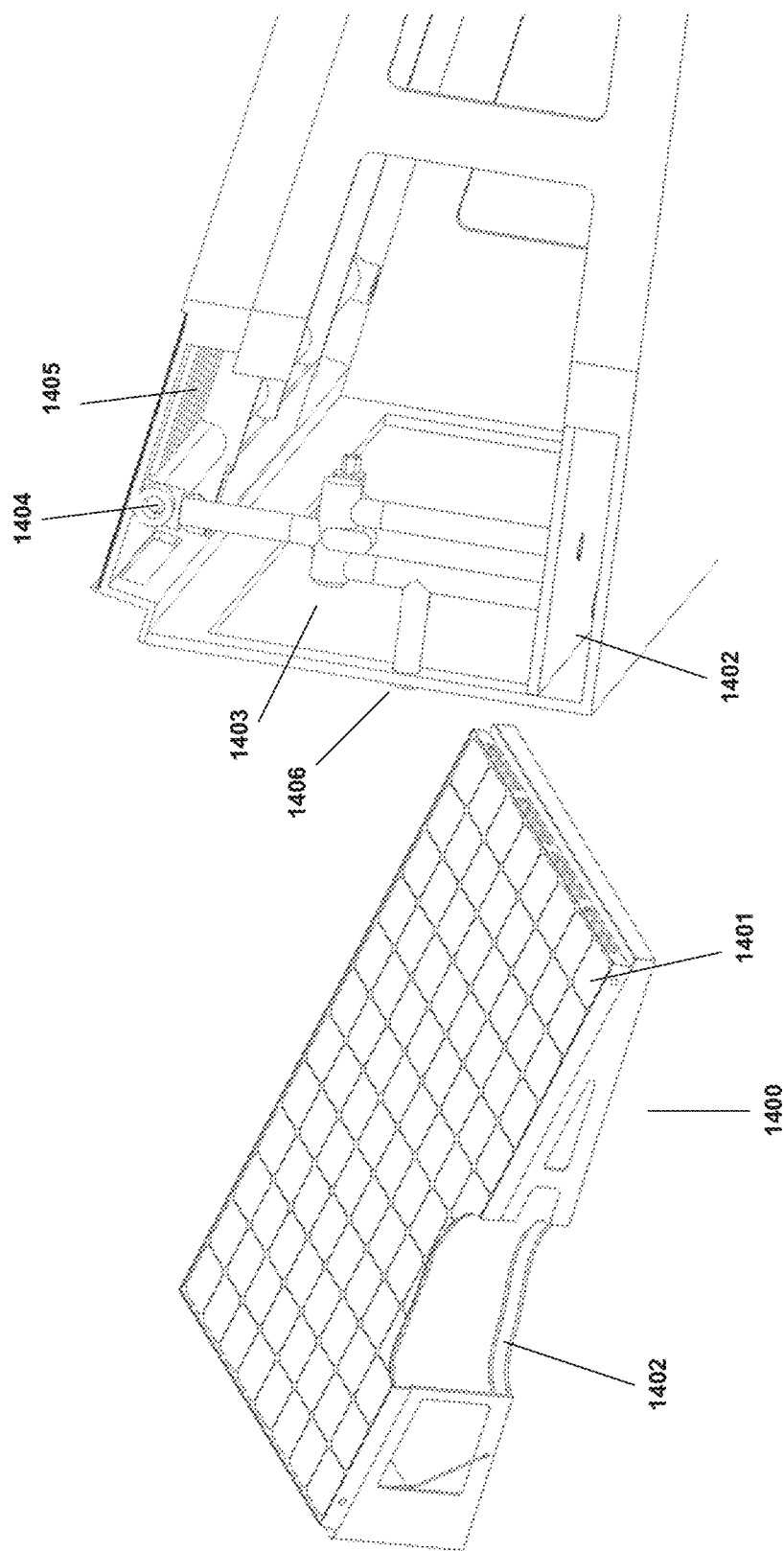

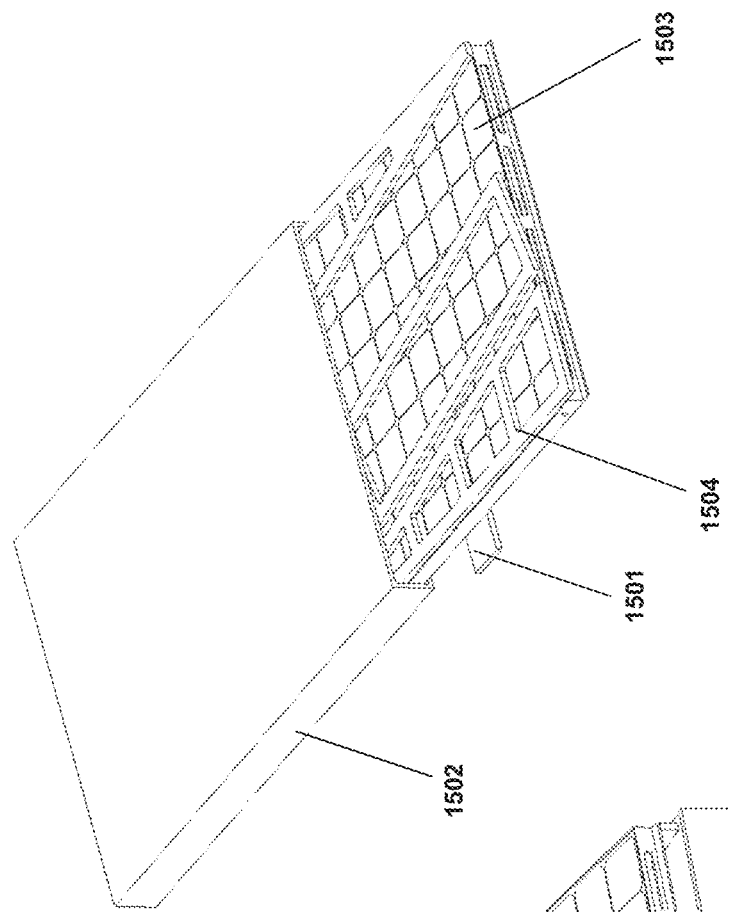
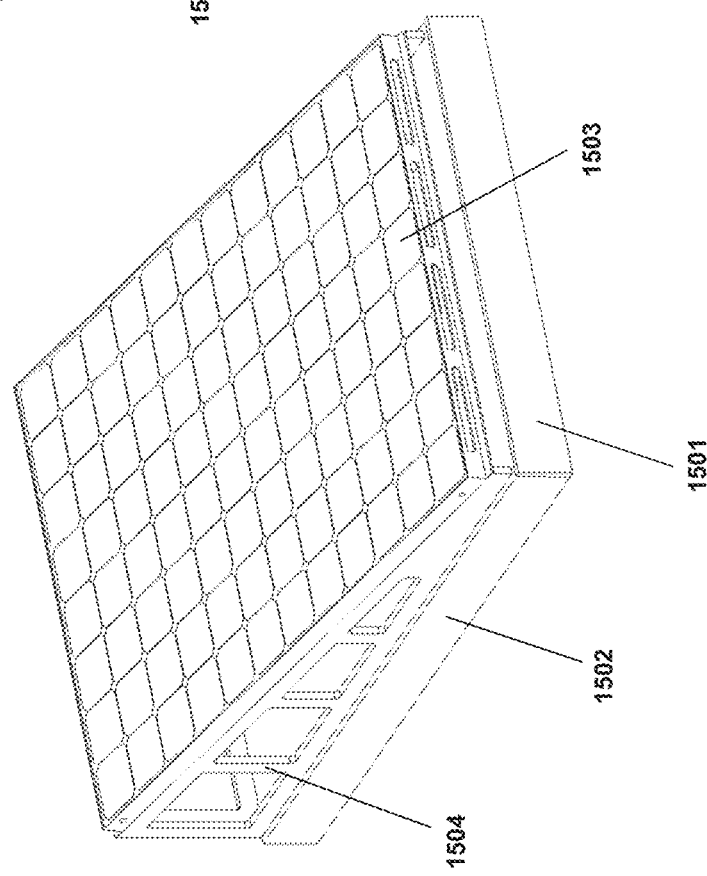

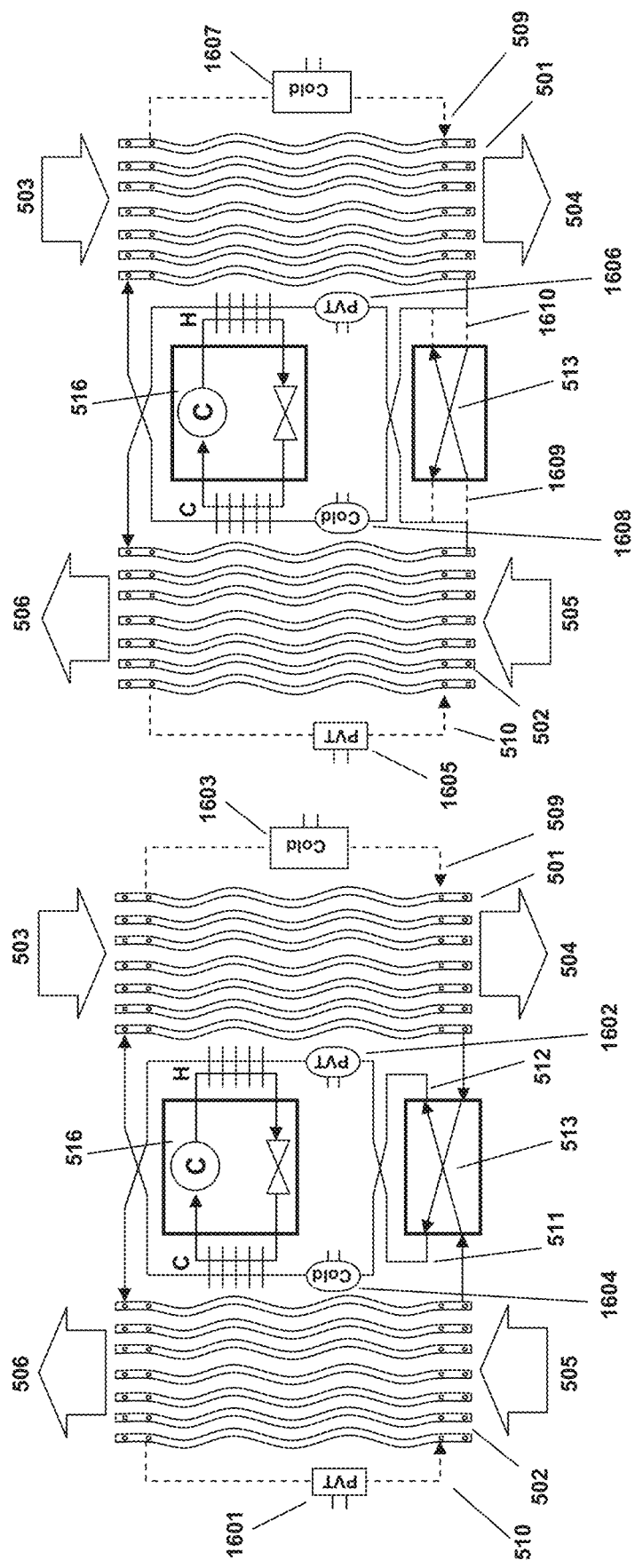

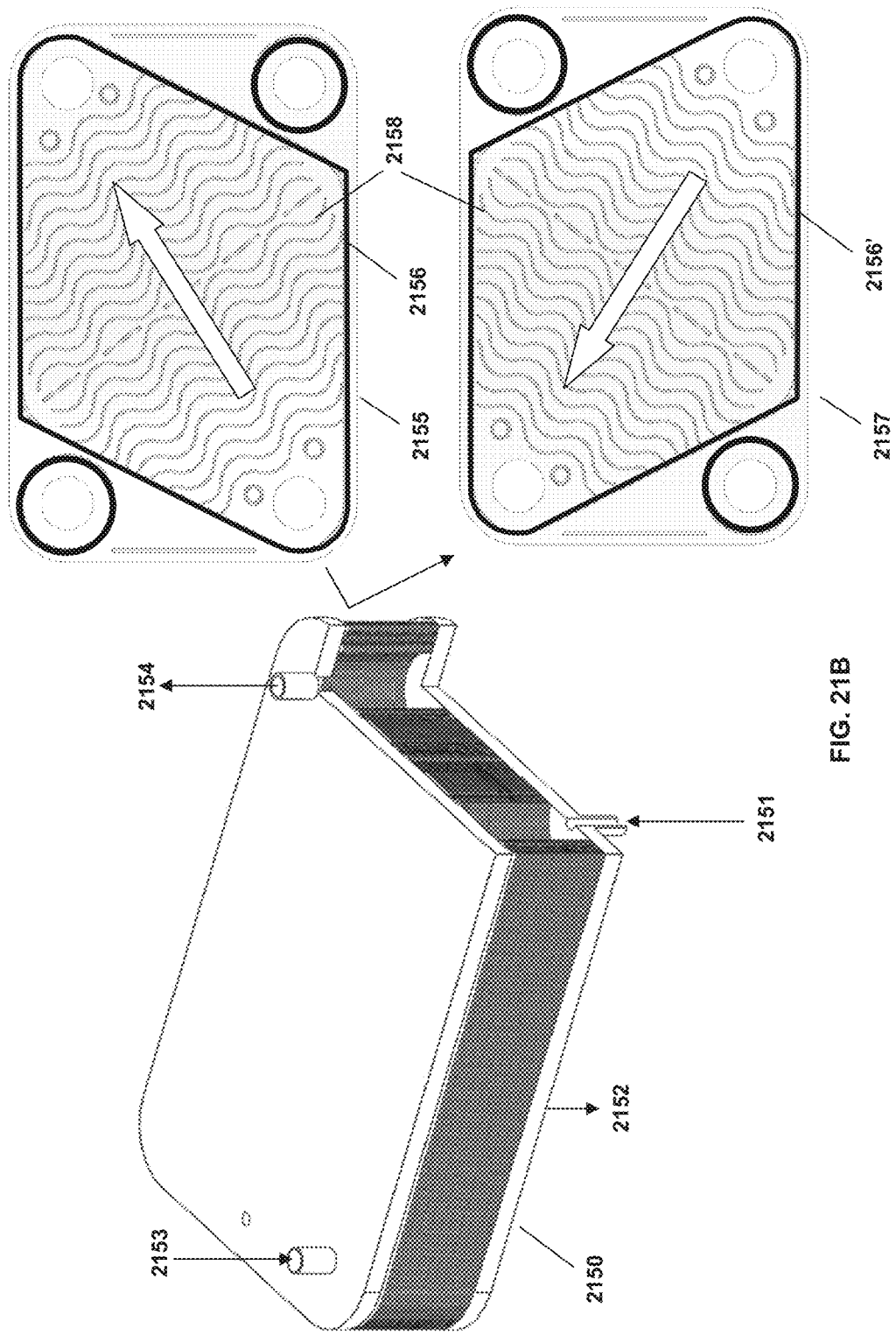

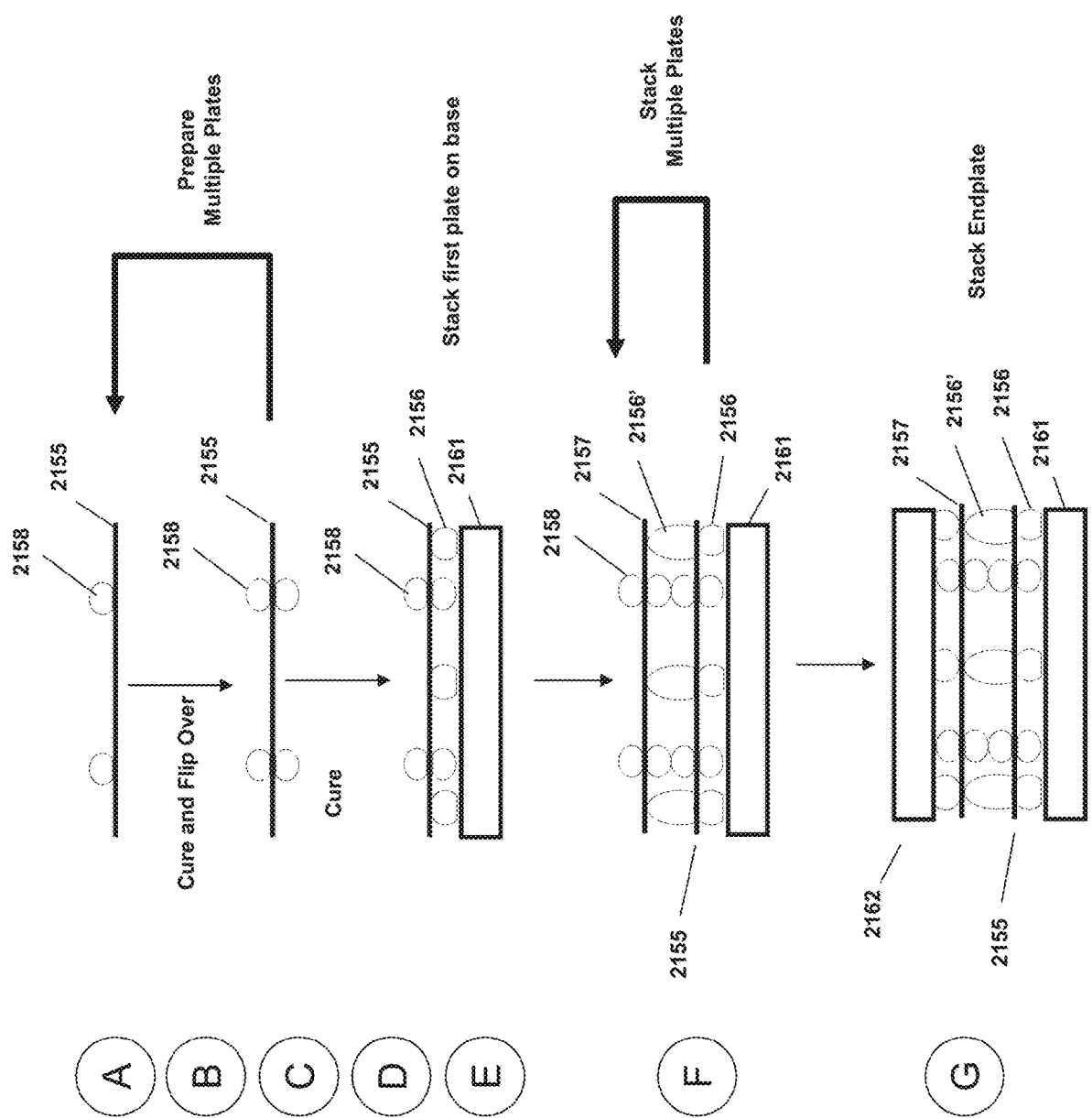

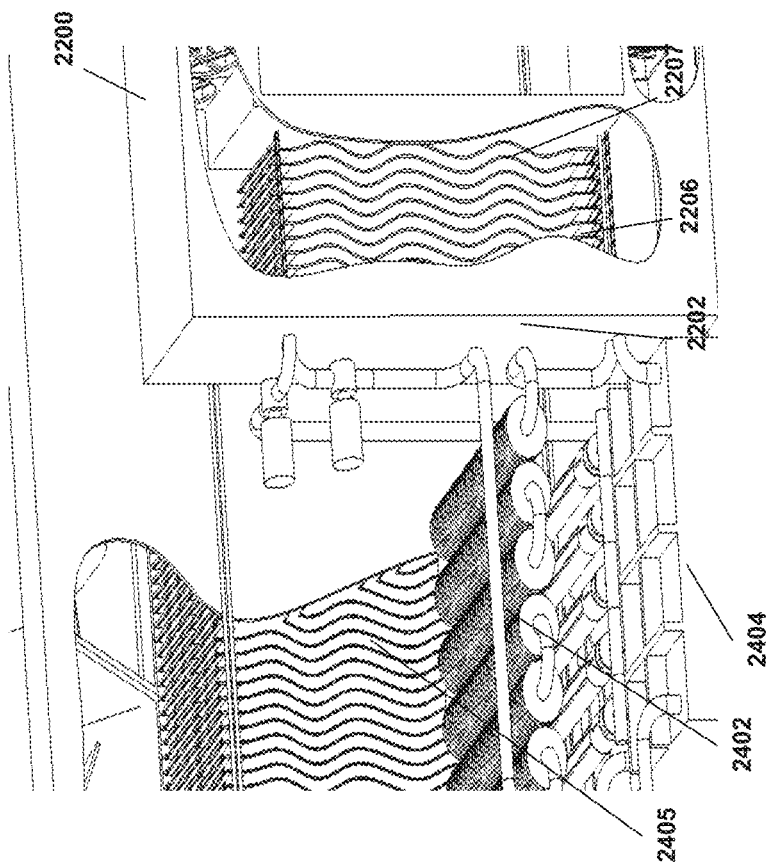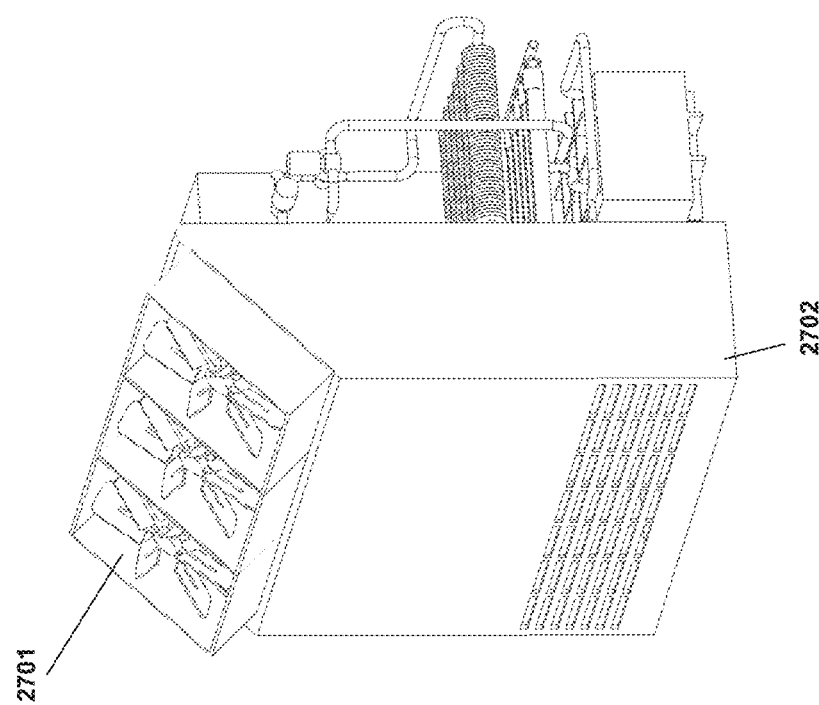
FIG. 27B
FIG. 27A

LIQUID DESICCANT AIR CONDITIONING SYSTEMS AND METHODS

CROSS REFERENCE TO RELATED APPLICATIONS

This application is a continuation of U.S. patent application Ser. No. 16/189,518, filed Nov. 13, 2018, entitled DESICCANT AIR CONDITIONING METHODS AND SYSTEMS USING EVAPORATIVE CHILLER, which is a continuation of U.S. patent application Ser. No. 15/177,755, filed Jun. 9, 2016, entitled DESICCANT AIR CONDITIONING METHODS AND SYSTEMS USING EVAPORATIVE CHILLER, which is a division of U.S. patent application Ser. No. 13/115,776, filed May 25, 2011, entitled DESICCANT AIR CONDITIONING METHODS AND SYSTEMS USING EVAPORATIVE CHILLER, which claims priority from U.S. Provisional Patent Application Ser. No. 61/348,076, filed on May 25, 2010, entitled SOLAR AIR-CONDITIONING AND HEATING SYSTEMS and U.S. Provisional Patent Application Ser. No. 61/430,692, filed on Jan. 7, 2011, entitled METHODS AND SYSTEMS FOR DESICCANT AIR CONDITIONING, all of which are hereby incorporated by reference.

BACKGROUND

The present application relates generally to air conditioning, capturing combustion contaminants, desalination, and other processes using liquid desiccants.

The term "air conditioning" generally refers to the treatment of air going into a building space, including to the heating, cooling, humidity adjustment, or purification of air that enters or leaves the space. It is well known that air conditioning is an enormous source of energy use and that summer cooling in particular can lead to electricity grid problems. Air conditioning is often the largest operating cost in a building.

Current air conditioning systems for cooling are generally based on the compression of a gas such as Freon and the expansion of the compressed gas through a valve assembly. However, in order to reach the required humidity levels of the entering air into a building, the air generally needs to be overcooled in order to condense water vapor into liquid water. This dehumidification (latent cooling) generally uses more energy in an air conditioning system than the physical lowering of the air temperature (sensible cooling). Oftentimes re-heaters are employed within an air conditioner requiring even larger amounts of energy.

Air conditioning for heating air is typically done by combustion of natural gas or some other fuel. The combustion often heats a heat transfer fluid that is then directed to a fan coil unit where the entering air is heated. In many buildings, such sensible only heating results in humidity levels that are too low for comfort. Oftentimes humidifiers are integrated with the heating system. Such humidification however results in the cooling of the air, which means that additional heating will have to be applied to counteract the cooling effect of the humidifier.

Solid desiccant systems have been used for many years primarily for summer cooling. However, the heating effect that occurs when air is dehumidified in an adiabatic fashion (no heat is added or removed) requires large amounts of sensible cooling post-dehumidification and as a result limits the energy savings that can be obtained.

Absorption chillers such as units manufactured by Yazaki Energy Systems typically utilize a low pressure vacuum vessel in which a desiccant material is contained (in Yazaki's case LiBr2 and water, but systems using Silica gel have also been developed). However, the use of low pressure vacuum systems significantly increases the cost and complexity of the equipment and increases the requirements for maintenance. Also, each transition (from air to a heat transfer fluid to the desiccant) utilizes heat exchangers, fans, and pumps and thus results in higher costs. And importantly, such transitions result in larger temperature requirements since each transition is not perfectly efficient. As a result, absorption chillers require higher temperatures to operate making them less suitable for integration with systems that employ waste heat or low grade heat.

More recently systems have been introduced that employ other methods for dehumidification of the air. Liquid desiccant systems such as the systems manufactured by DuCool and Agam use a strong desiccant material such as a $CaCl_2$ and water or $LiCl_2$ and water solution to absorb water vapor in the air. The liquid desiccant is directly exposed to the air unlike the previously discussed absorption chillers that do not have air to desiccant direct contact. After the desiccant absorbs moisture from the air stream, it is heated to release the excess water. In winter, such desiccants can be used to recover heat and moisture from the leaving air and transfer it to the incoming air.

Liquid desiccant systems however have traditionally suffered from the risk of desiccant carry-over into the air stream resulting in sometimes severe corrosion problems in the building since the desiccants that are used are typically strongly corrosive to metals.

Furthermore, liquid desiccant systems are typically spraying a liquid desiccant on a filter media to increase the surface area of desiccant exposed to the air. The spraying increases the risk of desiccant carryover into the air stream. Oftentimes additional mist eliminator filters are used to capture any airborne desiccant particles. However, these mist eliminators require frequent maintenance and replacement. Furthermore, the process of using a filter media is inherently energy inefficient. The filter media is an obstruction in the air flow and thus generally requires large fan power. Also, the filter media typically are thermally non-conductive which makes the dehumidification process adiabatic resulting in undesirable heating of the air. To counteract the heating effect, one can increase the flow rate of the desiccant and one can pre-cool the desiccant to achieve some level of sensible cooling at the dehumidification stage in the filter media. Increasing the flow rate of course increases the risk of desiccant carry over and requires more liquid pump power. The liquid desiccant typically "rains" down from the filter media into a liquid desiccant collection pan. This generally prevents the liquid desiccant system from using a vertical air flow and requires more costly duct work to be used during the installation of the system on a buildings roof, where air is typically handled vertically. Furthermore, the drain pans do not easily allow the system to be set up as a "split" system wherein the conditioner and regenerator are located in physically separate locations. In addition, the drain pans do not easily allow for the system to be expandable: one has to increase the size of the pan—which means a new design, rather than adding capacity through a scalable design.

AIL Research has developed a low flow desiccant system that overcomes some of the objections mentioned above. The use of a heat transfer fluid in-situ to where the desiccant is dehumidifying the air results in better thermal performance and lower fan and pump power. However this approach still utilizes a horizontal air flow—which makes it much harder to integrate to a rooftop installation—and a very complex conditioner design that has a desiccant drain pan at the bottom, but does not allow for a counter flow between the air and the liquids. This system also still has the risk of desiccant carryover since the desiccant is still directly exposed to the air flow.

The source of heat and the required temperature for regeneration of the desiccant is also an important consideration in the design of a solar air conditioning system. It should be clear that the lower the regeneration temperature of the desiccant is, the easier it should be to find a source of such (waste) heat. Higher regeneration temperatures necessitate higher quality (temperature) heat sources and thus are less easily available. At worst, the system has to be powered by a non-waste heat source such as a hot water furnace. Yazaki absorption units have been powered by evacuated tube solar thermal modules that are able to generate heat as high as 100° C. Concentrated solar thermal modules are able to achieve even higher temperatures, but oftentimes do so at higher costs. Glazed flat plate solar thermal collectors typically operate at somewhat lower temperatures of 70-80° C., but also lose a significant portion of their efficiency at higher temperature, which means that the array size needs to be increased to generate adequate power. Unglazed flat plate solar thermal collectors have higher efficiencies at lower temperatures, but generally lose a lot of their efficiency at high temperatures and are usually not able to achieve temperatures higher than 60° C., making them unsuitable for integration with absorption chillers.

None of the solar heat sources mentioned above (concentrated solar thermal, evacuated tube collectors and glazed and unglazed flat plate collectors) generates electricity at the same time as generating heat. However, all air conditioning systems still require electricity for fans and liquid pumps. Electricity is oftentimes much more expensive per unit of energy than fuels used for heat. It is therefore desirable to have an energy source that can provide heat as well as electricity.

It is known that solar Photo-Voltaic Modules (PV modules) heat up significantly in direct sun exposure with temperatures approaching 70-80° C. Such temperatures have a deteriorating effect on the performance of the module since module performance degrades with an increase in temperature. Applying a thermal transfer fluid to the back of the PV module (a module known as a PVT (PV-Thermal) module) effectively draws the heat from the module, lowering its temperature and increasing its efficiency. The thermal transfer fluid (typically water or water and propylene or ethylene glycol) can reach temperatures and thermal efficiencies typically between those of a glazed and an unglazed solar thermal module.

From a cost perspective, solar thermal systems augmented with conventional PV modules are less cost effective than PVT modules and take up more space than PVT modules. However, PVT modules generally supply lower temperatures and efficiencies than pure solar thermal systems. But beneficially they generate more electricity than conventional PV modules.

BRIEF SUMMARY

As discussed in further detail below, various embodiments disclosed herein are directed to methods and systems for air conditioning, capturing combustion contaminants, desalination, and other processes using liquid desiccants.

In accordance with one or more embodiments, solar Photo Voltaic-Thermal (PVT) modules are connected to a desiccant air conditioning system to heat desiccants. The PVT modules can be connected in various arrangements for summer cooling and winter heating. The air conditioning systems can include both horizontal and vertical air flow desiccant systems, including spray-head desiccant systems.

In accordance with one or more embodiments, the PVT modules can be used to provide cold water for a desiccant system for summer cooling.

In accordance with one or more embodiments, the PVT modules can be used to provide heat for water going to a humidifier of air in a desiccant air conditioning system.

In accordance with one or more embodiments, the air conditioning systems can include a set of hollow plate structures used to expose desiccant to an air flow. In accordance with one or more embodiments, the plate structures have a wavy shape aspect to them. The hollow wavy plate structures are constructed in such a way that the surface tension of the liquid desiccant is used to draw the liquid desiccant into a drain channel. In accordance with one or more further embodiments, a sheet material such as a membrane or wetting material can be arranged on the wavy plates to guide a liquid desiccant into the drain channel. A membrane can be a micro-porous membrane with pores ranging in size from typically from 0.01 μm to 1 μm. An example of such a membrane is a membrane made by Celgard of Charlotte, N.C., and a division of Polypore Corporation, under the type designation EZ2090.

In accordance with one or more embodiments a membrane is a micro-porous membrane backed by a material intended to evenly distribute a liquid. In embodiments a membrane is a hydrophobic microporous membrane. In embodiments the backing material is a hydrophilic material such as a wicking material. An example of such a wicking material is the interfacing material made by the Pellon Company of New York, N.Y.

In accordance with one or more embodiments, the wavy plate structures are arranged in the air conditioning system such that the liquid desiccant is exposed to a vertical air flow without substantially obstructing the air flow.

In accordance with one or more embodiments, multiple sets of wavy plate structures can be arranged into a stack that has a scalable nature wherein the drying or wetting capacity of the desiccant can easily be expanded by simply adding additional wavy plates.

In accordance with one or more embodiments, a membrane desiccant system is provided for an air conditioning system using counter-flows of liquids and air in a vertical air flow system.

In accordance with one or more embodiments, a membrane desiccant system is provided wherein a membrane or other hydrophobic material is bonded to a wetting or other hydrophilic material in such a way as the provide proper distribution of a liquid behind the membrane. In embodiments to a double layer is bonded to a (thermally conductive) hydrophobic structure such as a plastic cooling channel or support plate.

In accordance with one or more embodiments, the plate construction allows for spreading a liquid desiccant at the top of a plate and for collecting such desiccant at the bottom of the plate.

In accordance with one or more embodiments, the air flow going to a vertical air flow desiccant set of wavy plates is preheated, and the air leaving a set of plate structures is post-cooled.

In accordance with one or more embodiments, plate structures are constructed and assembled in such a way that the plates can thermally conduct heat, but are still corrosion resistant by employing a thermally conductive plastic material. In embodiments such a plastic has a thermal conductance of about 5 to 10 W/mK. As an example thermal conductances for regular plastics range from 0.1 to 0.5 W/mK, whereas Copper, Aluminum, Stainless Steel and Titanium have a conductance of about 400, 250, 16 and 18 W/mK respectively. Of these materials only Titanium is reasonably suitable for use with desiccants such as $CaCl_2$ or $LiCl_2$ due to the corrosive nature of the desiccants.

In accordance with one or more embodiments, plate structures are assembled using a header that can be stacked vertically as well as horizontally in such a way that the wavy plates can be stacked parallel to each other as well as on top of each other.

In accordance with one or more embodiments, plate structures are assembled in such a way that a membrane is mounted on each plate to guide liquid desiccant to a header at the bottom of the wavy plate.

In accordance with one or more embodiments, the air inlet to the plate structures is disturbed by a mesh or set of disturbance plates in such a way as to create turbulent air movement in the air entering the wavy plates.

In accordance with one or more embodiments, a solar inverter is integrated an air conditioning system in such a way that the electrical connections to the air conditioning system provide the electrical connection to the building for a set of solar modules. In some embodiments, the air conditioning unit is a desiccant air conditioning system. In some embodiments, the desiccant air conditioning system uses vertical air flows. In some embodiments, the solar modules are PVT modules.

In accordance with one or more embodiments, a liquid desiccant vertical air flow system utilizes a chiller as a source of cold water and a gas water heater as a source for warm water, wherein the gas water heater is supplemented by the heat generated by solar modules.

In accordance with one or more embodiments, a PVT module provides electrical power and heat to a desiccant air conditioning system and provides heat to a water storage tank. The hot water can gradually be stored in tanks underneath the PVT modules, and the electrical power can be used to operate the air conditioning system. Any excess electrical power can be provided to other devices.

In accordance with one or more embodiments, PVT modules are set up in such a way as to radiate heat during the night, and thus provide cooling of water. Such cooled water can be stored in water storage tanks so that it can be made available during the day for the cold side of a desiccant air conditioning system. In some embodiments, such cold water can also be generated at night using an evaporative chiller in combination with the PVT modules.

In accordance with one or more embodiments, a PVT module generates hot water that is regulated by a thermostatic switch so as to enter a tank or flow directly to a manifold. In some embodiments, the thermostatic switch is driven by the temperature of the hot water. In some embodiments, the switch is operated by remote control.

In accordance with one or more embodiments, water is stored in a tank underneath a PVT module in such a way that the tank provides adequate evenly distributed weight to function as a ballast and support system for the PVT module. In some embodiments, the tank has a removable lid. In some embodiments, the tank can furthermore function as a shipping container for the module.

In one or more embodiments, PVT modules are connected to a plate structure desiccant system. In some embodiments, the wavy plate system is set up to provide cool air to a building. In some embodiments, the wavy plate system is set up to provide warm moist air to a building space.

In accordance with one or more embodiments, PVT modules are connected so that they preheat water that is destined to go into a humidifier for air destined for a building space.

In accordance with one or more embodiments, a desiccant is separated into various layers in a vessel wherein the concentration of the desiccant varies along the height of a vessel. In some embodiments, the vessel is used to provide and collect desiccant to a desiccant air conditioning system. In some embodiments, at least one of the outlets of the vessel is adjustable so that different layers with different desiccant concentrations can be selectively drawn from the vessel.

In accordance with one or more embodiments, a portion of an air flow treated by a plate conditioner in such a way that the humidity is reduced is diverted to an additional set of plates that provides cooling of the air through evaporation of water vapor. In some embodiments, such a system uses membranes on the surface of the plates. In some embodiments, the air flow across the second set of plates can be reversed and the water for evaporation replaced by a desiccant in such a way that during winter operation, it provides additional heating capacity of the air entering the building.

In accordance with one or more embodiments, a set of plate structures provides an evaporative cooling effect and the so produced chilled liquid is directed to both a conditioner as well as one or more liquid to air heat exchangers. In embodiments such liquid to air heat exchangers are ceiling panels. In embodiments such liquid to air heat exchangers are fan coils. In embodiments such fan coils are located inside ductwork. In embodiments such liquid to air heat exchangers are located underneath a floor.

In accordance with one or more embodiments, a series of holes is provided at the top of the membrane to inhibit vacuum lock and allow for easy draining of desiccant from behind the membrane covering a plate structure.

In accordance with one or more embodiments, a plate structure is constructed in such a way as to provide alternating access to water and liquid desiccant on the surface of the plates by providing holes on an asymmetrical pattern.

In accordance with one or more embodiments, a heat exchanger is constructed using thermally conductive plastic plates to provide heat transfer between corrosive fluids. In some embodiments, such a plate heat exchanger uses horizontal and vertical counter flows. In some embodiments, the thermally conductive plates are formed in such a way as to have ridges and features that promote heat exchange and are constructed so that they can be stacked and sealed. In some embodiments, the thermally conductive plastic plates are not formed, but rather a gluing material is used to create and attach ridges on the top and/or on the bottom of the plastic plates. In some embodiments, the gluing material is also used to provide a seal to the liquids in between the plates. In embodiments the glue ridges are shaped in such a way that the ridges on the lower plate are supporting the ridges on the top of the upper plate, while the seal glue spans the entire gap between the two plates. In embodiments, the glue material is Marine 5200, made by 3M Corporation of St. Paul, Minn.

In accordance with one or more embodiments, a first set of plate structures is contained in a hermetically sealed container and wherein a second set of plates is contained on the opposite side of the container. The first set of plates contains an optional membrane over its surface or a wetting material. The first set of plates receives a diluted desiccant from a desiccant source. The first set of plates also receives a heated heat transfer fluid from a source. A fan provides air movement inside the hermitically sealed container in such a way that water vapor is taken from the first set of plates. The second set of plates is relatively cool compared to the air environment and the enclosure in such a way as to cause condensation of water on its surfaces. The water can be withdrawn from the sealed enclosure. In some embodiments, the second set of plates is cooled by an external cold source.

In accordance with one or more embodiments, a set of plate structures with a liquid desiccant exposed to its surface collects moisture from an air stream and directs the diluted desiccant to a hermitically sealed container wherein the desiccant is regenerated and wherein the water vapor is recovered in the form of liquid water. In some embodiments, the heat for the system is provided by solar thermal modules. In some embodiments, the heat for the system is provided by PVT modules.

In accordance with one or more embodiments, a liquid desiccant is first regenerated in a hermitically sealed container and subsequently regenerated in an open array of plate structures. In some embodiments, the water recovered in the hermitically sealed container is diverted to a set of plate structures providing an evaporative cooling effect.

In accordance with one or more embodiments, fuel combustion takes place in such a way that the effluent gasses are directed through a set of plate structures having a liquid desiccant on its surfaces. The effluent gasses contain substances such as Carbon Dioxide, Water Vapor and contaminants such as $SO_x$ and $NOR_x$, which can be captured into the desiccant. In some embodiments, the desiccant is regenerated into a concentrated desiccant and liquid water. In some embodiments, the desiccant is filtered in such a way as to remove acidity created by the $SO_x$ and $NO_x$ and other gasses absorbed from the fuel combustion process.

In accordance with one or more embodiments, a desiccant draws water through a membrane from a water source such as seawater. The concentrated desiccant is diluted as a result of the transition of water through such membrane. The diluted desiccant is transported to a hermitically sealed enclosure wherein the desiccant is regenerated in such a way that concentrated desiccant and liquid water are produced. In some embodiments, the heat for regeneration is provided by solar thermal modules. In some embodiments, the heat for regeneration is provided by PVT modules.

Many construction variations can be envisioned to combine the various elements mentioned above each with its own advantages and disadvantages. The present invention in no way is limited to a particular set or combination of such elements.

BRIEF DESCRIPTION OF THE FIGURES

FIG. 6B depicts one or more turbulence plates that create air turbulence in the air entering a set of plate structures.

FIG. 10B shows a cross section of two membranes with a hydrophilic wicking material sandwiched in between two hydrophobic membranes wherein the wicking material spreads a liquid uniformly between the two membranes in accordance with one or more embodiments.

FIG. 10C shows a cross section of a hydrophobic membrane, a hydrophilic wicking material and a (thermally conductive) support wall in accordance with one or more embodiments.

FIG. 10D shows a cross section of two membranes with two wicking materials and an internal (thermally conductive) support wall in accordance with one or more embodiments.

FIG. 10E shows a cross section of two membranes with two wicking materials and an internally hollow (thermally conductive) support wall in accordance with one or more embodiments.

FIG. 11H illustrates further details of some of the components shown in FIG. 11F.

FIGS. 11I and 11J show a three dimensional and top view, respectively, of an embodiment that uses a tube structure for exposing liquid desiccant to air streams while providing a simultaneous heating or cooling functions in accordance with one or more embodiments.

FIGS. 14A and 14B show a PV/Thermal module with integrated hot water storage/ballasting system in accordance with one or more embodiments.

FIGS. 15A and 15B show how the ballast tank and storage system can double as a shipping container for the PVT module in accordance with one or more embodiments.

FIGS. 16A and 16B demonstrate how PVT modules and cold sources can be integrated into the wavy plate desiccant system for summer operation in accordance with one or more embodiments.

FIG. 21B shows a different embodiment of a corrosion resistant heat exchanger with thermally conductive plastic plates in accordance with one or more embodiments.

FIG. 21C shows the major manufacturing steps involved in using glue structures to construct a fluid to fluid heat exchanger in accordance with one or more embodiments.

FIGS. 27A and 27B show a three-dimensional model of the system of FIG. 24A in accordance with one or more embodiments.

Like reference characters generally denote like parts in the drawings.

DETAILED DESCRIPTION OF PREFERRED EMBODIMENTS

Figure 1B:
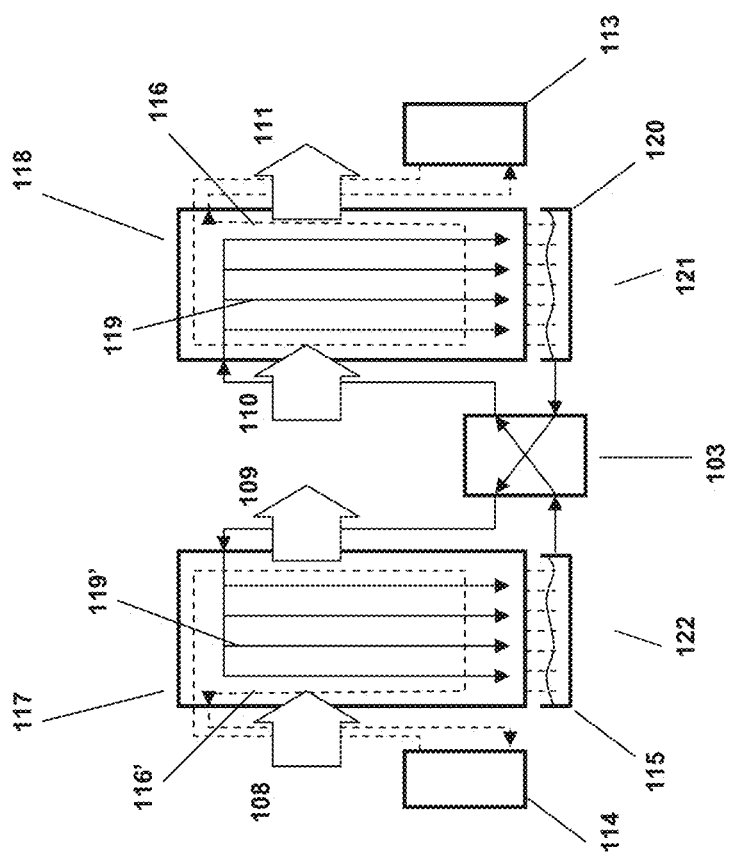
FIG. 1B illustrates a desiccant air handling system using a plate design and horizontal air flow in accordance with the prior art.
Figure 1A:
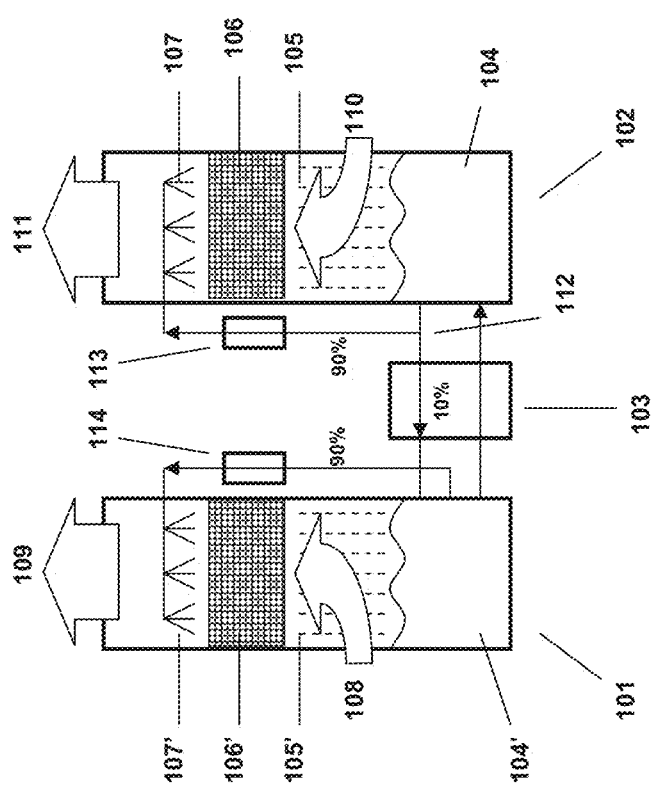
FIG. 1A illustrates a desiccant air handling system using a shower head design in accordance with the prior art.

FIG. 1A depicts a liquid desiccant air conditioning system as known in the prior art. A desiccant conditioner 102 contains a liquid desiccant in a bath 104. The liquid desiccant 104 can be any suitable solution that attracts water vapor from the outdoor air 110 that is blown into the conditioner 102. The air moves through a filter media 106 that usually comprises a convoluted surface that easily holds and exposes the desiccant to the air stream. Examples of desiccants include $CaCl_2$ and $LiCl_2$. The filter media can be a cellulosic cooling tower fill material. Diluted desiccant 105 that has absorbed water drips from the filter media 106 into the desiccant bath 104. The spray head 107 distributes the concentrated desiccant evenly across the filter media 106. Dehumidified and cooled air 111 is directed into the building. A portion (usually around 10%) of the diluted desiccant 112 is brought through a heat exchanger 103 to a regenerator 101. The majority of the desiccant 112 is brought back to the spray head 107 at the top of the conditioner 102 through an optional cold source 113. The desiccant that is diverted to the regenerator 101 is heated in an optional heater 114 and pumped to a spray head 107' similar to the spray head on the conditioner side. The heated desiccant falls onto a filter media 106' and drips down 105' into a desiccant bath 104'. Return air from the building or outdoor air 108 is brought through the filter media and absorbs water from the desiccant such that moist hot air 109 is exhausted from the regenerator. As discussed earlier, the drawbacks of this system are that the absorption of water vapor into the desiccant is an almost adiabatic process resulting in heating of the air that is meant to be cooled. Furthermore the spray head can lead to some desiccant being carried over into the leaving air streams 111 and 109. And lastly, the baths 104 and 104' force the air flows 110 and 108 to be horizontal and vertical through the filter media. This makes installation on a building roof more complicated since the exiting air 111 needs to be ducted into a downward direction and the return air 108 from the building needs to be ducted into a horizontal aspect.

FIG. 1B is an alternate system known in the prior art. The conditioner 121 comprises a set of vertical plates 118 (which are constructed to be hollow inside) and a desiccant collector 120. Chilled heat transfer fluid from a cold source 113 is brought inside the plates 118 and forms a U-shaped loop 116 internal to the plate. A concentrated desiccant 119 is run over the surface of the plates 118. Outdoor air 110 is directed over the desiccant 119 in a horizontal orientation. The desiccant absorbs water vapor from the air and runs down the surface of the plates 118 into the desiccant collector 120. The diluted desiccant 121 is pumped through a heat exchanger 103 to the regenerator 122. The regenerator comprises a set of plates 117 that again are hollow and that have U-shaped channels 116' in them. Diluted desiccant 119' is again run over the surface of the plates 117 that are heated by the hot transfer fluid source 114. Outdoor air or return air from the building 108 is used to absorb water vapor from the desiccant 119'. The desiccant gets more concentrated as it runs down the surface of the regenerator and collects into the desiccant collector 115. As in the previous example, the air flow in the desiccant system is primarily horizontal resulting in the need for additional ducts to be used for installation on a rooftop. A horizontal air flow would have been preferred because no duct work would have been necessary, but the desiccant collectors 115 and 120 generally block air from flowing vertically. Furthermore, the U-shaped channels do not allow for a counter-flow design between the air, desiccant, and cooling or heating fluids resulting in lower thermal efficiency of both the conditioner and the regenerator. As compared to the system in FIG. 1A, the liquid desiccant system in FIG. 1B uses lower fan power and lower desiccant pump power.

Figure 2B:
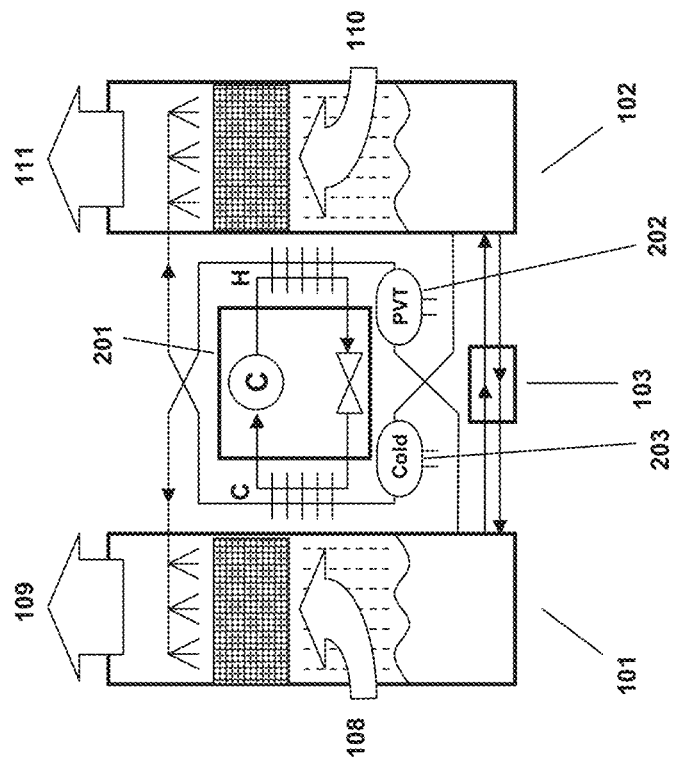
FIG. 2B shows a desiccant air handling system set up for non-extreme summer operation with cold source and PV/Thermal module tie-in in accordance with one or more embodiments.
Figure 2A:
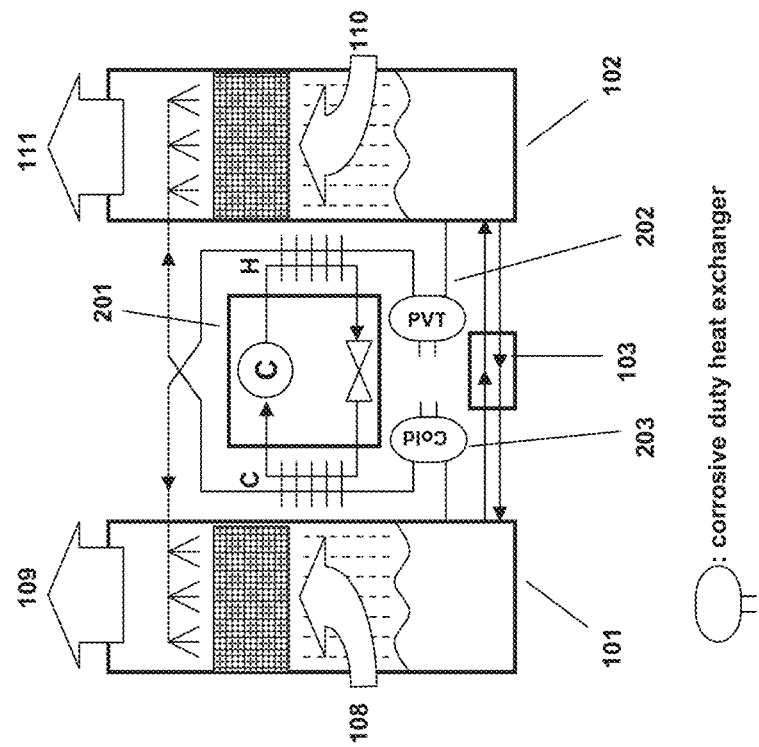
FIG. 2A shows a desiccant air handling system set up for extreme summer operation with cold source and PV/Thermal module tie-in in accordance with one or more embodiments.

FIG. 2A shows a liquid desiccant system in accordance with one or more embodiments configured for extreme summer operation and so as to integrate with and optional heat pump 201. A portion of the desiccant in the conditioner 102 is brought through a heat exchanger 202 that can be coupled to a PVT module array. Since the typical desiccant materials that are used are corrosive to metals, the use of a heat exchanger is desirable. This also complicates the integration of the heat pump 201; since the desiccant should not contact any metal parts, the heat transfer is made indirectly through a specially designed heat exchanger. As can be seen in the figure, desiccant is taken from the conditioner, is heated in the PVT modules 202 or by the heat pump 201 and sprayed into the regenerator 101. Conversely concentrated desiccant is taken from the regenerator 101, run through an optional cold source 203 or through the cold side of the heat pump 201 and into the conditioner.

In FIG. 2B a similar set up is shown for non-extreme operation. The main difference is that the desiccant from the conditioner is cooled, and put back into the conditioner side rather than also being transported to the regenerator. Desiccant only transfers to the regenerator through the heat exchanger 103. Similarly the desiccant in the regenerator is only heated and put back into the regenerator itself rather than being put into the conditioner.

Figure 3B:
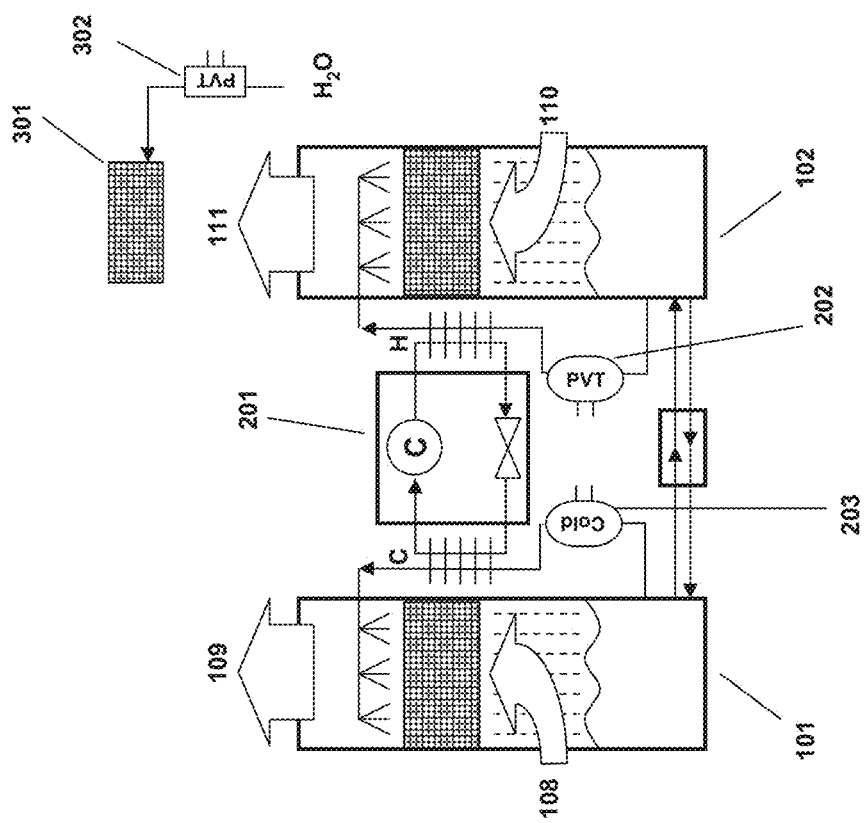
FIG. 3B shows a desiccant air handling system set up for non-extreme winter operation with cold source and PV/Thermal module tie-in in accordance with one or more embodiments.
Figure 3A:
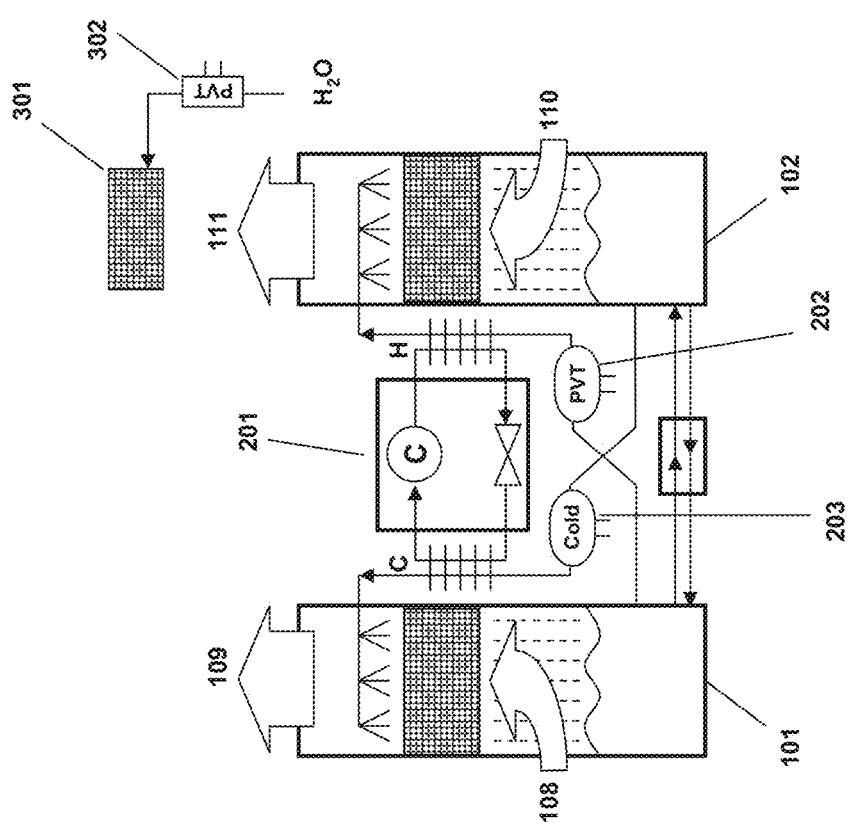
FIG. 3A shows a desiccant air handling system set up for extreme winter operation with cold source and PV/Thermal module tie-in in accordance with one or more embodiments.

In extreme winter operation in FIG. 3A, the heat sources 201 and 202 are now heating the liquid desiccant as it is transported to the conditioner 102. It is noted that the conditioner in the winter setup is used to add water vapor and heat to in incoming air stream 110 and conditions the air to have a higher temperature and humidity as it enters the building at 111. It is also possible to add a humidifier 301 that can be preheated by another PVT module array 302 or by another source of thermal energy. Since the water that is brought into the humidifier 301 is not corrosive to metals, it is not per-se necessary to use a heat exchanger in 302; the water can be heated directly by the PVT modules. It is further worth noting that the return air 108 from the building generally is higher in temperature and humidity than the outside air 110. The regenerator 101 in this setup actually captures the heat and moisture from the return air and transports it to the outdoor air, resulting in much lower heating costs and the desiccant system is in this setup effectively functioning as an enthalpy recovery system.

In FIG. 3B a similar setup is shown as in FIG. 3A, except now the heat sources 201 and 202 are now used to heat the desiccant on the conditioner 102 side of the system directly. Similarly the cold side of the heat pump 201 can directly draw heat from the desiccant in the regenerator.

The cold source 203 in FIGS. 3A and 3B will in most cases not be needed during winter operation of the system. It is also noted that the desiccant in winter mode will need to be diluted which means that small amounts of water will need to be added on a regular basis in order to prevent overconcentration of the desiccant. This water can come from the return air from the building, but may still need to be supplemented from other sources.

Figure 4:
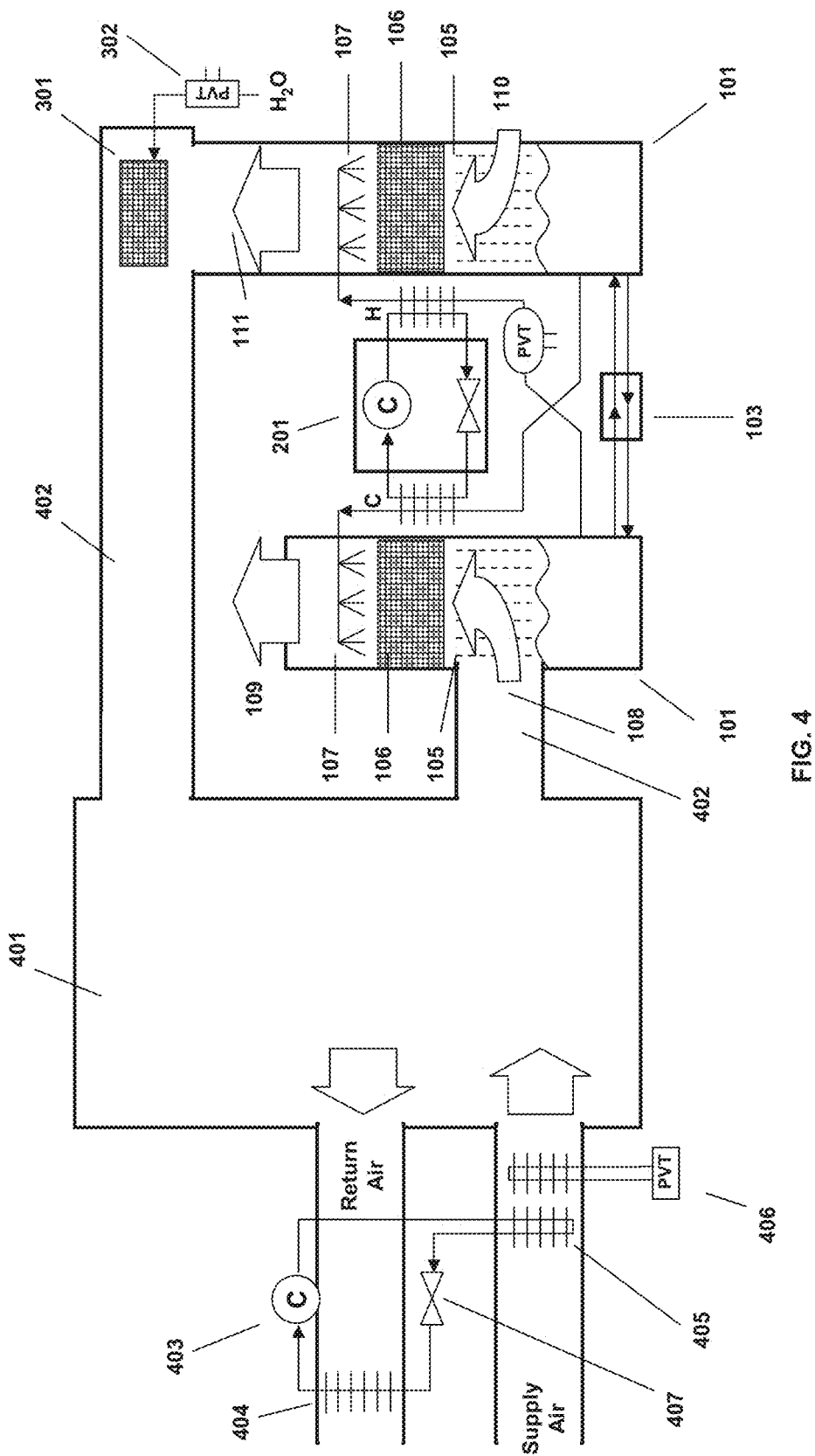
FIG. 4 shows the integration between a building's existing air conditioning system, a desiccant air conditioning system and PVT modules in accordance with one or more embodiments.

FIG. 4 shows how the enthalpy recovery system from FIG. 3A can be integrated into an existing building air conditioner infrastructure. The building space 401 is connected by ducts 402 to the desiccant system from FIG. 3A. The existing air conditioner heat pump comprising compressor 403 releases heat through fan coil 405 and the incoming air can be supplementally heated by PVT modules 406 and an additional fan coil. The compressed gas expands at the valve 407 and is heated by the return air in fan coil 404 before returning to the compressor 403. The above described setup significantly reduces the load on the air conditioning system by again recovering both heat and water vapor.

Figure 5:
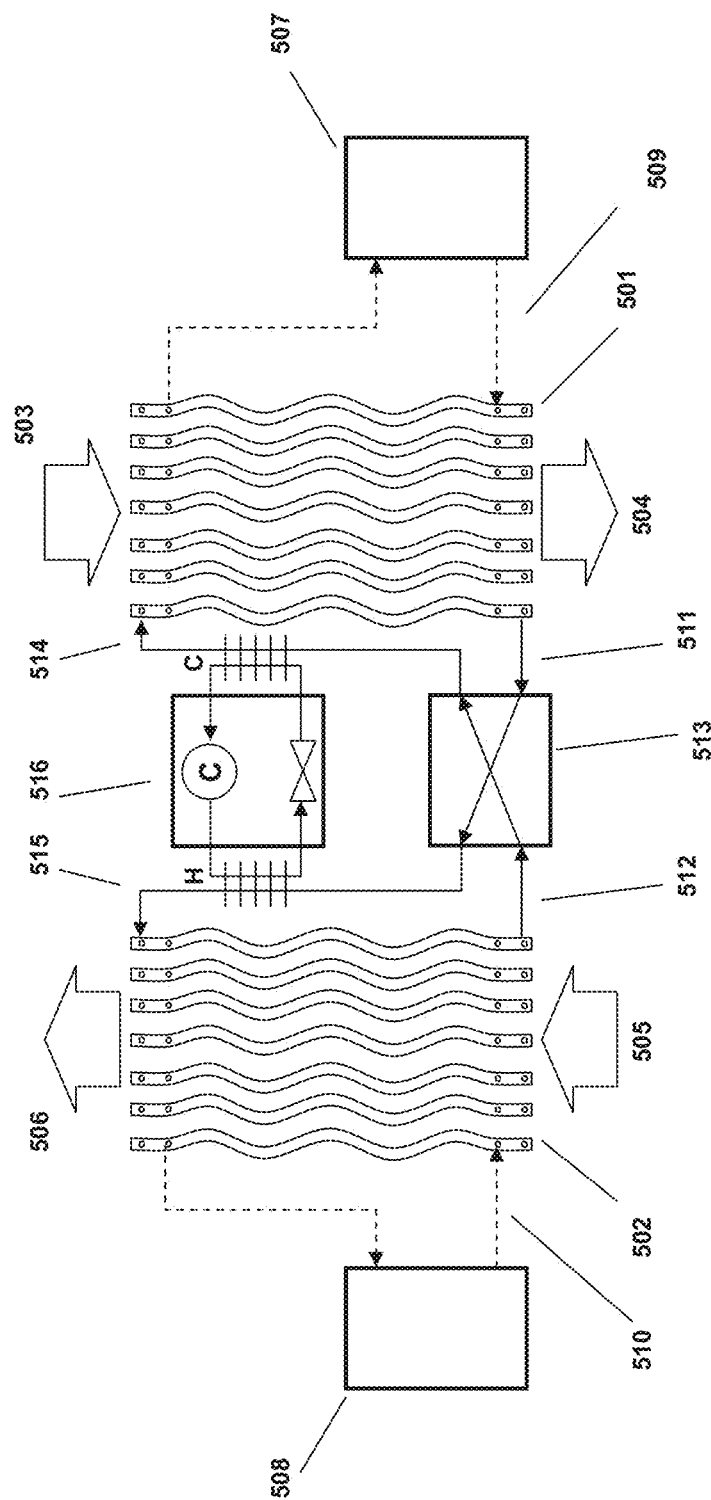
FIG. 5 shows a desiccant system employing a vertical air flow in accordance with one or more embodiments.

In FIG. 5 a new type of liquid desiccant system is shown. The conditioner 501 comprises a set of plate structures that are internally hollow. Optionally the plate structures can have a wavy shape applied to them. The term wavy as used herein refers broadly to a variety of convoluted structures, including serpentine or undulating shapes. A cold heat transfer fluid is generated in cold source 507 and entered into the plates. Liquid desiccant solution at 514 is brought onto the outer surface of the plates and runs down the outer surface of each of the plates. In some embodiments, the liquid desiccant runs in a wicking surface that significantly increases the area of desiccant exposed to the air stream 503. In other embodiments—described further below—the liquid desiccant runs behind a thin membrane that is located between the air flow and the surface of the plates. Outside air 503 is now blown through the set of wavy plates. The liquid desiccant on the surface of the plates attracts the water vapor in the air flow and the cooling water inside the plates helps to inhibit the air temperature from rising. The plate structures are constructed in such a fashion as to collect the desiccant near the bottom of each plate thereby eliminating the need for a desiccant collector or bath as was shown in FIGS. 1A and 1B. The treated air 504 is now put in the building directly without the need for any additional ducts. Furthermore, since all flows of air, heat transfer fluids and desiccant are vertical, the system is thermally more efficient. The wavy shape of the plates has two primary advantages: air is more easily brought in contact with the surface of the plates since the wavy shape constitutes more of a convoluted path than a straight plate would have given. But importantly, the wavy shape allows for the plates to expand sideways without putting undo stresses on the connections for heat transfer fluids and desiccants at the top and bottom of the plates. This is particularly important since the wavy plates should be constructed from a material that is compatible with the desiccant being used, for example from a (thermally conductive) plastic material such as a thermally doped polymer extrusion. Typically such a plastic has a thermal conductance of about 5 to 10 W/mK. As an example thermal conductances for regular plastics range from 0.1 to 0.5 W/mK, whereas copper, aluminum, stainless steel and titanium have a conductance of about 400, 250, 16 and 18 W/mK respectively. Of these materials only Titanium is reasonably suitable for use with desiccants such as $CaCl_2$ or $LiCl_2$ due to the corrosive nature of the desiccants. The wavy plates in the regenerator 502 will expand under the higher temperatures for regenerating the desiccant. This can create thermal stresses on the assembly. The wavy shape helps to reduce those stresses by allowing the plates to expand sideways rather than in the vertical direction.

The liquid desiccant is collected at the bottom of the wavy plates at 511 and is transported through a heat exchanger 513 to the top of the regenerator to point 515 where the liquid desiccant is distributed across the wavy plates of the regenerator. Return air or optionally outside air 505 is blown across the regenerator plate and water vapor is transported from the liquid desiccant into the leaving air stream 506. An optional heat source 508 provides the driving force for the regeneration. The hot transfer fluid 510 from the heat source can be put inside the wavy plates of the regenerator similar to the cold heat transfer fluid on the conditioner. Again, the liquid desiccant is collected at the bottom of the wavy plates 502 without the need for either a collection pan or bath so that also on the regenerator the air can be vertical. It should be clear to those skilled in the art that the wavy plates can be easily expanded to add additional cooling or heating capacity, that these plates provide for better heat transfer and that the elimination of any bath or collection pan allows for the system to be directly mounted on a roof opening without the need for additional duct work. An optional heat pump 516 can be used to provide cooling and heating of the liquid desiccant similar to the method employed in FIG. 1A. It will be clear to those skilled in the art that the absence of a liquid bath or collection pan also enables the easy installation of the conditioner 501 in a remote location from other components in the system, such as are commonly used in what is know as "split" air conditioning systems.

It will furthermore be clear to those skilled in the art that the system of FIG. 5 can be made relative small in size in such a way that the system could be integrated into an automobile or other vehicle. In such an automobile the heat source 508 can potentially be the heat from an engine and cooling could be provided by a Peltier cooling system.

Figure 6A:
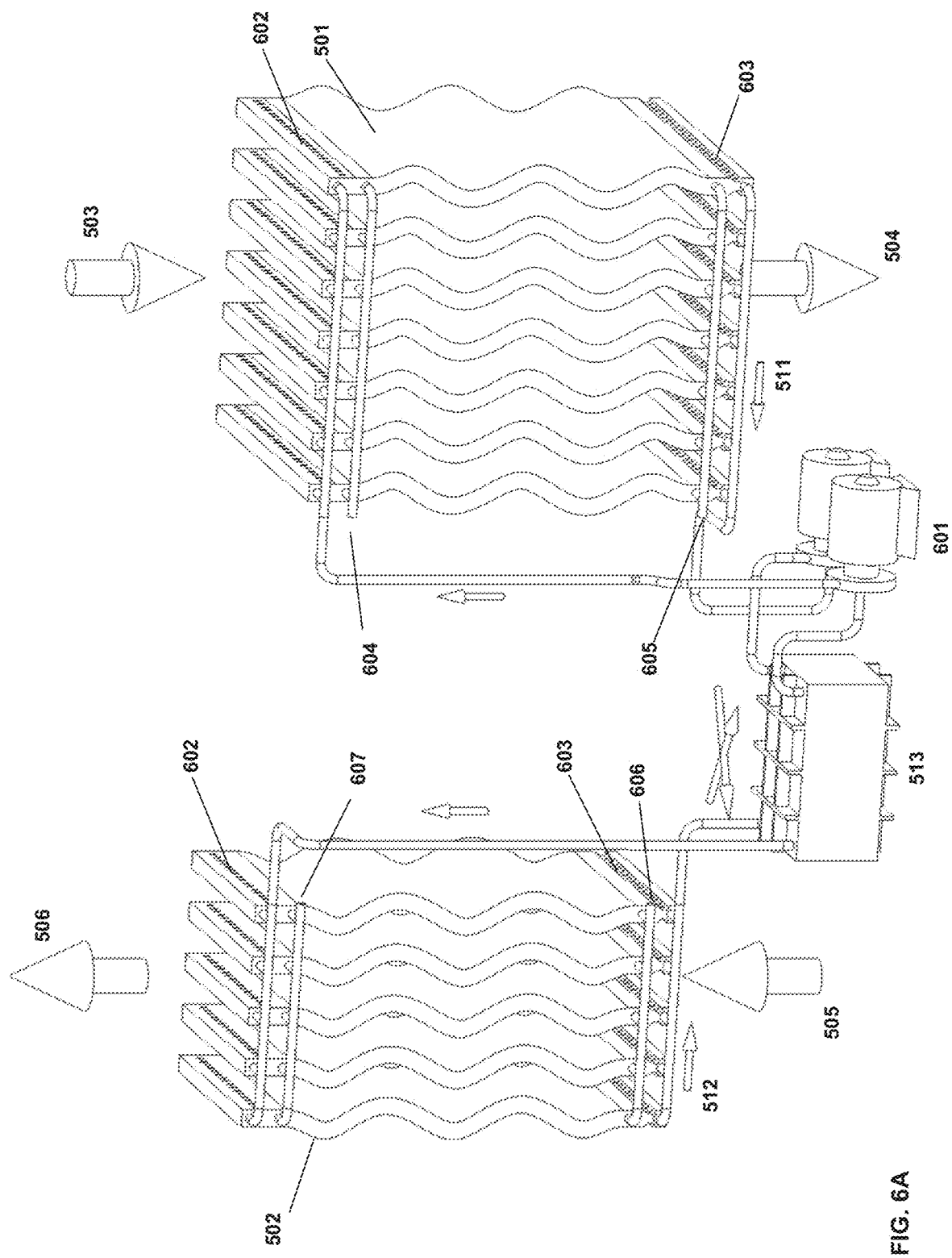
FIG. 6A depicts a three-dimensional view of the system of FIG. 5 in accordance with one or more embodiments.

In FIG. 6A the system of FIG. 5 is shown in a 3 dimensional projection. Desiccant fluid pumps 601 provide the transportation of the desiccant between the conditioner and the regenerator. The holes 602 at the top of wavy plates 501 and 502 ensure an even distribution of desiccant over the surface of the wavy plates. Groves 603 at the bottom of the wavy plates 501 and 502 collect the desiccant by using either the natural surface adhesion of the desiccant to the plastic of the wavy plates to gather the desiccant into the grove or by using some membrane or other wetting material to help collect the desiccant into the groove. The heat transfer fluid can be connected to the wavy plates at connections 604, 605, 606 and 607.

FIG. 6B shows how the inlet air 652 of a set of wavy plates 502 can be made turbulent by a set of plates 651. The plates 651 are constructed in such a way as to impart turbulent airflow to the air entering the wavy plates 502. The resulting turbulent air will better exchange heat and moisture with the surface of the wavy plates as compared to air that flows through the wavy plates in laminar fashion.

Figure 7:
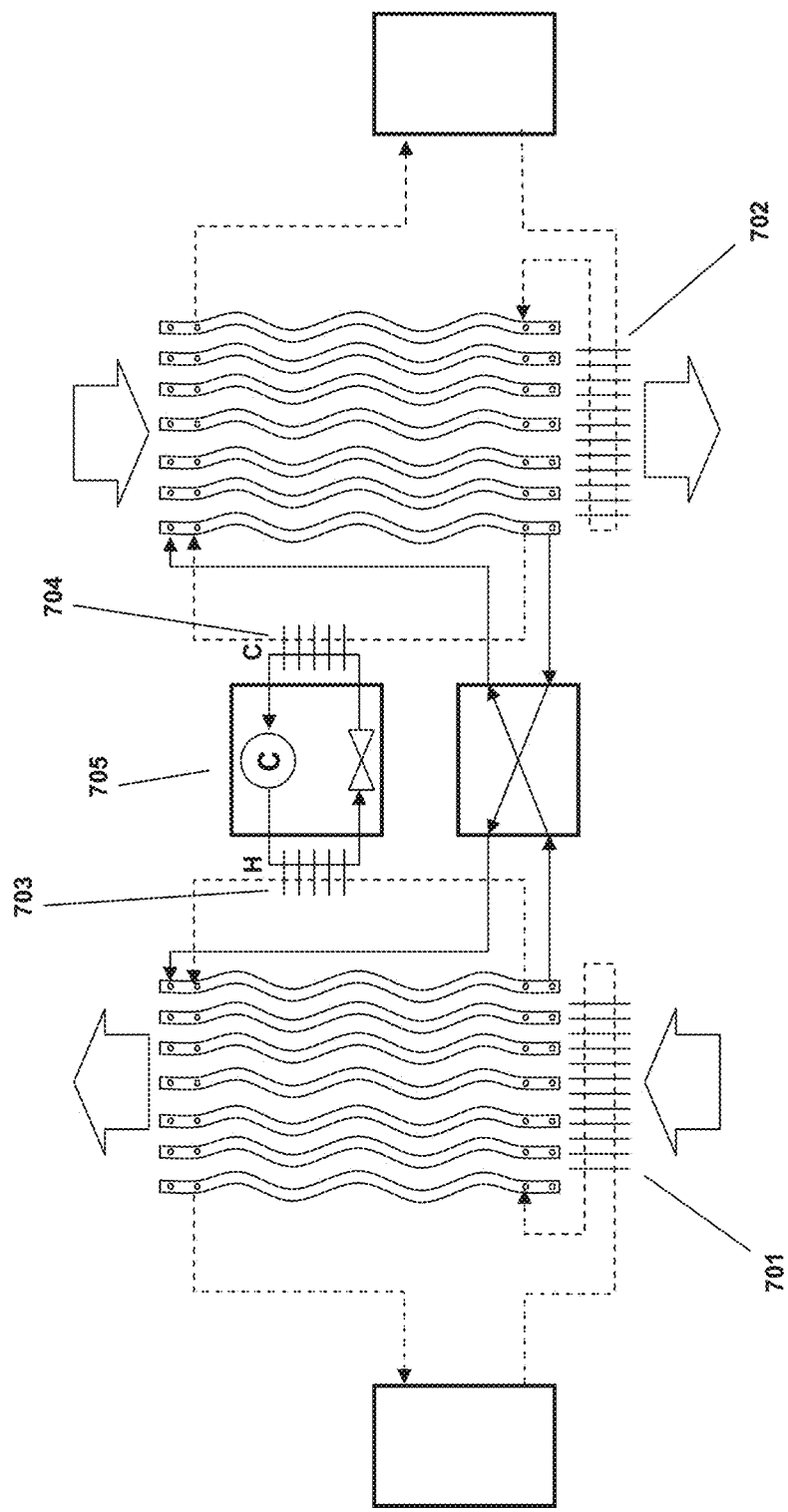
FIG. 7 shows the vertical air flow desiccant system with optional pre- and post air treatment coils and heat pump system in accordance with one or more embodiments.

FIG. 7 depicts the system similar to FIG. 5 with the addition of a post conditioner cooling coil 702 and preheating coil 701 for the regenerator. An alternate configuration for the heat pump 705 is to instead of heating the desiccant as in FIG. 5, to heat the heat transfer fluid with heat exchanger coils 703 and 704. The eliminates the need to have the heat exchanger use corrosion resistant components allowing for a more standard heat exchanger to be used.

Figure 8:
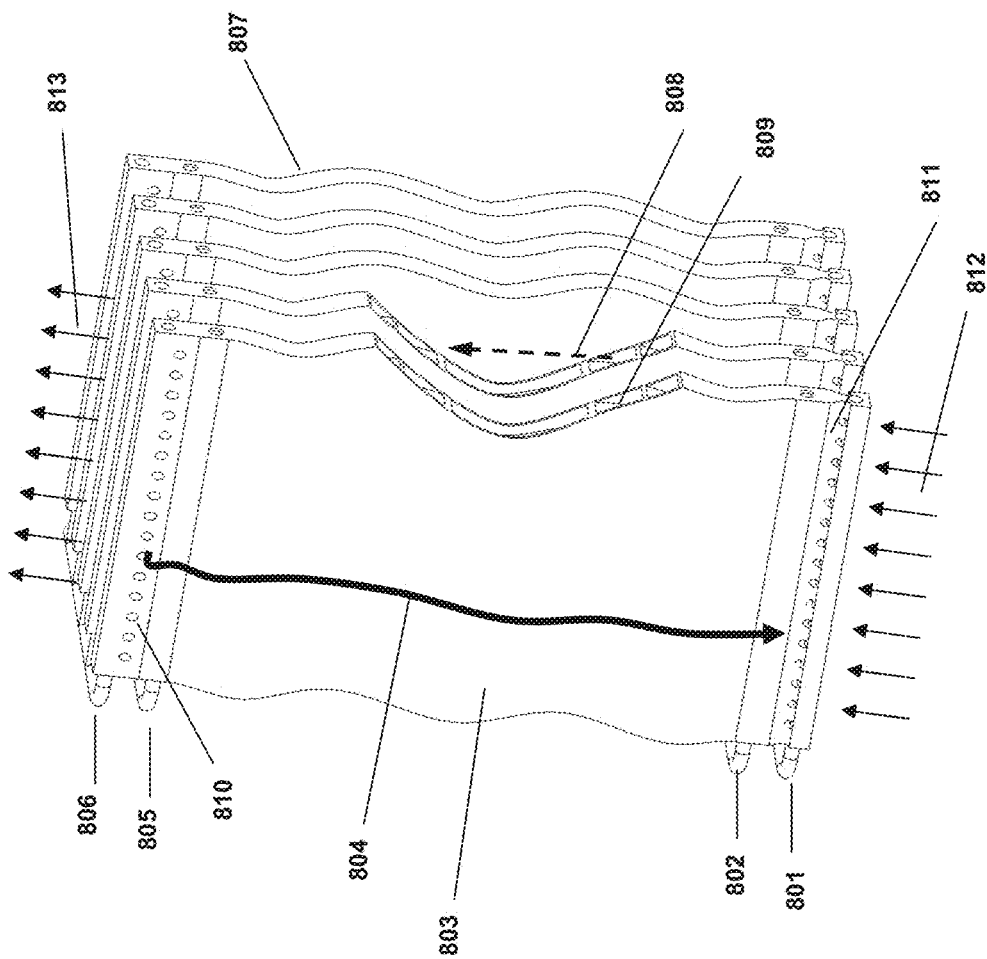
FIG. 8 depicts details around the wavy plate structures in accordance with one or more embodiments.

FIG. 8 shows a close-up view of one embodiment of the wavy plate assembly where the desiccant drain 801 at the bottom of the plates collects the desiccant that has run into the groove 811. Heat transfer fluid is connected to the plates at 802 and 805. The main body of the wavy plates 803 can be made from a suitable material that exhibits good thermal conductivity as well as corrosion resistance, for example a thermally conductive plastic extrusion. Liquid desiccant is entered into the distribution channel 806 at the top of the plates 807 and exits the holes 810 at the top of same plates and runs over the surface 804. The heat transfer fluid 808 runs inside openings 809 in the wavy plates. As can be seen from the figure the construction of the grooves 811 allows the desiccant to collect at the bottom of each individual plate without obstructing the air flow and without the need for a separate common collection pan. It should be obvious to those skilled in the art that the entering air stream 812 and exiting air stream 813 can be reversed and also that the direction of the heat transfer fluid between 802 and 805 can be either upwards or downwards. The desiccant itself would normally run down the surface because of the force of gravity acting on the desiccant.

Figure 9:
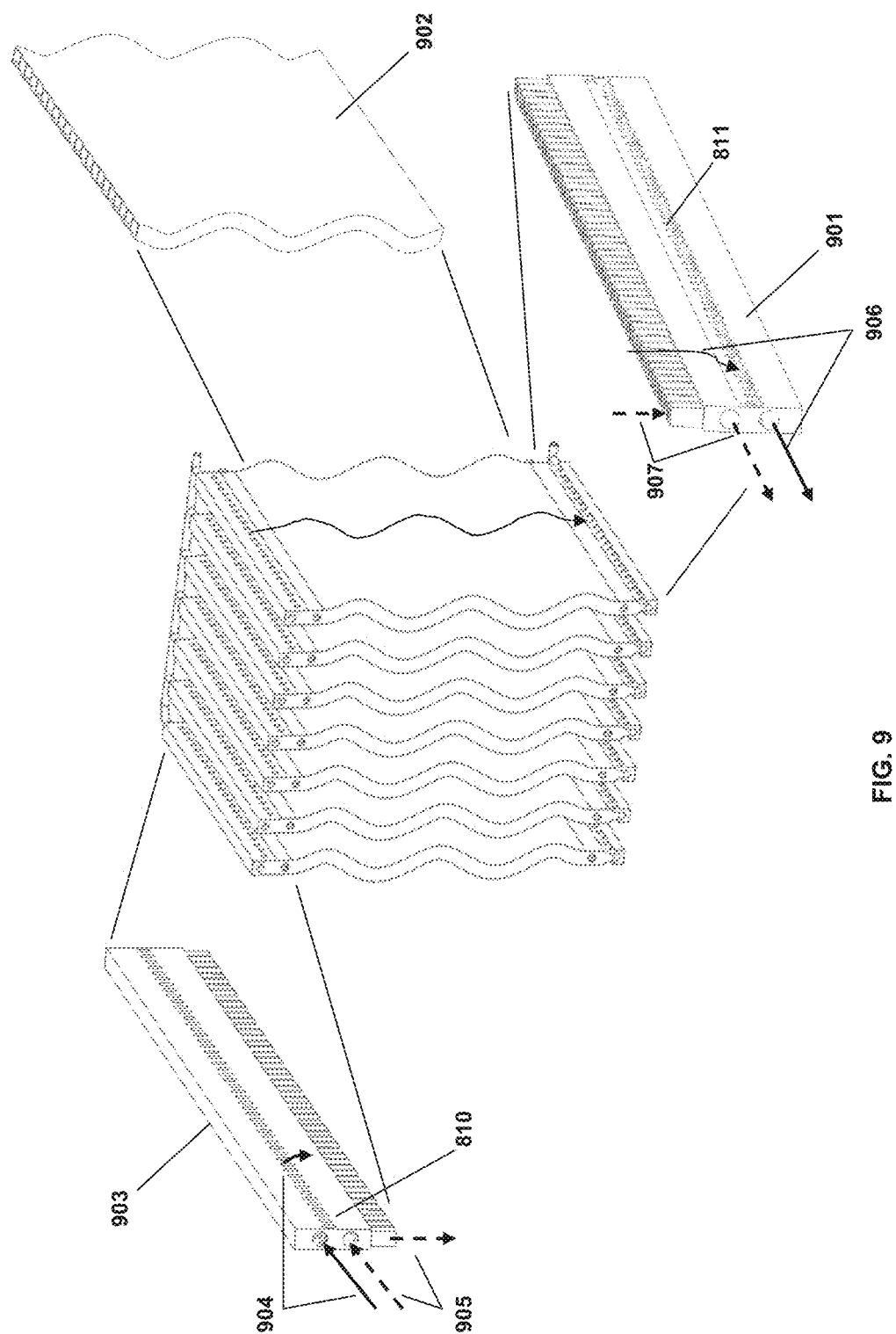
FIG. 9 shows a possible construction for the wavy plate structures in accordance with one or more embodiments.

FIG. 9 shows further details of one embodiment of the construction of such wavy plates. A component 901, which is preferably an injection molded plastic component, is bonded on the thermally conductive extrusion 902. It should be obvious to those skilled in the art that other manufacturing methods can be employed such as machining, thermoforming, welding and other suitable methods. Other materials for the components can be suitably selected to be compatible with the corrosive nature of typical desiccant solutions, for example Titanium and other noble materials. A similar component 903, also preferably injection molded, is bonded to the top of component 902. Desiccant is introduced through inlet 905 and spreads generally evenly through the holes 904. Heat transfer fluid is transferred through the openings 905 and exists through the openings 907. Desiccant that has run to the bottom of the wavy plates is collected by taking advantage of surface tension in the liquid into the groove 811 and runs through the drain exit 906.

Figure 10A:
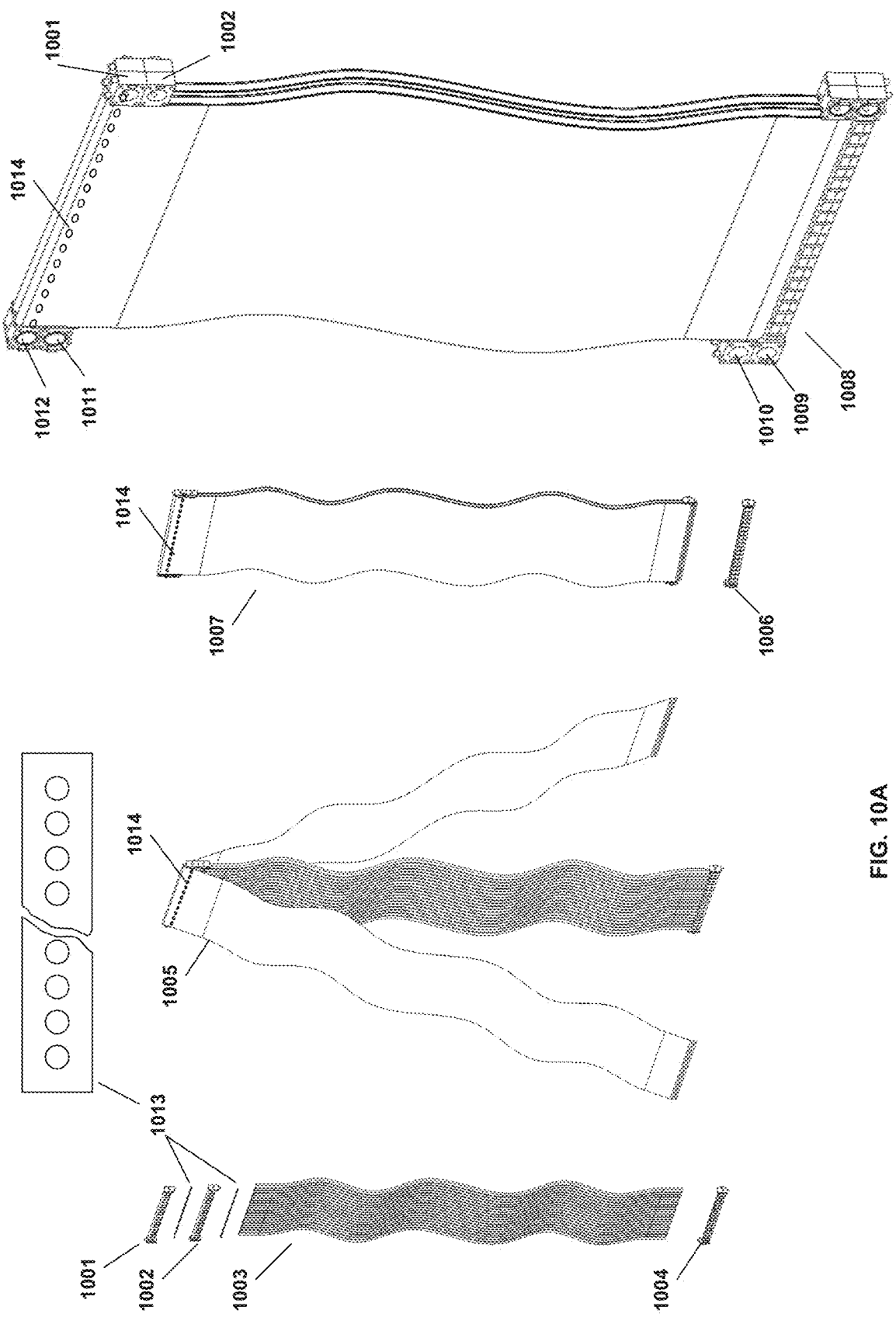
FIG. 10A shows an alternative method for wavy plate structure assembly, including the mounting of a membrane or wicking material in accordance with one or more embodiments.

FIG. 10A shows an alternative embodiment of a wavy plate construction in which components 1001 and 1002, which are preferably injection molded, are connected to the top of a wavy plate 1003. Spreader plates 1013 cause the desiccant and heat transfer fluid to be generally evenly distributed. In one embodiment an additional injection molded component 1004 provides the collection of the heat transfer fluid inside the wavy plate 1003. A membrane or other suitable material such as a wicking material 1005 is applied over the top of the assembly. An example of such a membrane is hydrophobic Poly Propylene manufactured by Celgard under the tradename EZ2090. An example of a wicking surface is a hydrophilic cardboard sheet material similar to coffee filter paper. The completely mounted assembly 1007 is then connected to a final injection molded component 1006 in such a way that the membrane or wicking material guides the desiccant into the component 1006. In the final assembly 1008 the liquid channels for the desiccant 1009 and 1012 are shown, as are the channels for the heat transfer fluid 1010 and 1011. If the material 1005 comprises a membrane, then draining the liquid desiccant from the wavy plates can become a challenge since the top of the assembly can "lock" the desiccant in place (also known as vacuum lock). Holes 1014 are purposely provided to allow air to enter behind the membrane so that the liquid desiccant can easily fill and drain behind the membrane. These holes also keep the membrane from accidentally getting pressurized, which could result in damage or deformation of the membrane. Advantageously, the holes are located slightly above the outlet of the desiccant as can be better seen in FIG. 11A. It can also be seen in 1008 that two wavy plate assemblies have been joined together to form a small stack of plates. It should be obvious to those skilled in the art that the assembly of wavy plates can so be stacked as to generate any amount of air treatment as desired by simply adding additional plates to the stack.

FIG. 10B shows a detailed cross section of two hydrophobic materials such as membranes 1051 with a hydrophilic wicking material 1052. Since micro-porous membranes or similar materials are usually made to be hydrophobic, the application of a membrane can have non-uniform wetting caused by the liquid (such as—by way of example—a salt solution or water) to be repelled by the membrane. The repellent forces result in non-uniform flow of liquid on the back of the membrane. By using a hydrophilic material 1052, the wicking effect of the hydrophilic material causes the liquid to evenly distribute behind the membrane resulting in significantly increased evaporation through the membrane and a significantly increased active area. A liquid running inside the wicking material will spread uniformly between the two membranes.

FIG. 10C shows a hydrophilic material 1052 behind a hydrophobic material such as a membrane 1051, attached to a thermally conductive support wall 1053 (which can be, e.g., a wavy plate). If the support wall is also hydrophobic such as is often the case with plastics and the like, then the wicking material will ensure even flow distribution of the liquid. The support wall can be made to be thermally conductive which would allow one to adjust the temperature of the liquid inside the wicking material and thereby control the evaporation of absorption through the membrane.

FIG. 10D shows a similar structure as in FIG. 10C wherein the wicking material is applied on both sides of the (thermally conductive) support wall 1053. The liquids inside the wetting materials 1052 on each side of the wall can now be made to be different. For example, the leftmost wicking material could be wetted with a salt solution and the rightmost wicking material could be wetted with water or some other heat transfer fluid.

FIG. 10E shows a structure similar to FIG. 10D wherein the support wall 1053 is now made to be hollow such that a heat transfer liquid 1054 can be used inside the support wall. Such a structure allows heat transfer from the heat transfer fluid 1054 through the walls into the wicking materials 1052 on either side of the wall 1054. It should be obvious to those skilled in the art that other combinations of hydrophobic and hydrophilic materials can be devised.

Figure 11A:
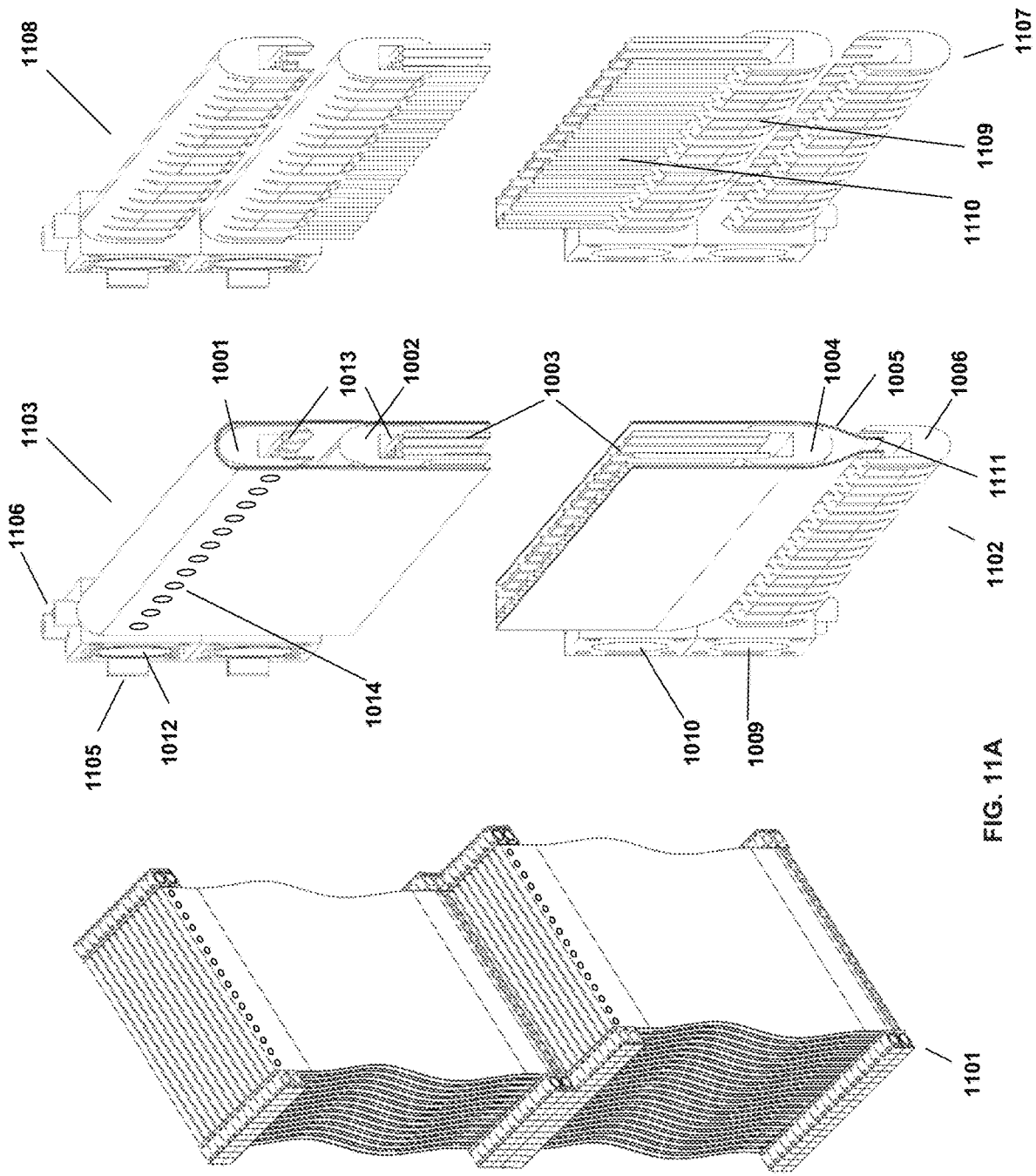
FIG. 11A shows how the plate structures can be stacked into larger arrays and depicts construction details in accordance with one or more embodiments.

FIG. 11A depicts additional details of the construction of such as stack of wavy plates. A stack of wavy plates 1101 can be set up to treat air multiple times by stacking the plates vertically as well as horizontally. Vertical stacking allows air to be treated for instance to increase dehumidification, whereas horizontal stacking increases the overall capacity of treated air. Detail 1102 shows a detail of the bottom of the wavy plate construction in which the membrane or wicking surface 1005 is used to guide the desiccant into the bottom drain 1006. The lower edge 1111 of the membrane or wicking material is not fixedly connected so as to avoid potential pressure buildup of desiccant which could lead to damage of the membrane or wicking surface. Detail 1107 shows the same area as detail 1102 except with the membrane 1005 removed. The channels 1109 and 1110 that are created in the components 1004, 1006 and 1003 allow for the membrane 1005 to be bonded, but still allow for the desiccant to pass through the channels. Similarly detail 1103 of the top of the wavy plate assembly shows how the desiccant is able to enter through supply channel 1012 and run through the channels in components 1002 and over the surface of wavy plate component 1003. It should be clear from the details that the holes 1014 and the unconnected edge 1111 at the bottom advantageously serve the function to 1) inhibit vapor lock at the top of the assembly and 2) to avoid pressure damage to the membrane or wicking surface at either the top or the bottom of the assembly. Again detail 1108 shows the same top assembly with the membrane 1005 removed. Since the surface area of the wavy plate assembly 1101 is important for the overall air treatment capacity of the system, it should be easy to stack multiple wavy plates in both the horizontal and vertical direction as discussed above. Features 1104, 1105 and 1106 allow for stacking of plates by aligning and locking plates together. It should be clear to those skilled in the art that such features can have many shapes and sizes.

Figure 11C:
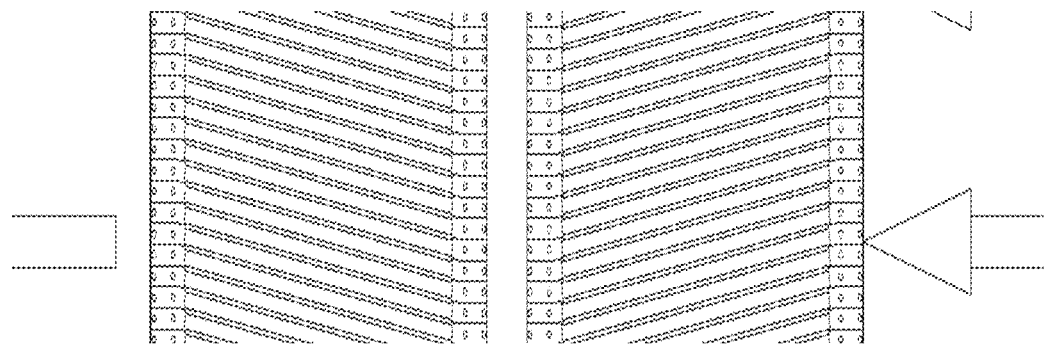
FIG. 11C shows a top view of the embodiment of FIG. 11B.
Figure 11B:
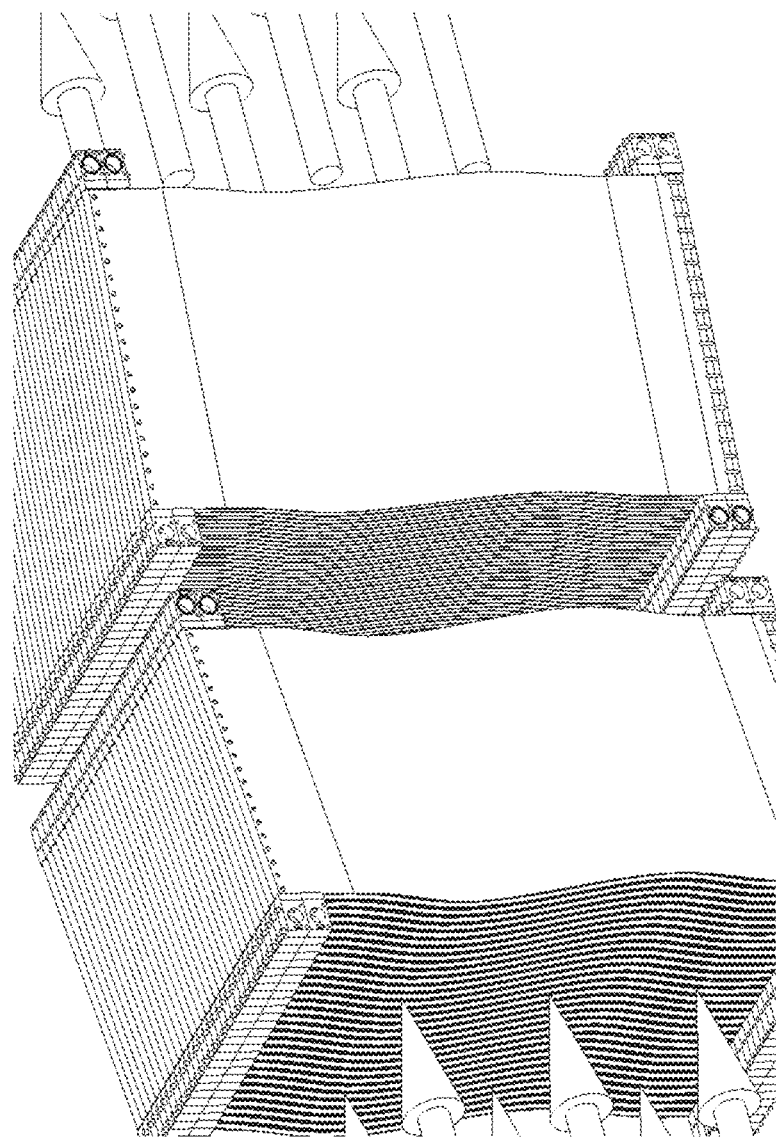
FIG. 11B illustrates desiccant system employing a horizontal air flow through two conditioners in accordance with one or more embodiments, wherein the air is treated twice by plates that are oriented at an angle to the air flow.

FIG. 11B shows a system setup similar to FIG. 5 wherein the wavy plates are accepting a horizontal air flow. In the figure the wavy plates form two stacks in such a way as to treat the air passing through twice. By placing the wavy plates at a small angle to the incident air, the air will interact more readily with the liquid desiccant on the surface of the wavy plate. Such liquid desiccant can be located behind a membrane or in a wetting material as described before. By maintaining the wavy aspect in the vertical direction, any thermal stresses caused by thermal expansion and contraction of the wavy plates are significantly reduced.

FIG. 11C illustrates the setup from FIG. 11B in a top-down view.

Figure 11D:
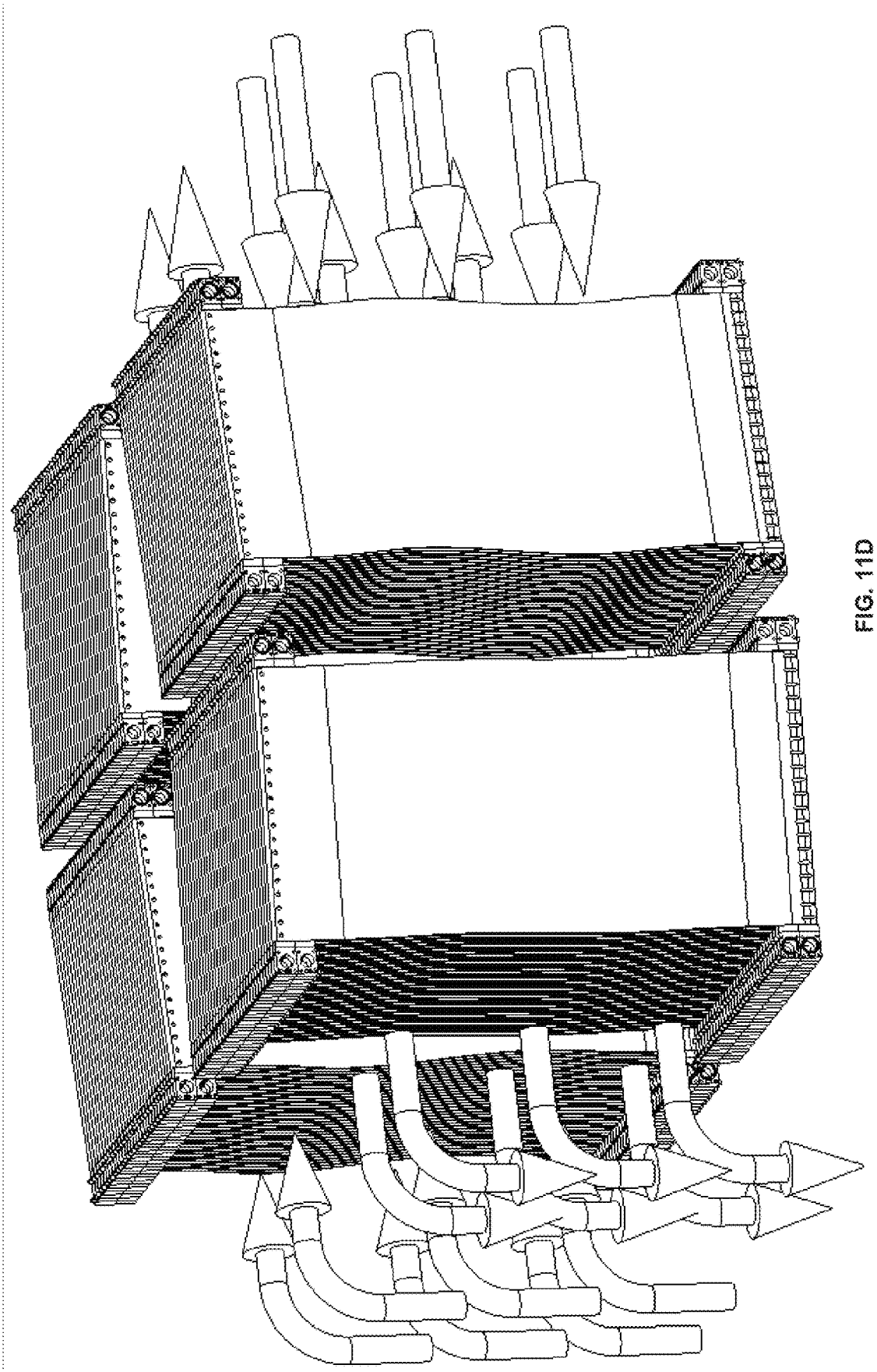
FIG. 11D shows the arrangement from FIG. 11B replicated twice in such a way as to treat the incoming air into a space and to recover energy from the returning air in a second set of conditioners in accordance with one or more embodiments.

FIG. 11D shows the dual set of wavy plates from FIG. 11B implemented twice. The first set treats air coming from outdoors and performs a double treatment of this incoming air. The second set receives return air from a space and also treats it twice. In such a setup the recovery of energy (water vapor and thermal energy) can be near complete. This setup allows for energy recovery while still allowing thermal energy to be added or removed and water to be added to air coming through the plate system through the desiccant, thereby enhancing the heating or cooling of the incoming air. Conventional energy recovery systems typically do not allow for the addition or removal of thermal energy or water.

Figure 11E:
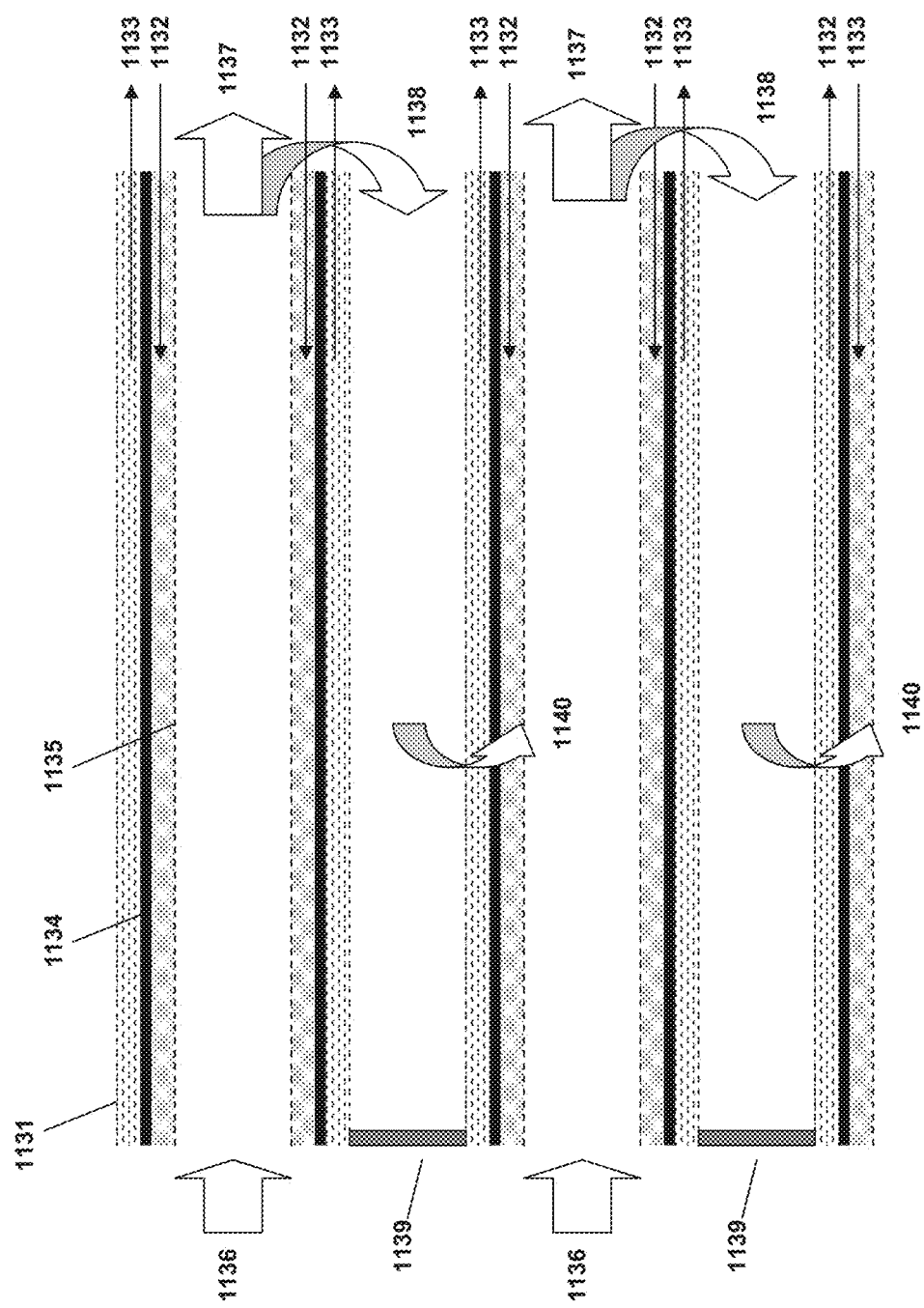
FIG. 11E shows a desiccant membrane plate stack in the prior art that uses a portion of the dehumidified air for indirect evaporative cooling in accordance with one or more embodiments.

FIG. 11E illustrates a desiccant cooling system in the prior art. A stack of plates 1134 is placed (typically about 0.25 inch apart) and is covered by a membrane 1131 that has water 1133 flowing behind it. The opposite site of the plate contains a second membrane 1135 behind which a liquid desiccant is flowing. Incoming air 1136 is dehumidified because water vapor in the air is absorbed into the liquid desiccant through the membrane 1135. At the exit of the plates, the dehumidified air 1137 is partially directed towards the space being cooled and a portion is directed in the reverse direction 1138. This secondary air flow 1138 is relatively dry and can effectively absorb water vapor from the water 1132 behind the membrane 1135. The absorption of water vapor through the membrane into the air leads to a cooling effect of the diverted air. This cool air in turn cools the water 1133. The cool water then thermally cools the plates as well as the liquid desiccant which ultimately leads to the main air stream being cooled. This approach allows evaporative cooling to occur in climates such as Miami, Fla. where humidity levels and temperatures are relatively high so that cooling towers normally do not function as well. By first drying the incoming air and then using indirect evaporative cooling through the membrane, the system is able to use evaporation to create a cooling effect. To inhibit the secondary air from mixing with the outdoor air, it is diverted by diverter 1139 near the end of the plate stack in a direction 1140 perpendicular to the drawing. As can be seen in the figure, the membrane/liquid layers are mirrored—water is facing water and desiccant needs to face desiccant for each of the plates. This creates a challenge for manufacturing such a plate stack.

Figure 11F:
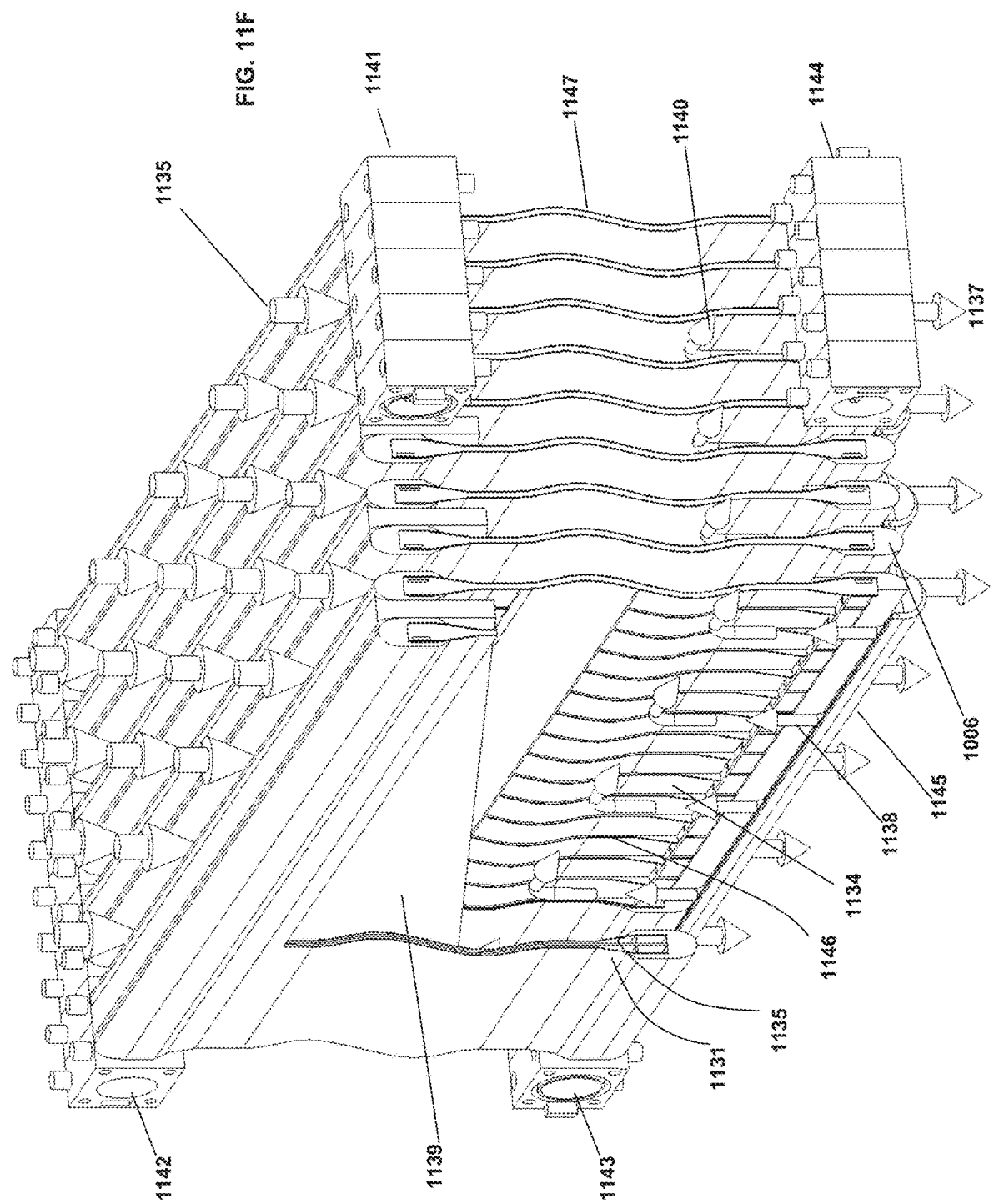
FIG. 11F illustrates a section of a desiccant membrane plate stack that uses a portion of the dehumidified air to provide indirect evaporative cooling in a controllable fashion.

FIG. 11F illustrates an embodiment of the concept of FIG. 11E wherein wavy plates 1147 are used to provide and alternating structure for liquid desiccant and water. In some embodiments, the wavy plates are made using thermally conductive plastics. The wavy plates contain ridges 1146 to support the membranes 1131 and 1135. Liquid desiccant enters the wavy plate set through channel 1141 and exists through channel 1144. Water enters through channel 1142 and exits through channel 1143. An adjustably connected air diverter 1145 takes a controllable amount of air in directs it in the reverse direction 1138. The diverted air 1138 absorbs water from behind the membrane 1135. The diverter 1139 closes the top of the opening between the plates and directs the airflow 1140 in a perpendicular direction. The bottoms and tops of the wavy plates 1147 are inserted into an injection molded component 1006 similar in design to FIG. 10A.

Figure 11G:
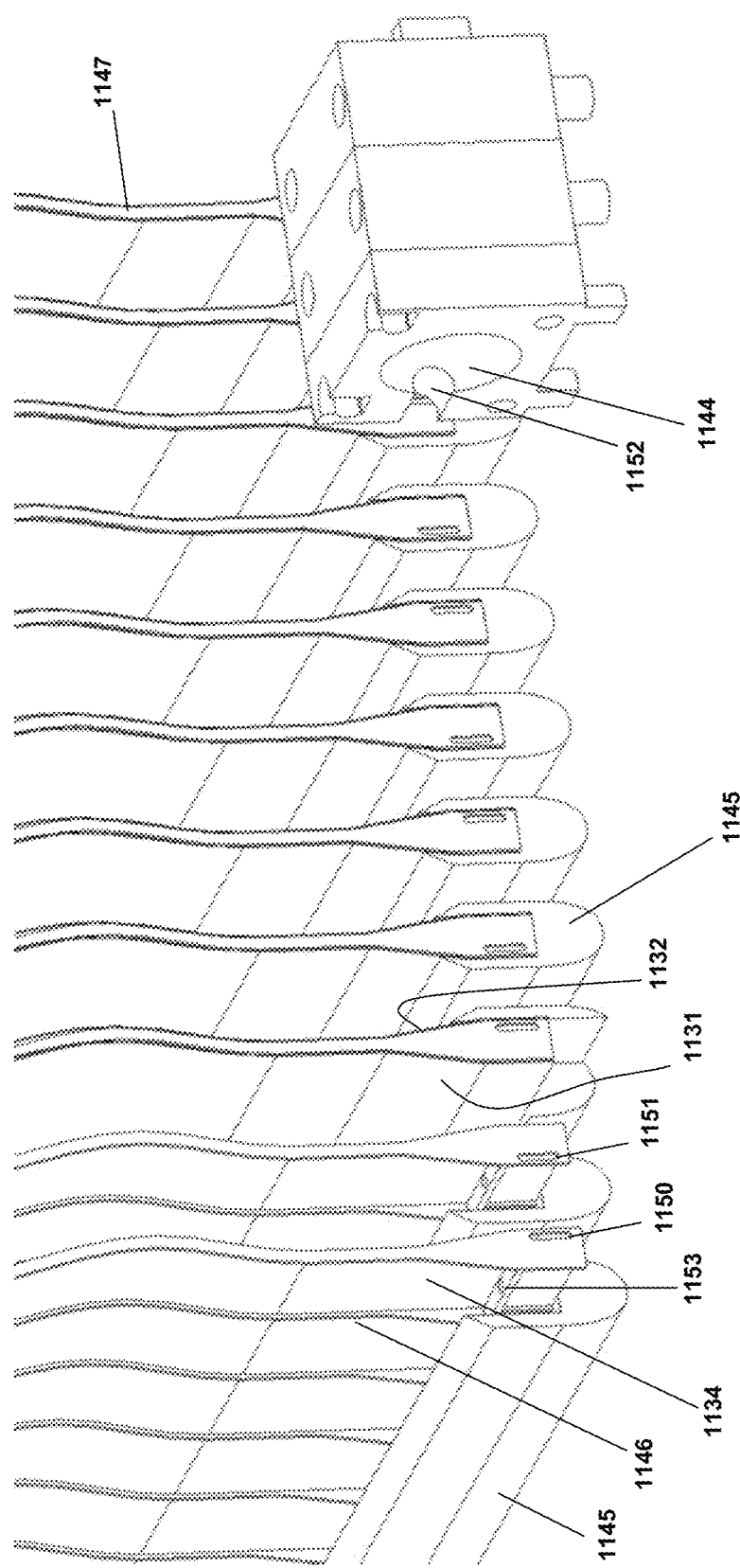
FIG. 11G shows a close up cut away detail for the bottom of the plate stack in FIG. 11F.

FIG. 11G shows a detail of FIG. 11F wherein a close-up of the wavy plates 1147 that have the membranes 1131 and 1135 mounted to the ridges 1146 on the wavy plates. In order to provide liquid to opposite faces of the wavy plates, holes 1150 and 1151 are provided in such as way is to provide access to alternating sides of the wavy plates 1147. The liquid desiccant enters the drain channel 1144 through the holes 1152. As can be seen from the figure, the wavy plates 1147 can be made to be generally identical, except that the wavy plates are flipped upside down in an alternating fashion.

FIG. 11H shows a detail of the wavy plates 1147. The wavy plates are alternatively flipped upside down to provide opposing connections to the water and desiccant supply lines. As can be seen in the figure, the ridges 1146 provide support for the membrane and the thermally conductive surface 1134 provides a thermally conductive path to the opposite side of the wavy plate. The holes 1153 provide a uniform distribution of the liquids similar to the holes in component 1013 in FIG. 10A.

In various embodiments described herein, wavy plate structures are used to expose a liquid desiccant to an air stream through a membrane while simultaneously exposing the liquid desiccant to a heat transfer fluid. Various alternate structures can also be used to perform these functions. For example, FIGS. 11I and 11J illustrate a tubular structure for exposing a liquid desiccant to an air stream through a membrane while simultaneously exposing the liquid desiccant to a heat transfer fluid. The structure comprises a plurality of tubes 1181 that can be made from any suitable thermally conductive material for example from a thermally doped polymer extrusion. The inner wall of the tube can feature ridges 1184 to allow a membrane 1182 to be bonded to the top of the ridges in such a way that the membrane is held at a small distance to the tube wall so that liquid desiccant can pass between the wall and the membrane perpendicular to the plane of the figure in the so created channel 1183. Air can thus be passed in the center of the tubes 1186, while heat transfer liquid can pass in the generally triangular sections 1185 between tubes. The heat transfer fluid is thus able to heat the desiccant solution through the thermally conductive walls. It should be understood that other shapes and arrangements of tubular structures can also be devised. FIGS. 11I and 11J also show that it would be possible to apply some wavy shape to the tube which as in the previous embodiment functions to achieve better interaction between air and desiccant while at the same time reducing stresses due to thermal expansion in the vertical direction of the structure.

Figure 11L:
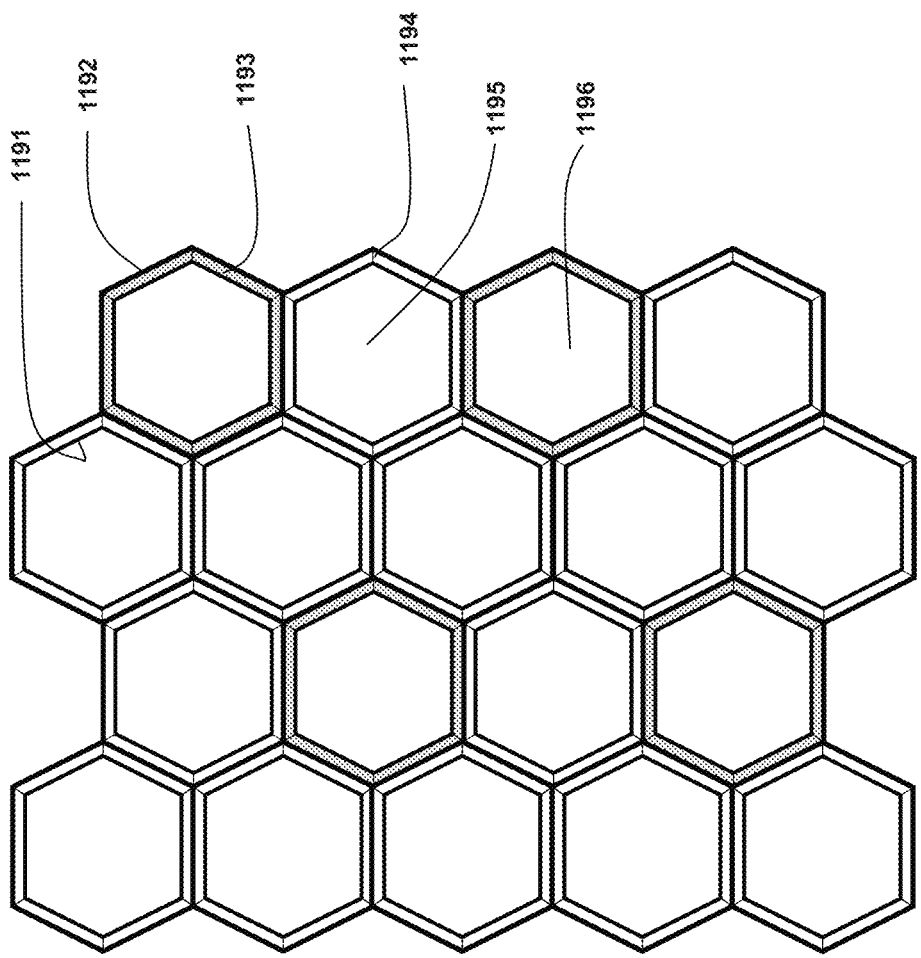
FIGS. 11K and 11L illustrate a three dimensional and top view, respectively, of a hexagonal structure for exposing liquid desiccant to an air stream while providing heating or cooling functions in accordance with one or more embodiments.
Figure 11K:
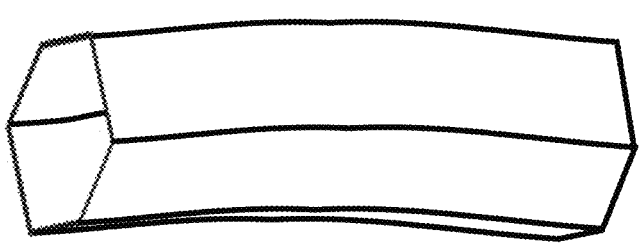

FIG. 11L is a top view of an alternate hexagonal structure of thermally conductive surfaces 1192 in accordance with one or more embodiments. FIG. 11K is a three-dimensional view of one of the hexagonal elements forming the hexagonal structure. Each hexagonal element in the structure includes thermally conductive surfaces 1192. Ridges 1194 allow membranes 1191 to be mounted substantially parallel to the thermally conductive surfaces. The channels between the membrane 1191 and the walls 1192 in some of the elements can be used for passage of a heat transfer liquid or alternately for passage of water to perform an evaporative cooling function in a similar manner to the system described in FIG. 11E. In the example shown in FIG. 11L, the hexagonal elements with channels between the membrane 1191 and the walls 1192 shaded in gray contain water, and the channels in the other hexagonal elements contain liquid desiccant. Thus, air in channels 1195 can be exposed to the liquid desiccant through the membranes, while already treated air 1196 can be exposed to water through the membranes.

Figure 12:
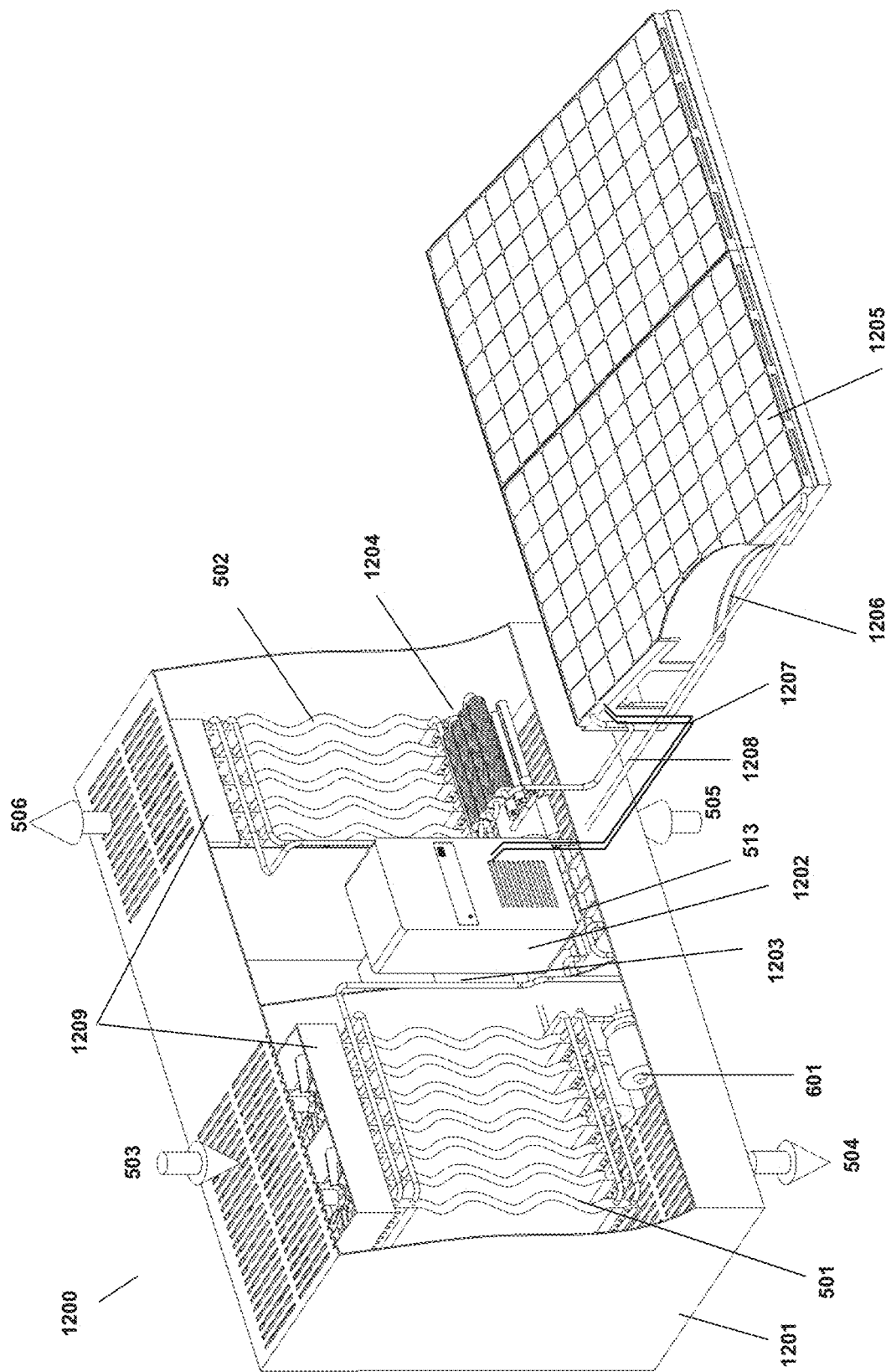
FIG. 12 depicts a complete solar air conditioning system including a solar PV/Thermal array in accordance with one or more embodiments.

FIG. 12 shows how the wavy plate assemblies discussed above can be integrated into a full solar air conditioning system. The enclosure 1201 provides protection of the desiccant air components from the weather. The system includes the conditioner 501 and the regenerator 502. Pumps 601 provide desiccant flow to the conditioner and regenerator. Blowers 1209 move air into and out of the building. Outdoor air 503 is treated by the wavy plates and moved into the building as treated air 504. Return air 505 from the building can absorb the heat and water vapor and is exhausted at 506. A small optional chiller 1203 provides sensible cooling if needed. A solar inverter 1202 can invert the electricity coming from a series of solar modules 1205. There is a significant advantage for integrating a solar inverter to an air conditioning system (whether it is a conventional air conditioner or a desiccant air conditioner): a rooftop air conditioning unit already has a significant electrical supply line going up to it. By integrating an inverter into a replacement air conditioning unit, the installation of PV or PVT modules a dramatically simplified. Normally a solar inverter is located somewhere inside the building and electrical lines are run from the roof to the inverter creating a significant amount of cost and labor. By locating a solar inverter inside an air conditioner there is no need to run any electrical cabling into the building, since the existing electrical lines to the air conditioner can be back-fed by the inverter to supply electrical power to the building. Also in the figure is shown a supplemental water heater 1204 that can be used when the PV-Thermal modules do not provide adequate temperatures or power. In addition the solar modules 1205 can have a water storage tank 1206 in such a way that access hot water can easily be stored. In this system the hot water tank 1206 is functions to provide ballast to the PVT module. Normally a concrete block or similar ballast would be provided to hold down solar modules on a flat roof. However, by using a thin flat tank like 1206, we achieve two objectives: hot water storage as well as ballast. It should further be noted that each solar module can have its own storage tank. By integrating tanks 1206 below the PVT modules 1205, all electrical lines 1207 and heat transfer fluid lines 1208 can be led to the desiccant system 1200 without the need for any lines entering the building or for installing tanks or inverters anywhere in the building thereby significantly improving installation time for the system.

Figure 13A:
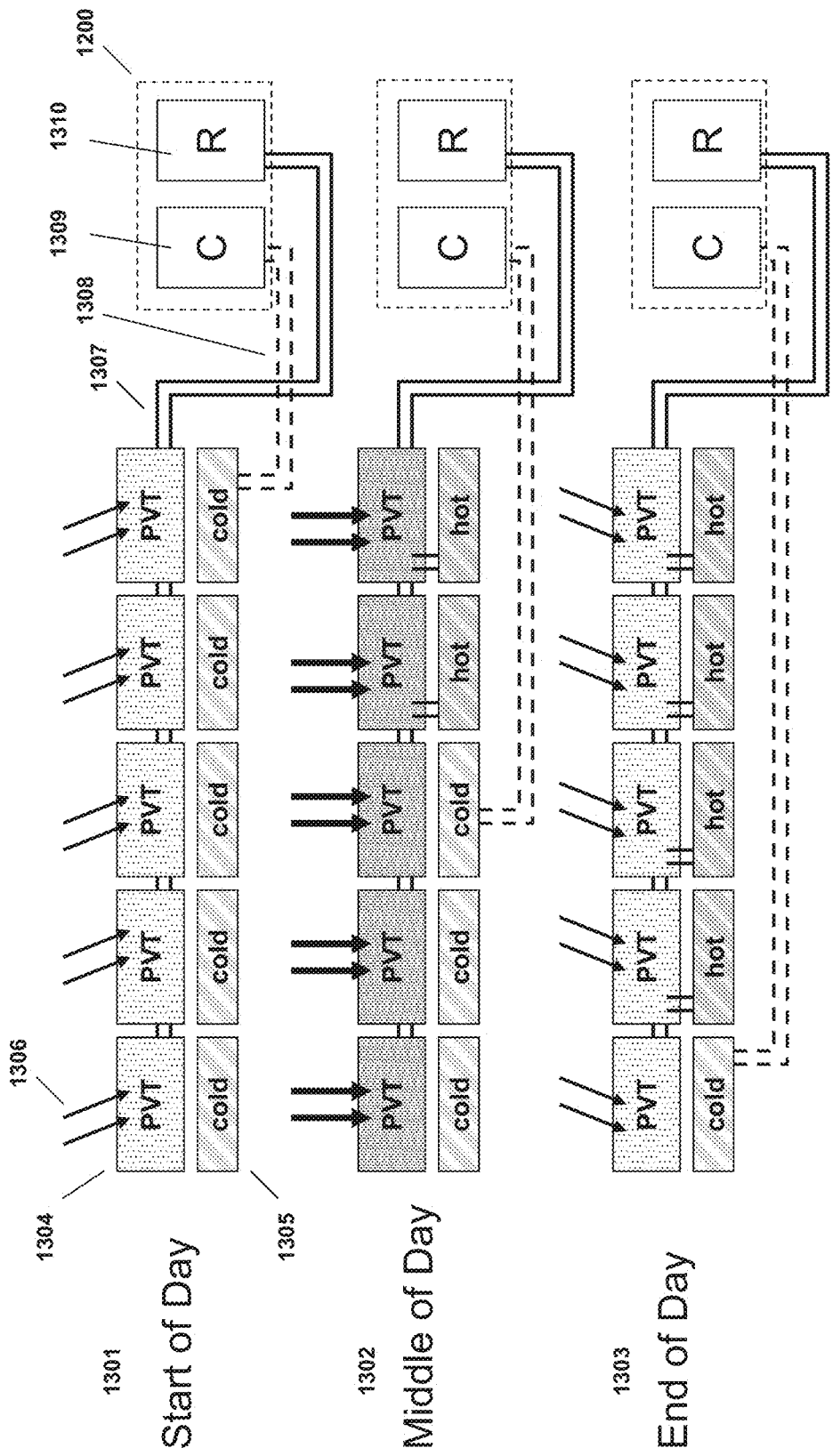
FIG. 13A demonstrates how storage and PVT modules can be used to create a hot/cold offset cycle for a desiccant air conditioning system during the day in accordance with one or more embodiments.
Figure 13B:
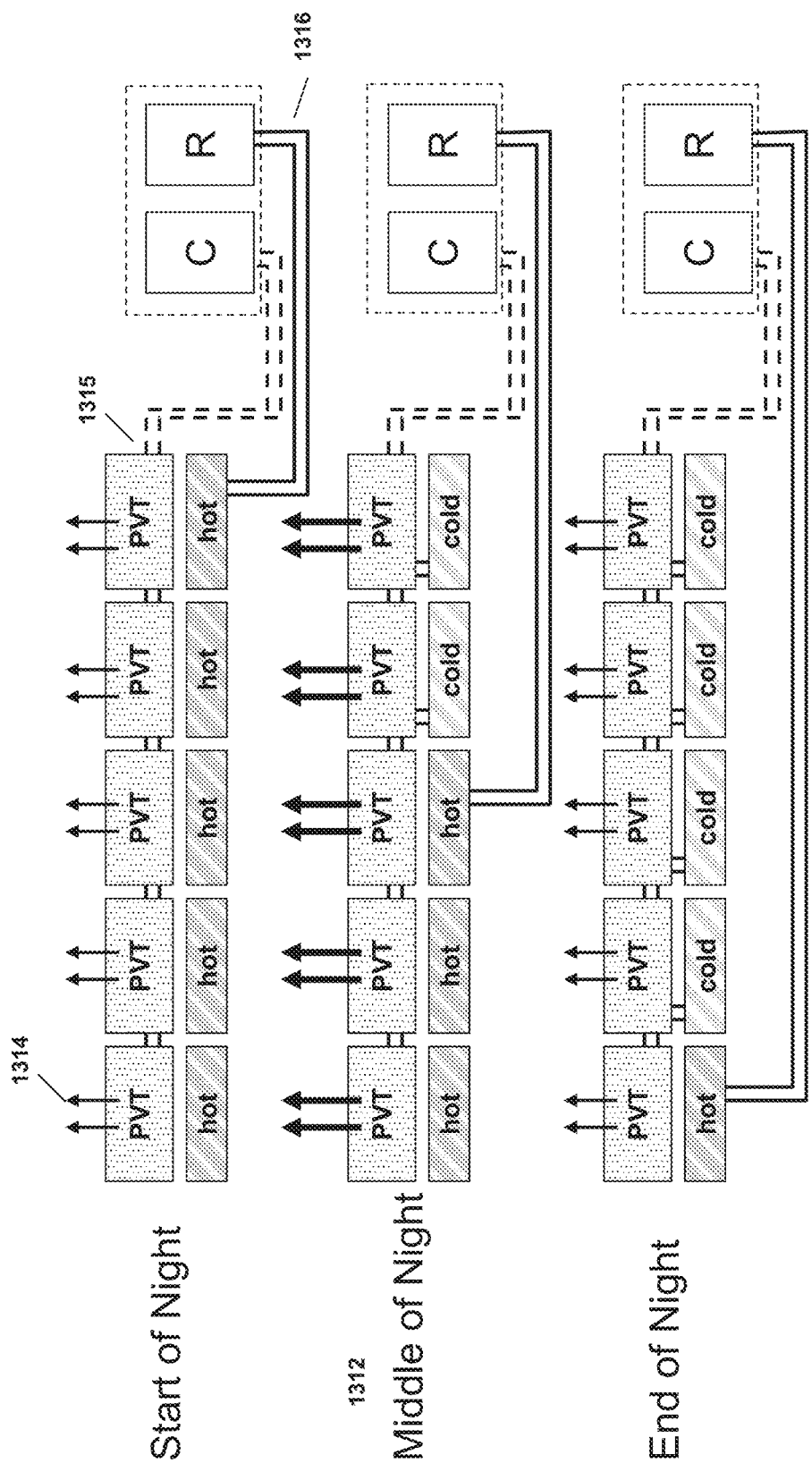
FIG. 13B demonstrates how storage and PVT modules can be used to create a hot/cold offset cycle for a desiccant air conditioning system during the night in accordance with one or more embodiments.

FIG. 13A illustrates how such a storage system as shown in the previous figure can be used. At the start of the day, 1301 the PVT modules 1304 start receiving solar radiation 1306. The storage tanks 1305 underneath the PVT modules are generally filled with cold water (or some other heat transfer fluid). The PVT modules start generating hot water which is directed to the solar air conditioning system 1200, and specifically to the regenerator 1310. Since sensible cooling also needs to be provided, one of the cold water tanks is connected to the conditioner 1309. As the day progresses 1302, the PVT modules will generate excess hot water which can be used to start filling up some of the tanks. The connection 1307 and 1308 are made in such a way that the correct number of tanks is connected to the air conditioner 1200. At the end of the day 1303, most or all of the tanks will contain hot water. This hot water can now be used to continue to run the regenerator during the evening and night by connecting the hot tanks through lines 1316 to the regenerator as shown in FIG. 13B. Since PVT modules are also relatively efficient at shedding heat by radiation 1314, the PVT modules can now be directly connected to the conditioner by lines 1315. In the middle of the night 1312, the radiation from the PVT modules can be used to start making cold water for storage in the tanks in such a way that by the end of the night all hot water has been used and cold water has filled the tanks underneath the modules. This allows the cycle to start over again. Effectively this arrangement allows the day to night shifting of cold and hot water generation, which can eliminate the need for any sensible cooling system such as the small chiller 1203 in FIG. 12.

FIG. 14A shows an embodiment of the solar PVT modules from FIG. 12 in some level of detail. The PV laminate 1401, which can either be silicon or thin film based, generates the electrical power. The storage tank 1402 doubles as a hot liquid storage container as well as a ballasting system. FIG. 14B shows a cut-out close-up of the system. A series of thin channels 1405 behind the laminate 1401 collect heat from the laminate and heats the transfer fluid. The main hot water channel 1404 brings water down to a thermostatic valve assembly 1403. The thermostatic valve can direct hot water either directly to the main manifold 1406 or to the storage tank 1402. The thermostatic valve can either be operated automatically or through a software control.

FIGS. 15A and 15B demonstrate another use of the storage tank underneath the PVT module. The storage tank is this case has a removable lid 1501 and a main body 1502. The side and rear supports 1504 of the PV laminate 1503 are removably connected to the tank and the PV laminate. After removing the lid 1501, the entire solar module and support structure can be put inside the tank body thereby protecting the solar module during shipment. This alternate use of the tank as a shipping container can be very helpful when solar modules have to be setup and disassembled on a regular basis for example as may occur for remote military basis. In effect, the tank now serves three functions: shipping container, storage tank and ballast system.

FIG. 16A demonstrates a schematic of the setup of a solar air conditioning integrated to a desiccant system for extreme summer operation. All of the desiccant from the conditioner 501 is sent to the regenerator 502. The advantage of the plate structures is that in effect the plate sets 501 and 502 are three way heat exchangers between air, liquid desiccant and a heat transfer fluid. This allows for PVT modules to be tied in at two places: directly heating the heat transfer fluid at 1601, or heating the desiccant through a heat exchanger at 1602. Similarly the cold connections for sensible cooling can either be made on the desiccant side 1604 or on the heat transfer fluid side 1603.

FIG. 16B shows a setup for summer non-extreme operation. The major difference with the previous case is that only a portion of the desiccant is send through the heat exchanger 513. The flows of desiccant at 1609 and 1610 can be adjusted so that only a portion of the desiccant is send to the regenerator. As in the previous case, the PVT modules can be tied in at two places: at the desiccant side 1606 and at the heat transfer fluid side 1605. Again the cold connections can be made on either the desiccant 1608 or the heat transfer fluid 1607. It will be clear to those skilled in the art that all the heat sources and cold sources can be supplemented by other sources tied into the same lines in parallel or in series to the PVT modules or cold sources in the drawings.

Figure 17A:
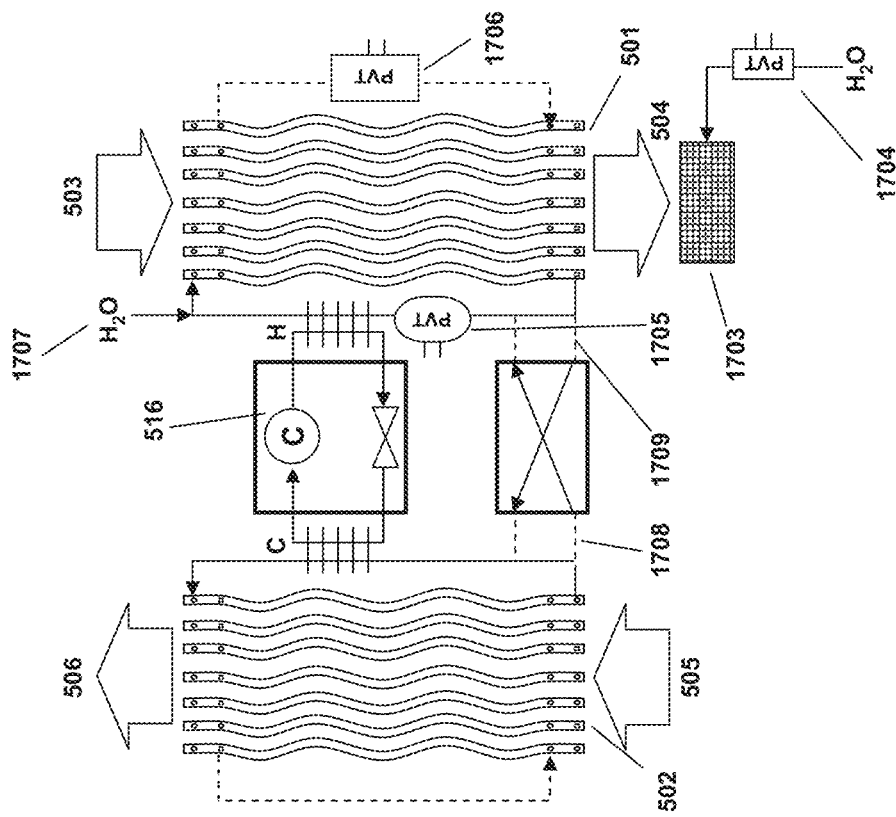
FIGS. 17A and 17B demonstrate how PVT modules can be integrated into the wavy plate desiccant system and humidifiers for winter operation in accordance with one or more embodiments.

FIG. 17A shows a liquid desiccant system set up for winter heating in extreme conditions. Since active cooling of the leaving air is not necessary, the cold sources have been omitted from the drawings. Again PVT modules can be tied into desiccant side 1705 or the heat transfer fluid side 1706. Since the heated desiccant will also emit water vapor additional water may have to be added at 1707 to prevent high concentrations of desiccant and potential crystallization of the desiccant salts. Furthermore the treated air 504 may require additional humidification 1703 which again can be done more efficiently by preheating the water at 1704 with PVT modules or another heat source.

Figure 17B:
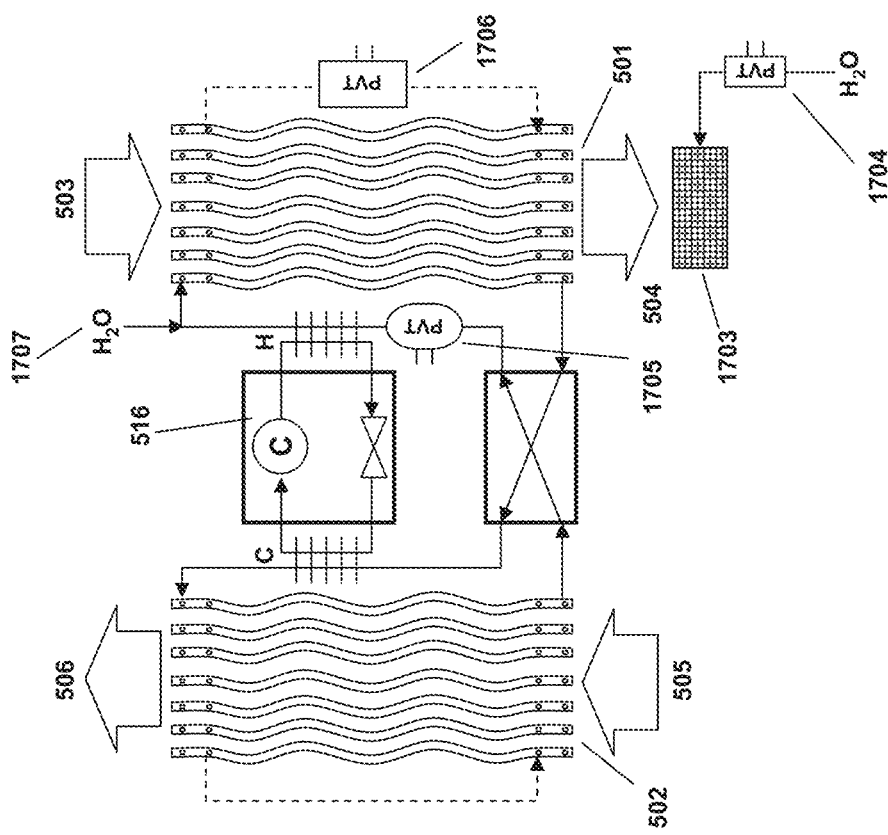

FIG. 17B shows a similar setup to FIG. 17A except for non-extreme winter conditions whereby only a portion of the desiccant is send through the heat exchanger at 1708 and 1709.

Figures 18A, 18B:
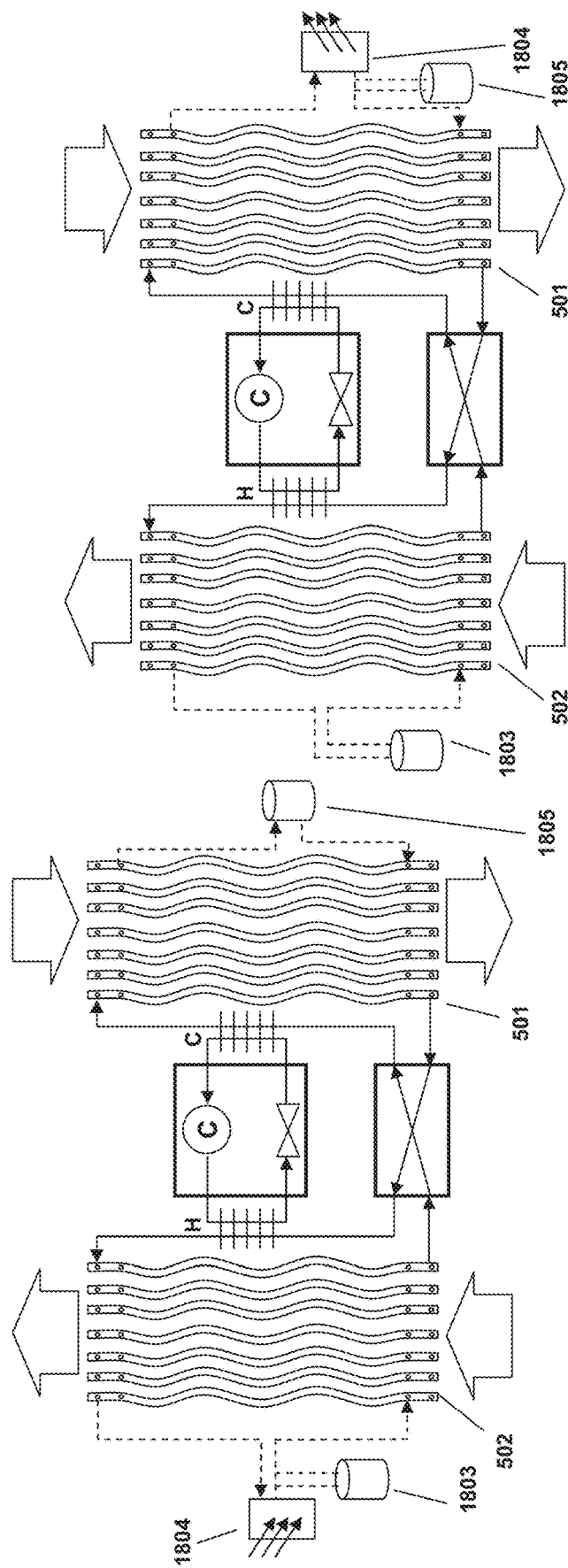
FIGS. 18A and 18B show how the heat from storage or PVT modules can be used during the day and during the night for air conditioning operation in accordance with one or more embodiments.

FIG. 18A shows how the PVT module array from FIG. 13A can be connected to the liquid desiccant system. PVT modules 1804 receive heat and the hot heat transfer fluid is send to both the desiccant regenerator 502 and the hot storage system 1803. The cold side can draw cold water from the cold storage tanks 1805. At night, FIG. 18B shows how the regenerator is now drawing from the hot storage tanks 1803 whereas the conditioner is radiating heat through the PVT modules 1804, which at the same tank provide cool water in the cold storage tanks 1805.

The setup from FIGS. 18A and 18B works well when there is a large temperature difference between night and day temperatures, e.g., as is the case in desert or in the central valley in California. However in other climates the temperature may not chance as much and additional sensible cooling can still be required. As discussed before such sensible cooling can be provided with a small chiller or a heat pump. It should be clear to those skilled in the art that other means of cooling such as Peltier cooling or evaporative cooling could be employed. In climates such as Miami, Fla. evaporative cooling is not as effective in the summer due to the already high humidity levels.

Figure 19A:
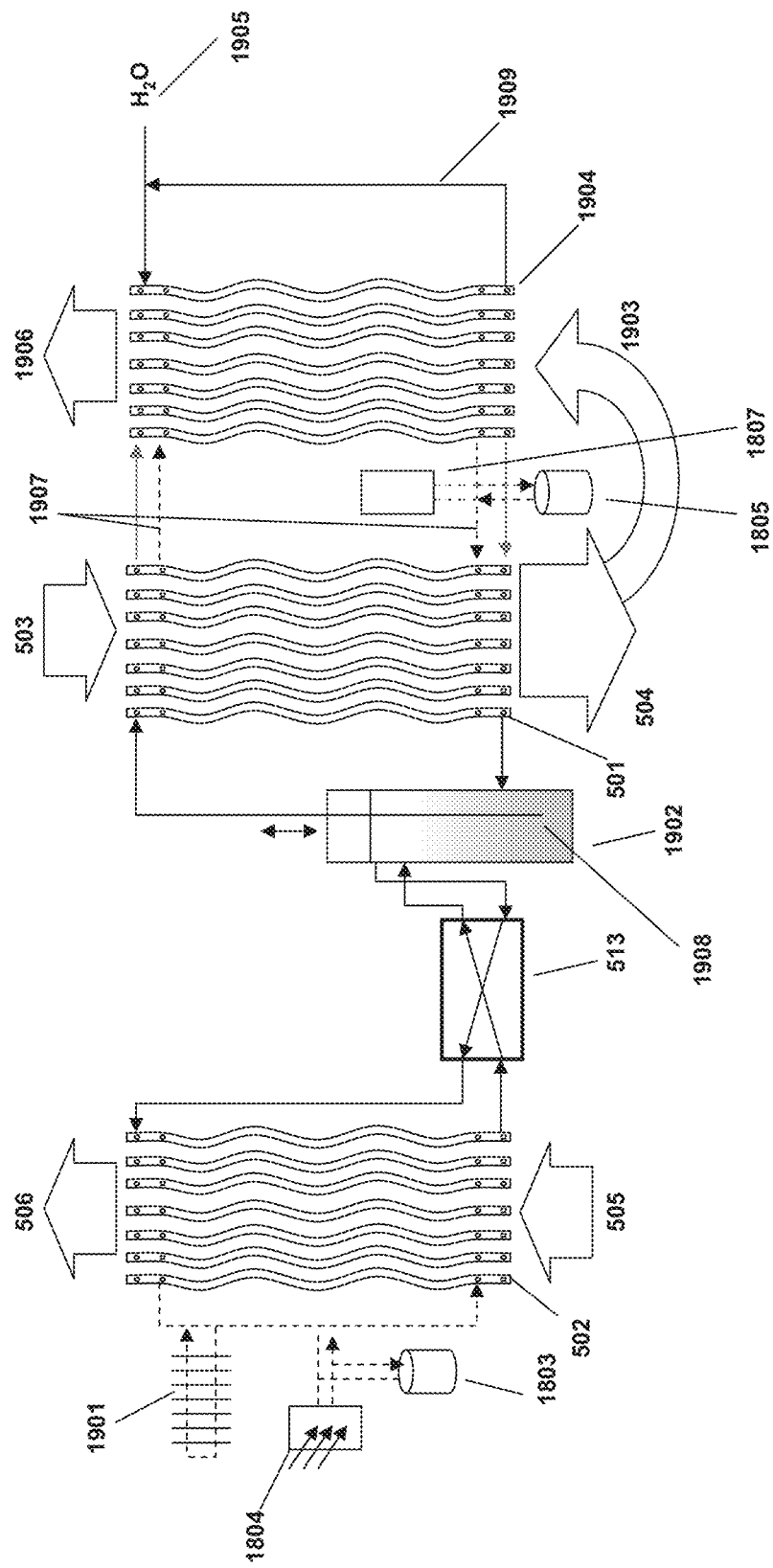
FIG. 19A shows how a desiccant concentration separator and evaporative cooler can be integrated into the wavy plate system during summer operation in accordance with one or more embodiments.
Figure 20A:
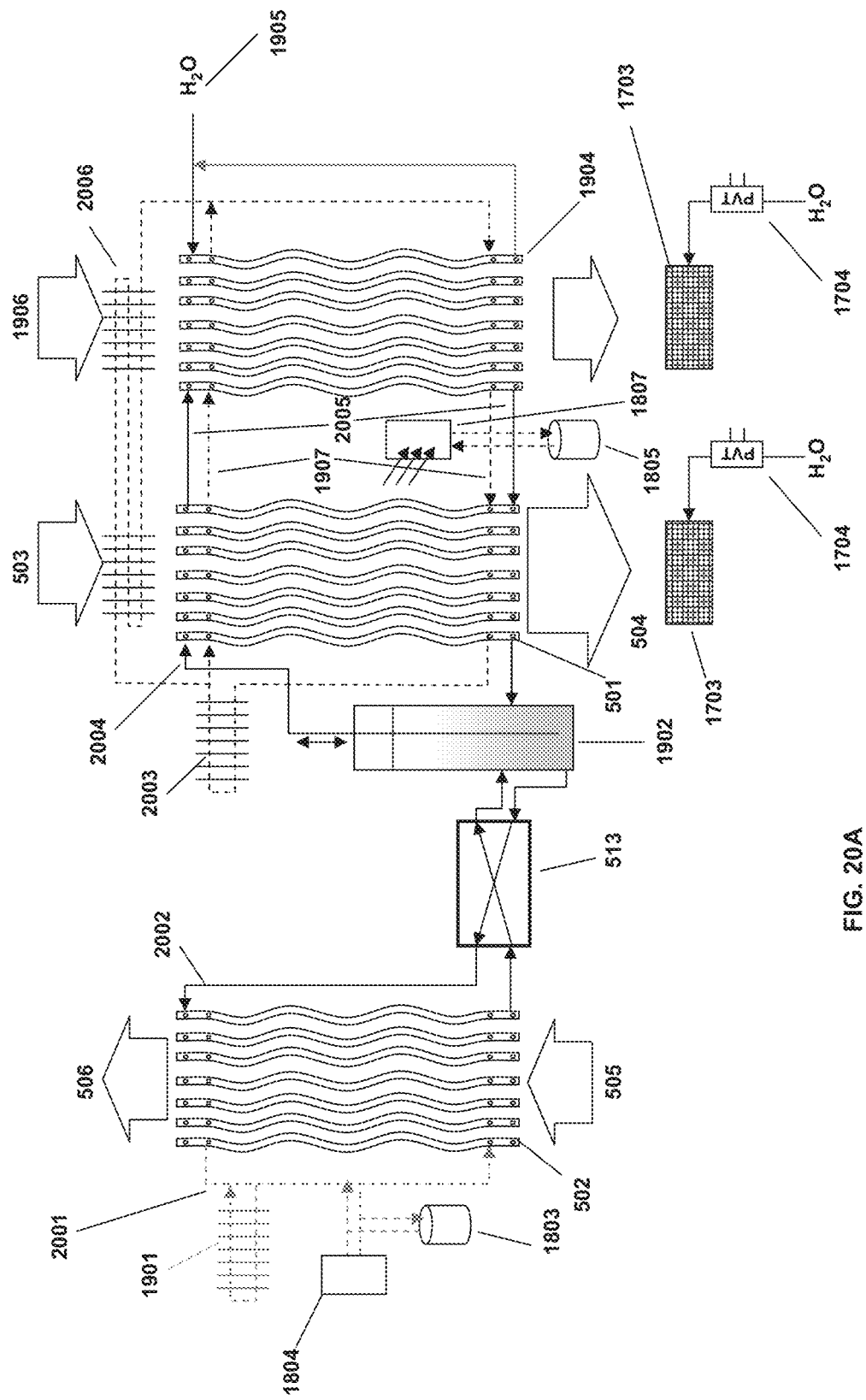
FIG. 20A shows how the additional wavy plates in FIG. 19A can be used to increase heating capacity during winter operation in accordance with one or more embodiments.
Figure 20B:
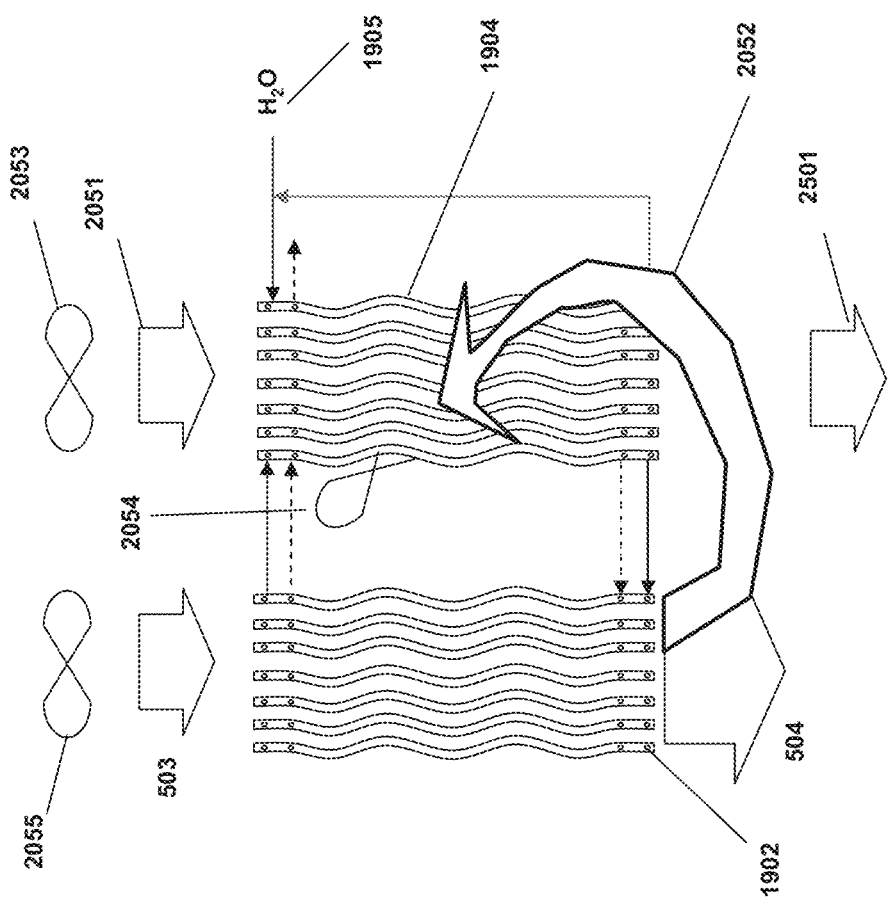
FIG. 20B shows how a portion of the air entering a conditioner can be drawn out of the conditioner and diverted to a third set of wavy plates for winter operation.

FIG. 19A shows an alternative method for cooling that uses a portion of the dehumidified air 504 and directs it to a third set of plate structures 1904. The diverted air flow 1903 is already treated and low in humidity. Instead of desiccant, the third set of plate structures has water running over its surface and behind a membrane or wicking surface, and has a heat transfer fluid internally to the plates 1907. The diverted air is now directed between the wavy plates in effect creating what is known as an evaporative chiller using the wavy plates. Water is supplied to the third set of plate structures at 1905 and un-evaporated water is returned to the top of the plates through line 1909. The portion of air 1903 that is diverted can be adjusted with louvers or baffles or some other suitable mechanism in such a way that the amount of air is variable. Varying the amount of air will regulate the temperature achieved in the building by the entering air 504. As in FIG. 18B, PVT modules 1807 can be used at night to enhance the cooling effect and cold water can be stored in tanks 1805. It would also be conceivable to locate the third set of plate structures 1904 (partially) underneath the conditioner 501. This will increase the height of the overall stack, but negates the need to redirect the air 504 in the opposite direction. Conversely it would also be possible to divert the air 504 out of the plane of the drawing and into the third set of wavy plates in a horizontal flow pattern. Locating the third set of wavy plates underneath the conditioner plates 501, has as a disadvantage that reversing the air flow for winter operation such as is shown in FIG. 20A becomes impossible. However, drawing a portion of the air 504 out perpendicular to the plane of the drawing and sending it through the third set of wavy plates 1904 in a horizontal fashion, still will allow the air in the third set of plates to be used for winter heating as is shown in FIG. 20B.

In addition to the third set of plates, FIG. 19A shows another improvement to the desiccant system. Desiccant storage system 1902 uses the fact that dilute desiccant will physically separate from concentrated desiccant if flow rates are low and the desiccant has sufficient time to settle. In other words if left alone the concentration in tank 1902 will tend to increase going from the top to the bottom. One can take advantage of this effect by connecting the desiccant lines at the appropriate heights along the sides of the tank. One can also draw the desiccant from a variable height in the tank using a vertically adjustable drain 1908. By moving the drain 1908 up, the system will drawer lower concentration desiccant resulting in less dehumidification. In effect this gives the system a control capability for humidity in the building. Lowering the drain 1908 will decrease the humidity in the building but will also result in higher costs for the regeneration. In effect this now gives the system independent control over temperature of the air by adjusting the supplemental heating system 1901 is used when the PVT modules 1804 do not generate adequate heat.

It should be understood that various features and elements (such as, e.g., the tank 1902) described in connection with particular embodiments, can also be implemented in other embodiments though not explicitly indicated.

Figure 19B:
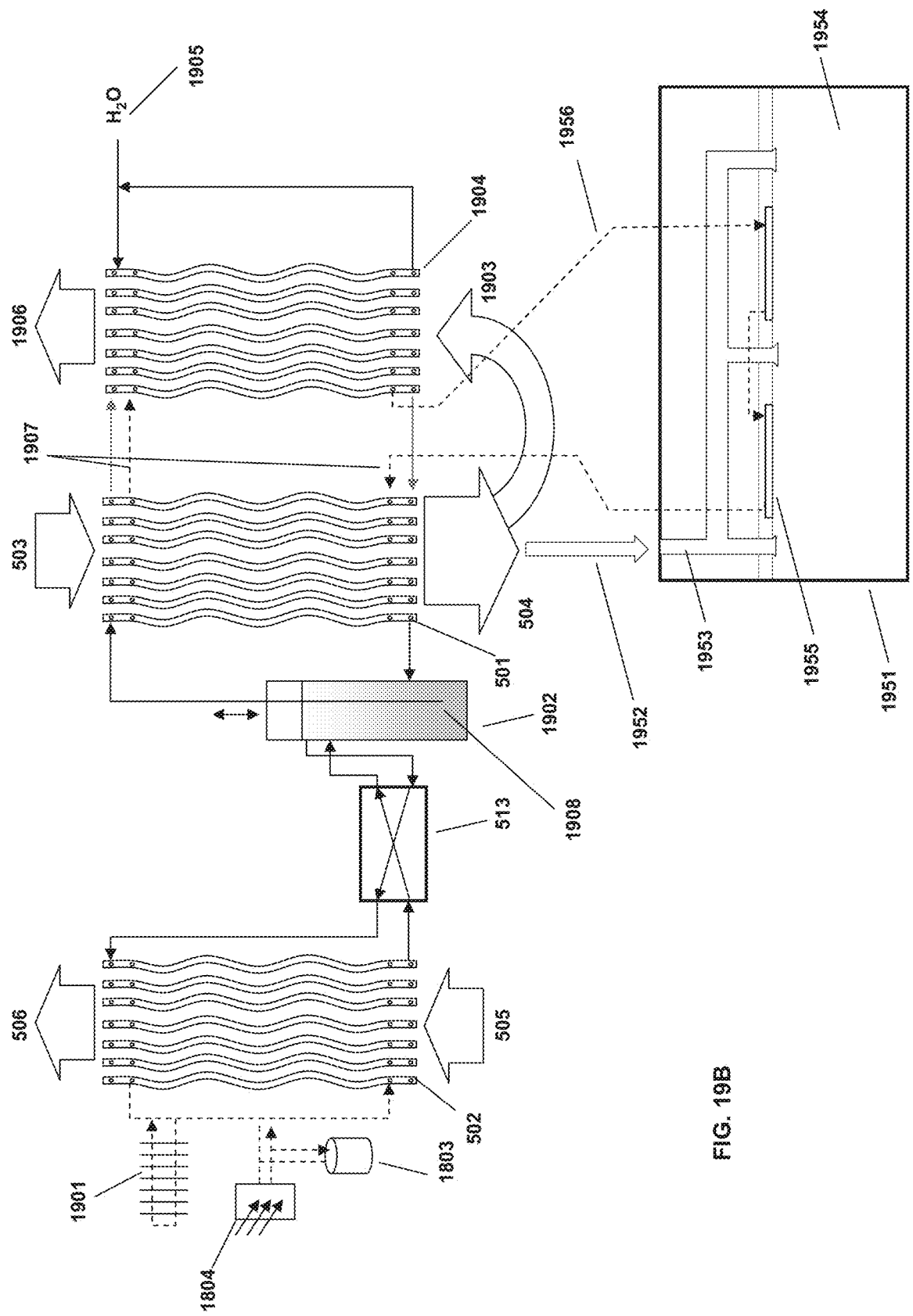
FIG. 19B shows the system of FIG. 19A integrated to a building space wherein the chilled water that is produced by the evaporative cooler is not only used for cooling the conditioner but also used for cooling ceiling panels or floor panels.

FIG. 19B shows the system of FIG. 19A wherein the third set of wavy plates 1904 that function to provide chilled water to the conditioner 501 are now also providing chilled water 1956 to one or more ceiling panels 1955, a so-called "chilled ceiling". This approach allows the chilled water produced in the third set of plates to also provide sensible space cooling in an integrated approach. The cooled and dried air 504 and 1952 is typically guided through a series of ducts 1953 and delivered to the space 1954 in the building 1951. This approach allows for easily balancing of the buildings requirements for latent and sensible cooling by varying the number of plates in the plate sets and by adjusting the desiccant concentration which in turn affects the humidity in the space. It should be clear to those skilled in the art that in stead of chilled ceiling plates a series of fan coils or other suitable liquid to air heat exchangers could be deployed.

FIG. 20A shows the system from FIG. 19A but set up for winter heating. Since oftentimes the heating capacity in the winter needs to be much larger than the cooling capacity in the summer, it is now possible to use the third set of wavy plates as part of the heating of the incoming air. Instead of flowing water over the surface of the third set of plates, the system is now using the liquid desiccant to treat the air. In winter mode the supplemental heater 1901 does not need to be used and neither does heat need to applied to the heat transfer fluid in loop 2001. In stead the supplemental heater 2003 can be used to heat the heat transfer fluid in the conditioner wavy plate sets 501 and 1904. Additional pre-heater coils 2006 can be used to heat the entering air 503 and 1906. The desiccant 2002 that enters the regenerator 502 is picking up heat and water vapor from the leaving air 505. As discussed for FIG. 17A, this serves to reduce the heating requirements for the conditioner as the desiccant through piping 2004 transports this heat and water to the conditioners. Lines 2005 now connect the desiccant to also reach the third set of wavy plates. As winter conditions oftentimes require humidification to occur, additional water can be added through either the same system 1905 that is used for evaporative cooling in summer mode or by additional humidifiers 1703.

FIG. 20B shows how the air 2051 flows in substantially a vertical direction through the third set of plates 1904 during winter heating pushed by the fan 2053. During summer cooling the air 504 is directed out of the plane of the drawing following the arrow 2052 and directed into a substantially horizontal flow direction by the fan 2054 which is substantially located behind the plane of the drawing and behind the third set of wavy plates 1904. The advantage of this approach over the approach described in FIG. 20A is that there is no need for a reversible air fan: instead a winter fan 2503 is used during heating season and a summer fan 2504 is used during cooling season. The fan 2505 on the conditioner is always directing air in the same vertical flow. A further advantage of this approach, besides the increase in winter heating capacity is that the entire area of the third set of plates is actively used in both winter and summer. The approach described in FIG. 11E has as a disadvantage 1) that is not reversible for winter heating support, 2) that the effective area, particularly for the water channels 1138 is reduced due to the manner in which air flows through the evaporative channel 1138, and 3) that the ratio of evaporative channels 1138 over desiccant channels 1137 is fixed, giving less flexibility to adopt the system to climates where maybe less evaporation is needed (sensible cooling) and more dehumidification (latent cooling). By separating the evaporative channels into a third set of plates, the flexibility is increased to adopt the system to various climate conditions.

Figure 21A:
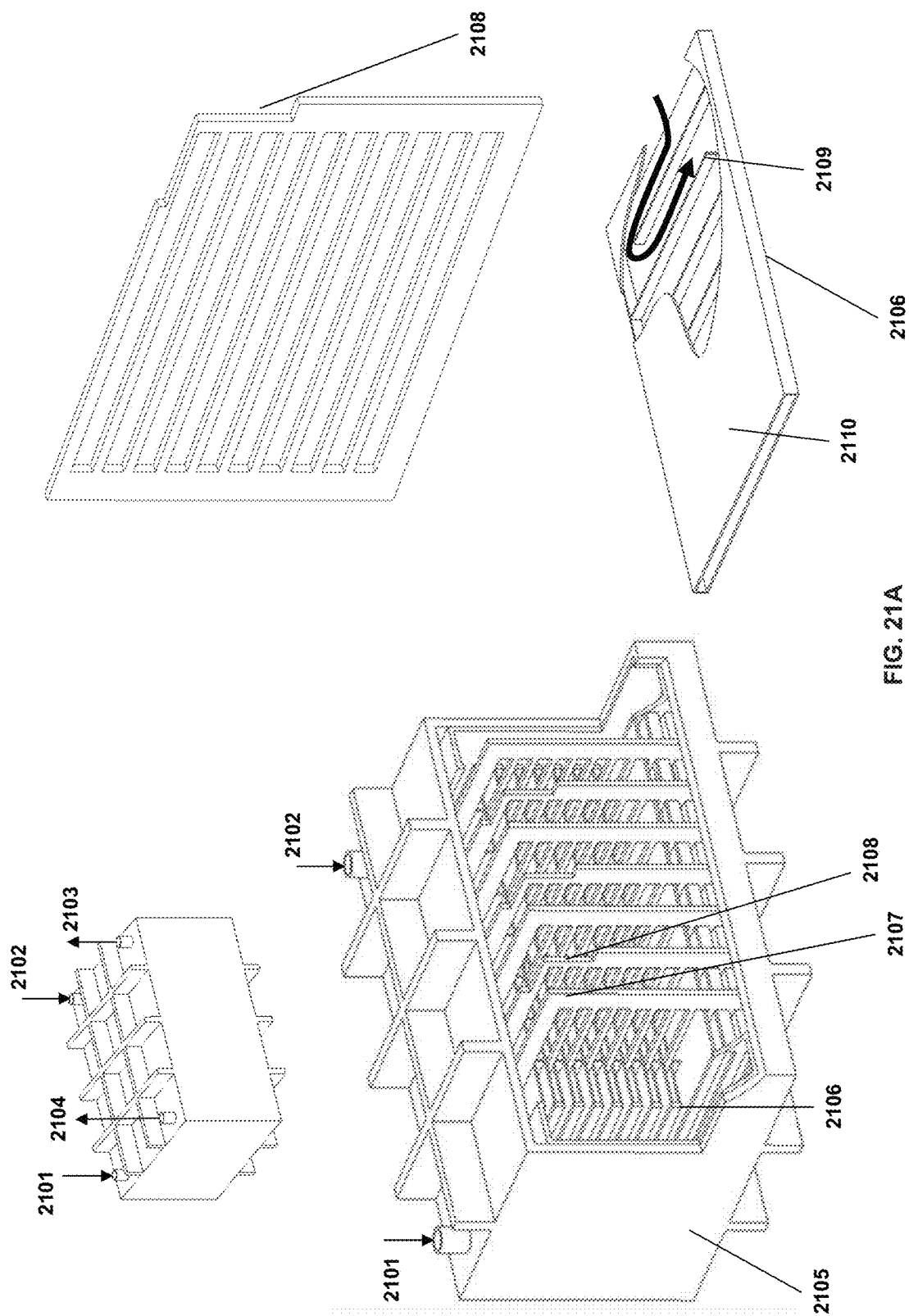
FIG. 21A shows a corrosion resistant heat exchanger with thermally conductive plastic plates in accordance with one or more embodiments.

FIG. 21A depicts a plate heat exchanger in accordance with one or more embodiments. Since the desiccants used in these air conditioning systems are typically corrosive to metals, normal heat exchanger—which is typically constructed with metal—can not easily be used unless materials have been selected specifically for corrosive duty, which usually has a negative impact on cost. By using a flat plate construction wherein the entire units is made out of plastics, costs can typically be reduced. Desiccant enters the heat exchanger in two places, for example, hot desiccant enters at 2101 and exits as cold desiccant at 2103, and cold desiccant enters at 2102 and leaves as hot desiccant at 2104. The housing 2105 contains a plate 2106 assembly that has thermally conductive surfaces 2110. Obstructions 2109 inside the plates 2106 create a long convoluted path for the desiccant. Vertical separators 2107 create a long convoluted path for the fluid flowing in the opposite direction to the fluid inside the plates. Cutouts 2108 in the vertical separators 2107 force the opposing fluid into an up-down and left-right direction. It will be clear to those skilled in the art that other construction approaches of thermally conductive flat plastic plates can be used as a heat exchanger.

FIG. 21B shows an alternative arrangement of thermally conductive plastic plates for a heat exchanger. The heat exchanger 2150 comprises a stack of formed, thermally conductive plastic plates 2155 and 2157. Cold liquid enters at 2151 and is heated through the plate assembly and exits as hot liquid at 2152. Hot liquid enters at 2153 and exits cold at 2154. Each of the plates contains a seal 2156 that is oriented in such a way the even plates 2155 allow for flow from lower left to upper right of the plates 2155 and odd numbered plates 2157 have a mirror image seal 2156' that allows flow from the lower right to the upper left. The turbulence ridges 2158 cause the liquid flow to go up and down when it moves from the inlet to the outlet, thereby creating better heat exchange with the liquid in the next channel. The turbulence ridges can be created by forming them into the plastic plate 2155 and 2157 such as for example by thermoforming or casting the plastic. Alternatively, since the molding costs of forming plastics plates are substantial, it is possible to using a glue system to attached glue lines 2158 to the plates 2155 and 2157. Such glue lines can be formed by a simple XY robotic gluing system for example using 3M Corporation's Marine 5200 Polyurethane glue. The sealant lines 2156 and 2156' can also be formed using the same gluing system, except that the height of the sealant lines would be made about 2x the height of the turbulence lines 2155 and 2157, in such as way as that when the plates are stacked the glue lines support each other and the seal lines cover the distance between the top and bottom plates.

FIG. 21C is a cross section schematic view of the plate structure and exemplary manufacturing steps involved in using glue structures to construct a fluid to fluid heat exchanger as was shown in FIG. 21B. As shown in FIG. 21C, in step A, a plate 2155 preferably made from a thermally conductive, non-corrosive material is first placed in a machine that can evenly apply glue ridges 2158 in a pre-determined pattern on one side of the plate. After the glue ridges are cured (step B), the plate is flipped over and a second set of glue ridges 2158 is applied to the opposite side of the plate (step C), in a similar or different pattern. A number of similar plates are thus constructed in this fashion. After the number of plates have cured (step D), a base 2161 of the heat exchanger is positioned and a glue pattern 2156 meant for sealing to the base is applied. Before curing can occur, the first plate 2155 is placed on the seal in such a way as to adhere to the underside of the first plate (step E). This process step is repeated with the other plates (step F). Finally, the top plate 2162 is placed with a glue seal 2156' (step G). The advantage of this construction process is that it is very easy to make heat exchanger units with different materials, plastics as well as metals, with virtually no setup or tooling costs. Furthermore, one can easily change the size of the heat exchanger by simply enlarging the plates and re-programming the glue machine. Traditional heat exchangers typically use formed metal plates and thus every size change can require a new die for forming the metal. These heat exchangers also often employ a cast urethane gasket, so changing sizes also will often require a new casting mold.

Figure 22:
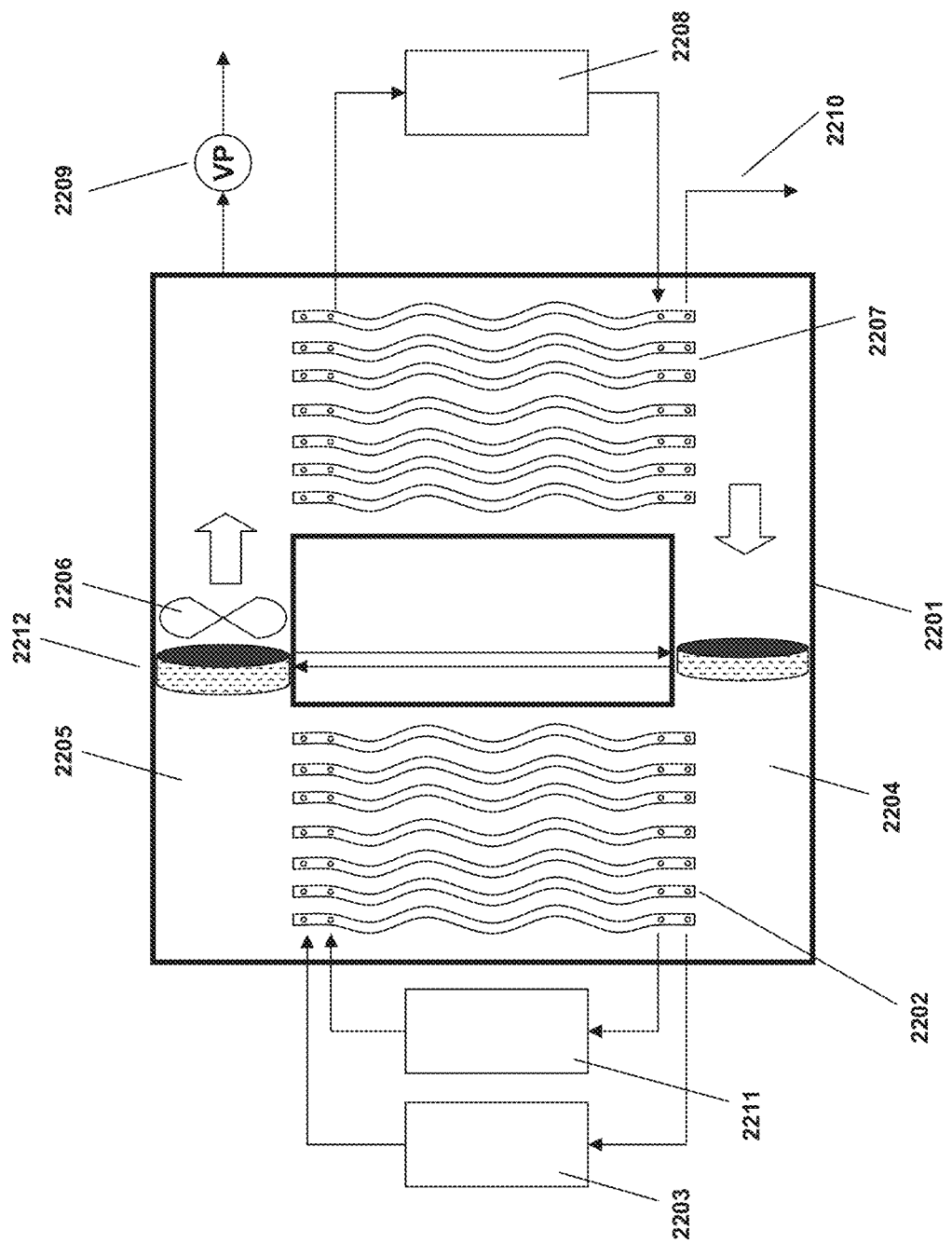
FIG. 22 shows a water recovery system using plate structures in accordance with one or more embodiments.

In certain situations it could be desirable to capture the water vapor in outdoor air and turn it into liquid water, for example, to generate drinking water. FIG. 22 shows an arrangement whereby two sets wavy plates have been integrated into an enclosure 2201. A first wavy plate set 2202 has—as before—a hot heat transfer liquid generated by a heat source 2211. Desiccant from a source 2203 is directed to the surface of the wavy plates 2201. The heat from the source 2203 causes water vapor to evolve from desiccant on the surface of the wavy plates. Air 2205 that is driven between the plates by the fan 2206 absorbs the water vapor and is moved to the right side of the system. Since the complete system is enclosed and the air is unable to escape, the relative humidity in the enclosure 2201 will reach close to 100%. When the heated, moist air 2205 exits from the first set of wavy plates, it will be close to saturation. When that same air reaches the second set of wavy plates 2207, the cold water loop 2208 causes the water vapor to condense on the surface of the wavy plates 2207 and is then collected at the bottom of the wavy plates 2207 in the form of liquid water that flows out of the system at 2210. The cooler air 2204 exits the bottom of the wavy plates 2207 and is transported back to the first set of wavy plates 2202, where it is heated again and where it absorbs water vapor from the desiccant, which starts the cycle over again. It is possible to add a vacuum pump 2209 so as to operate the system of FIG. 22 at reduced pressure. This would lower the required temperature to evolve water vapor from the desiccant on the first wavy plate set 2202, but would make the system more complicated, for example one would also have to add a pump mechanism to retrieve the condensed water from the system at outlet 2210 and to prevent the backflow of the desiccant on the first set of wavy plates 2202. An optional air to air heat exchanger 2212 could be added, but that could lead to condensation in the heat exchanger, which would be more difficult to recover. It should be clear to those skilled in the art that the condensation in the wavy plates 2207 could be accomplished in other was such as a set of metal plates that are relatively cool as compared to the wavy plates 2202. Since there is no desiccant involved in the condensation process, any suitable material such as metal plates can be used for the condensing component.

Figure 23:
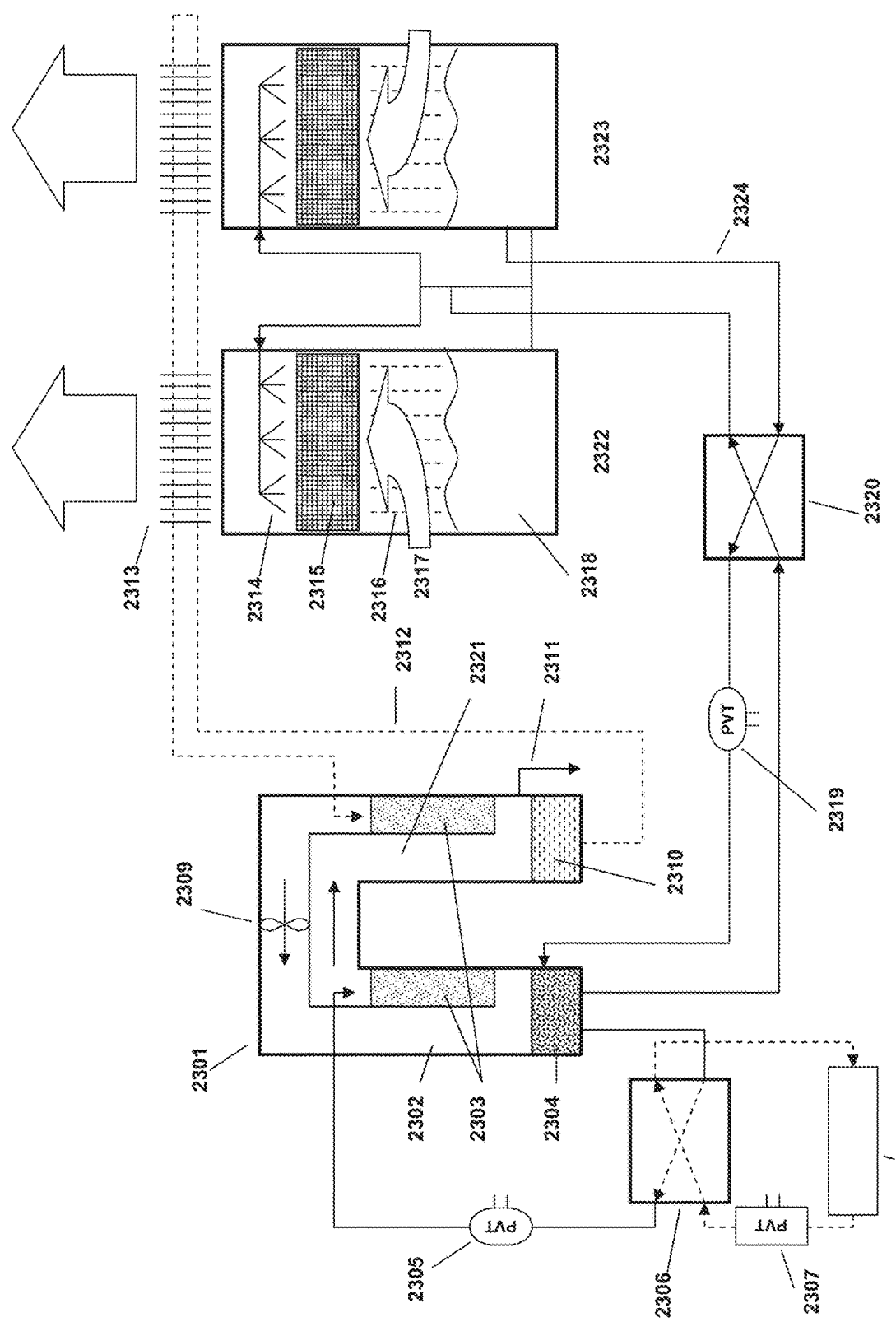
FIG. 23 shows a desiccant system for heating and dehumidification in accordance with one or more embodiments.

FIG. 23 shows a system that uses a liquid desiccant for the dehumidification of greenhouses. Conditioners 2322 and 2323 contain liquid desiccant conditioners as shown also in FIGS. 1A and 1B. The spray heads 2314 spray desiccant into a cooling tower fill 2315, which dehumidifies the greenhouse air 2317. Diluted desiccant 2316 rains down into a collection bath 2318. Some of the desiccant 2324 is pumped through the heat exchanger 2320 and reaches a regenerator 2301. The desiccant can be optionally heated by a PVT module heat source 2319 before reaching the desiccant collector 2304 that is part of the regenerator. Some of the concentrated desiccant in the collector 2304 is pumped to a heat exchanger 2306 and/or through an optional PVT module heating system 2305 before being sprayed into a filter material 2303. The filter material 2303 is able to spread the desiccant over a large area while letting air through. Air 2302 is pumped by the fan 2309 through the filter material and picks up water vapor from the hot desiccant. The hot moist air is then transported to the other side of the regenerator where cold water is sprayed into the air at 2321. Water condenses from the air and collects into a collection bath 2310. Some of the water is pumped through lines 2312 to heat exchangers 2313 where the water is cooled by the air stream coming through the conditioners 2322 and 2323. Excess water is drained at 2311. The heat for the system is provided by water heater 2308 or optionally by the PVT modules 2307. The heat exchanger 2306 is needed because the corrosion of the desiccant does not allow direct heating by the water heater.

Figure 24A:
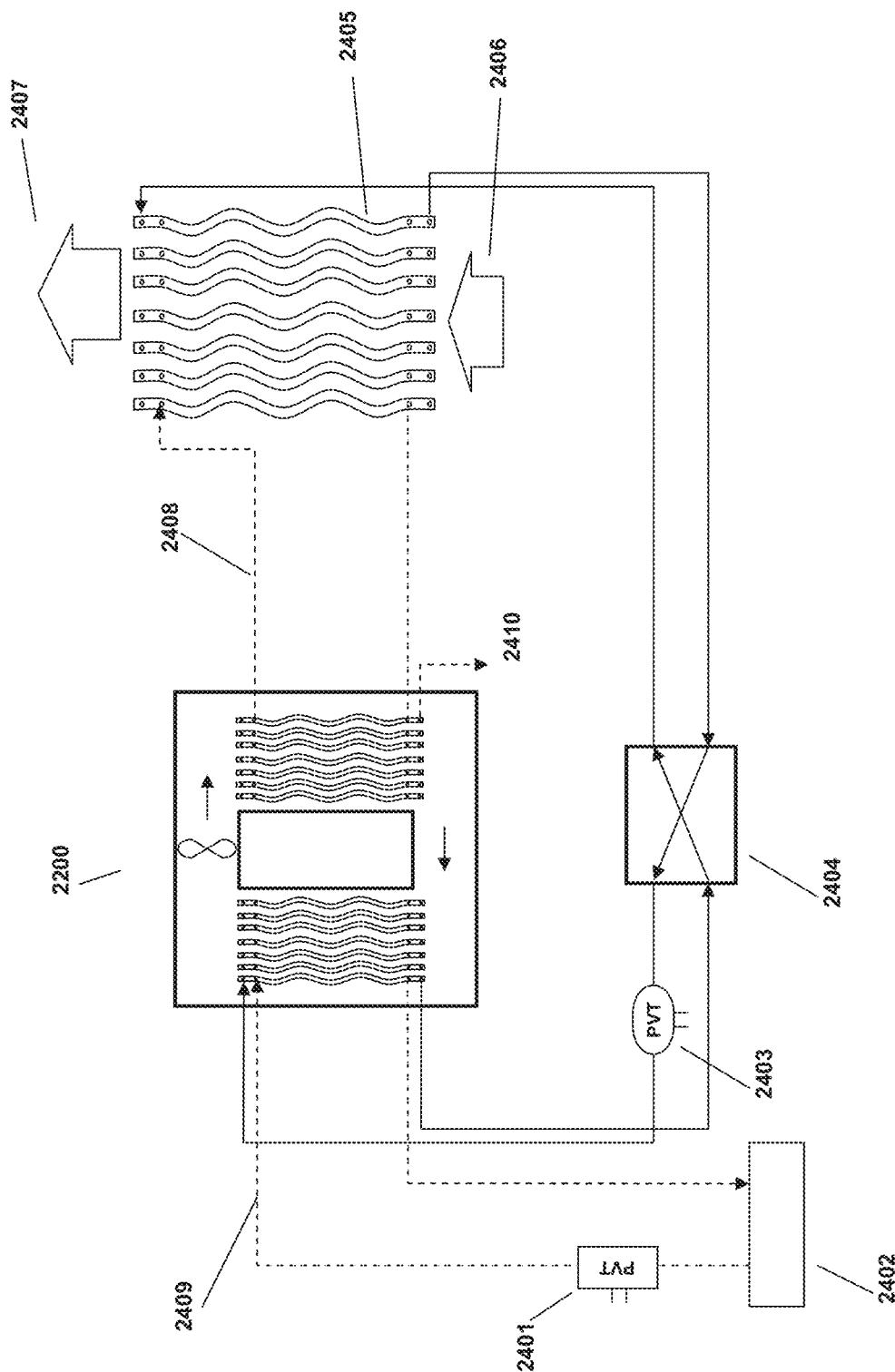
FIG. 24A shows a heating and dehumidification system using the wavy plates and a water recovery system in accordance with one or more embodiments.

FIG. 24A shows a significantly more efficient water generation system. The wavy plate conditioner 2405 treats the entering air 2406 and absorbs moisture as before into a desiccant running over the surface of the wavy plates. The leaving air 2407 is warmer and dryer than the entering air 2406. Diluted desiccant is pumped through a heat exchanger 2404 and through an optional PVT module heater 2403 to the water recovery system 2200 discussed above. Since the wavy plates in effect comprise a three way heat exchanger, the system 2400 can be much simpler. Water heater 2402 and optional PVT modules 2401 heat a heat transfer fluid 2409 which runs through the wavy plates inside the water recovery system 2200 without the need for a heat exchanger. Similarly, cooling liquid in 2408 can run directly through the conditioner wavy plates 2405 without an additional heat exchanger. This simpler system is also more energy efficient since the air flow in the conditioner is less obstructed and since the heating and cooling in the wavy plates is done in-situ. As a result a lower temperature heat source such as the PVT modules can be used. Water is recovered again at 2410.

Figure 24B:
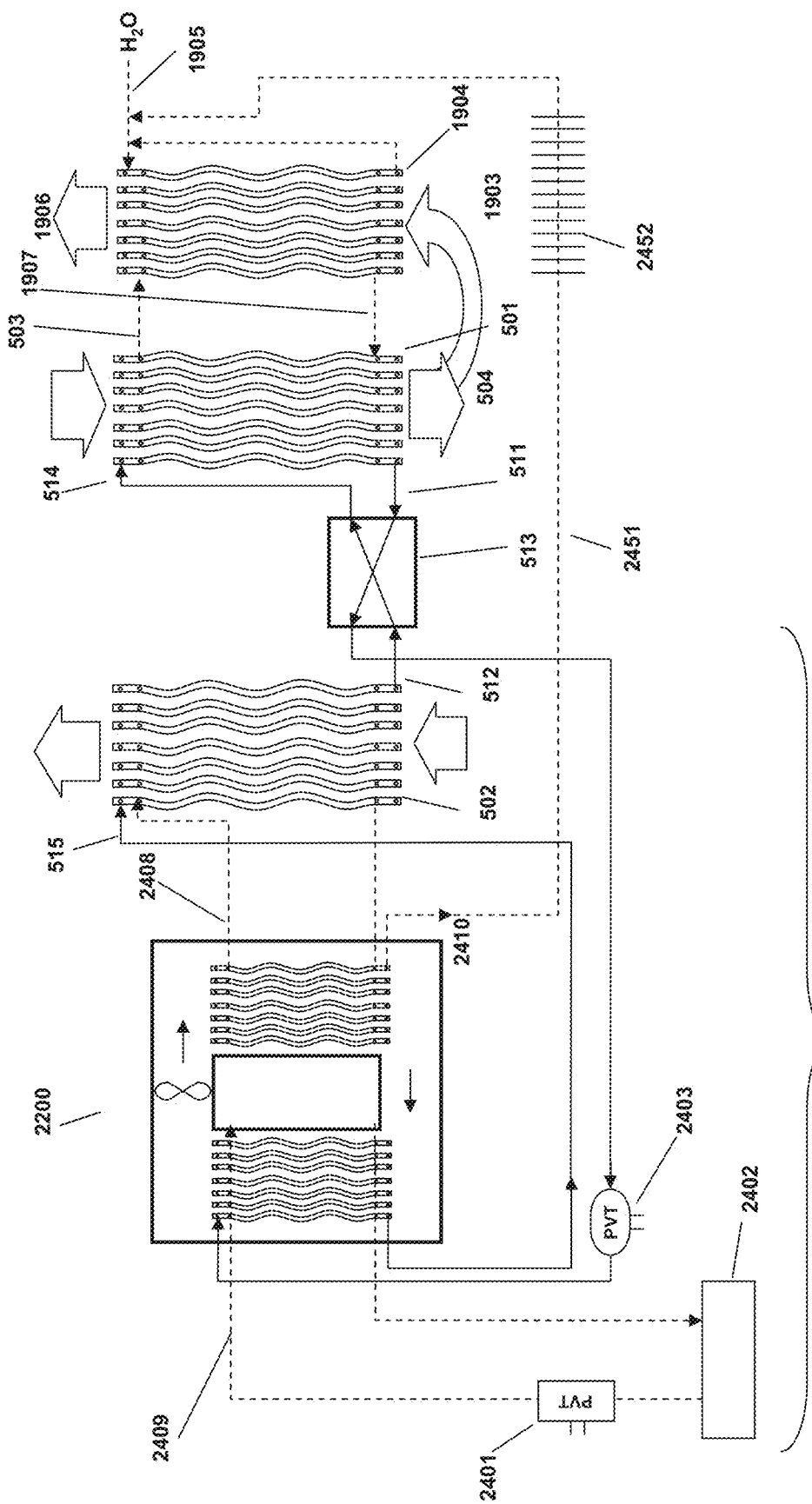
FIG. 24B shows a dual effect desiccant regeneration system which uses recovered liquid water for indirect evaporative cooling.

The regeneration of dilute liquid desiccant should preferably be performed at high efficiency as well as at low temperature. Multiple effect regenerations are known in the art that have high efficiency, but generally also require high temperatures. High regeneration temperatures make it difficult or impossible to use "waste" energy sources or solar energy sources. Generally speaking lower temperature waste energy is more readily and cheaply available than high temperature waste energy. FIG. 24B shows a combination of the water recovery system from FIG. 22 and the indirect cooling system of FIG. 19A. By combining the water recovery system 2200 into the regenerator plate set 502, the regeneration of desiccant becomes what is known as a multiple effect regenerator. The dilute desiccant 511 is first directed to the plates inside the water recovery system 2200. Inside the wavy plates hot water 2409 is provided to evaporate water from the liquid desiccant. The liquid desiccant exits at the water generator at higher concentration and is directed to the plates at 515. Hot water vapor inside the water generator 2200 heats the water loop 2408 which in turn heats the wavy plates 502 of the regenerator. Concentrated desiccant 512 is then returned through the heat exchanger 513 to be reused in the conditioner. One advantage of this system is that it can regenerate at higher efficiencies than a single effect regenerator, while still operating at lower temperatures. Furthermore the recovered water 2410 can be directed through water line 2451 and optional cooler 2452 to the evaporative section of the indirect cooling system from FIG. 19A, thereby reducing or even eliminating the need to provide a water supply source.

Figure 25:
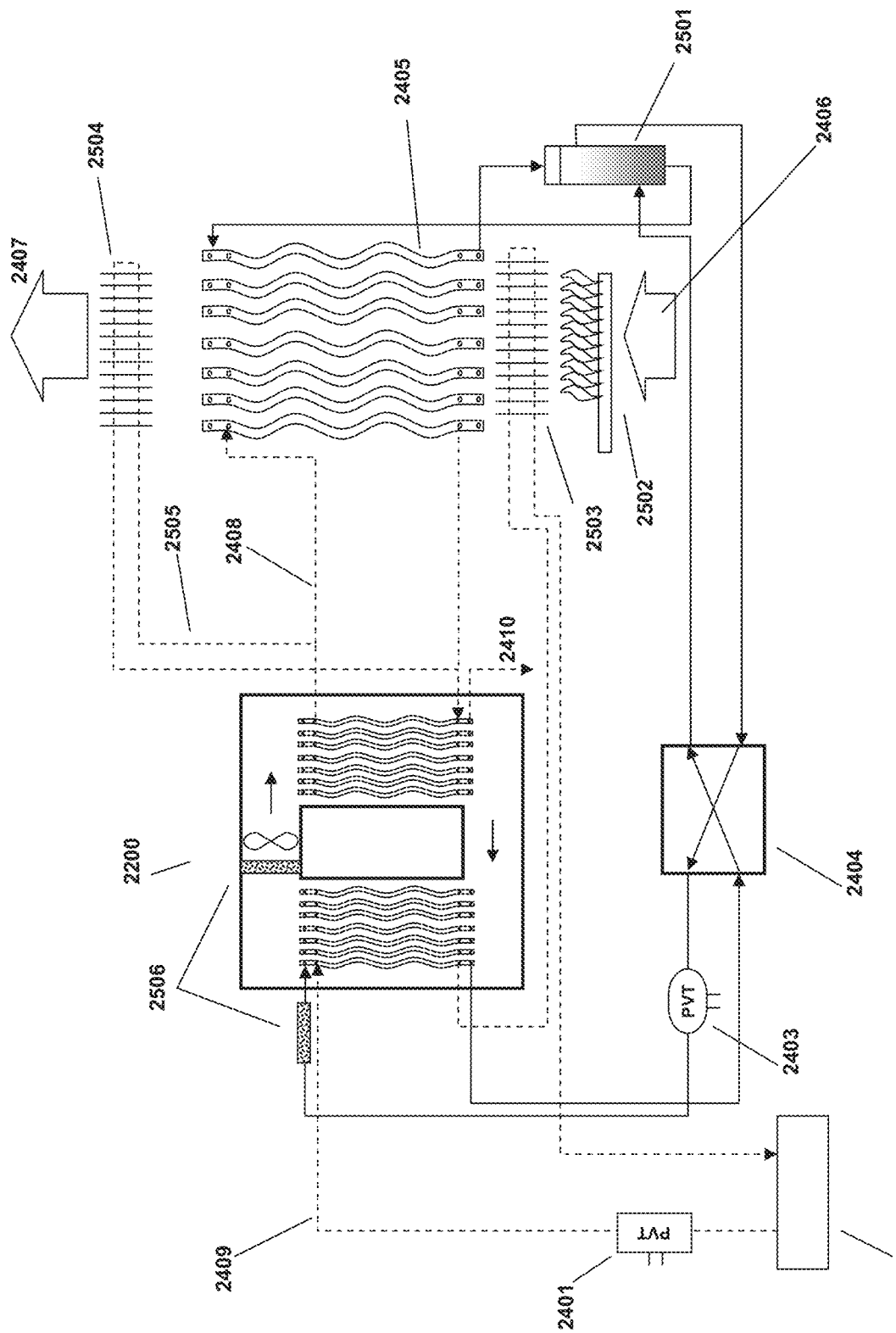
FIG. 25 shows a desiccant air conditioning system which captures and condenses combustion gasses and recovers water in accordance with one or more embodiments.

FIG. 25 shows the system of FIG. 24A with some additional improvements. Rather than sending all of the desiccant to the regenerator 2200, the separator 2501 allows for the least concentrated desiccant near the top of the separator to be sent for regeneration and the most concentrated desiccant to be used again in the conditioner. Combustion of fossil fuels generally results in carbon dioxide and water vapor being produced. Other combustion byproducts are contaminants such as $NO_x$ and $SO_x$ and other residual by products. Gas burner 2502 produces these gasses if it is used in the space to be treated such as inside a greenhouse. Hot water coils 2503 absorb most of the heat generated by the burner. The hot water is used in the regenerator 2200. Water vapor, CO2 and the contaminants such as $NO_x$ and $SO_x$ go through the hot water coils and enter the wavy plates 2405. The CO2 is desired in the greenhouse, but water vapor and other contaminants are not. In effect the wavy plates function as what is known as a condensing boiler by absorbing the water in the combustion exhaust, which releases additional heat and makes the overall combustion process more efficient. But unlike a condensing boiler the desiccant is also able to absorb some of the contamination in the burner effluents. The desiccant transports these contaminants with the water to the regenerator 2200 where supplemental filters 2411 can be employed to filter these contaminants out of the desiccant or out of the air stream in the regenerator. The arrangement in FIG. 25 allows for burning of fuels such as biogases that are not as clean burning as natural gas. Also shown in the figure is an additional external cooling cool 2504 that can be added to aid in the condensation of the water.

Figure 26:
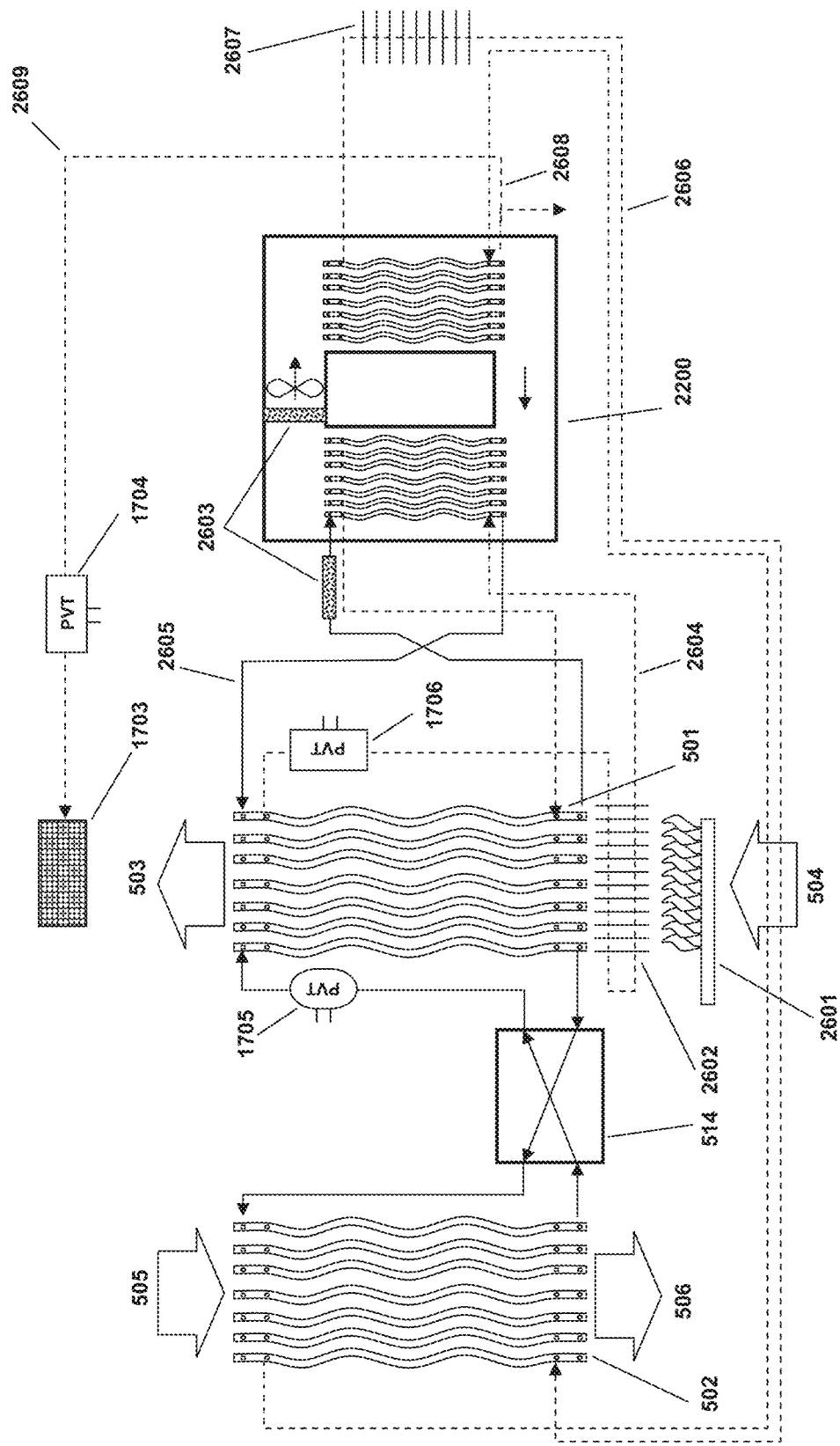
FIG. 26 shows a desiccant air conditioning system setup for winter heating that also condenses water vapor and captures contaminants from the combustion process in accordance with one or more embodiments.

FIG. 26 shows how some of the concepts discussed in the previous figure can also be integrated into winter heating system as discussed in FIG. 17. Water heater 2602 uses a gas burner 2601. The heated water 2604 can also be heated by the PVT modules 1706 to heat the conditioner 501. Desiccant on the surface of the regenerator 501 absorbs water vapor and other contaminants such as $NO_x$ and $SO_x$ and other residual by products. The desiccant is transported to the water recovery system 2200 through optional filters 2603 that can capture some of the contaminants in the desiccant. Recovered water at 2608 can be drained off or can be diverted to a humidifier 1703 through lines 2609, which can optionally be preheated by PVT modules 1704 or some other heat source. The cold loop for the condensation of water in the regenerator 2200 can be cooled by an external cooling coil 2607, but can also be cooled by running water to the wavy plates 502 by the lines 2606.

FIGS. 27A and 27B show three dimensional views of the desiccant system from FIG. 24A set up for greenhouse heating. FIG. 27A shows the enclosure 2701 containing the desiccant conditioner wavy plates 2405. Fans 2701 can move the air through the desiccant conditioner. FIG. 27B shows a rear view of the same system with some openings provided to illustrate the internal components. The regenerator plates 2202 receive hot water from the water heater 2402. Heat exchanger 2404 separates the hot and cold desiccants. Condenser plates 2207 collect the water from the system.

Figure 28:
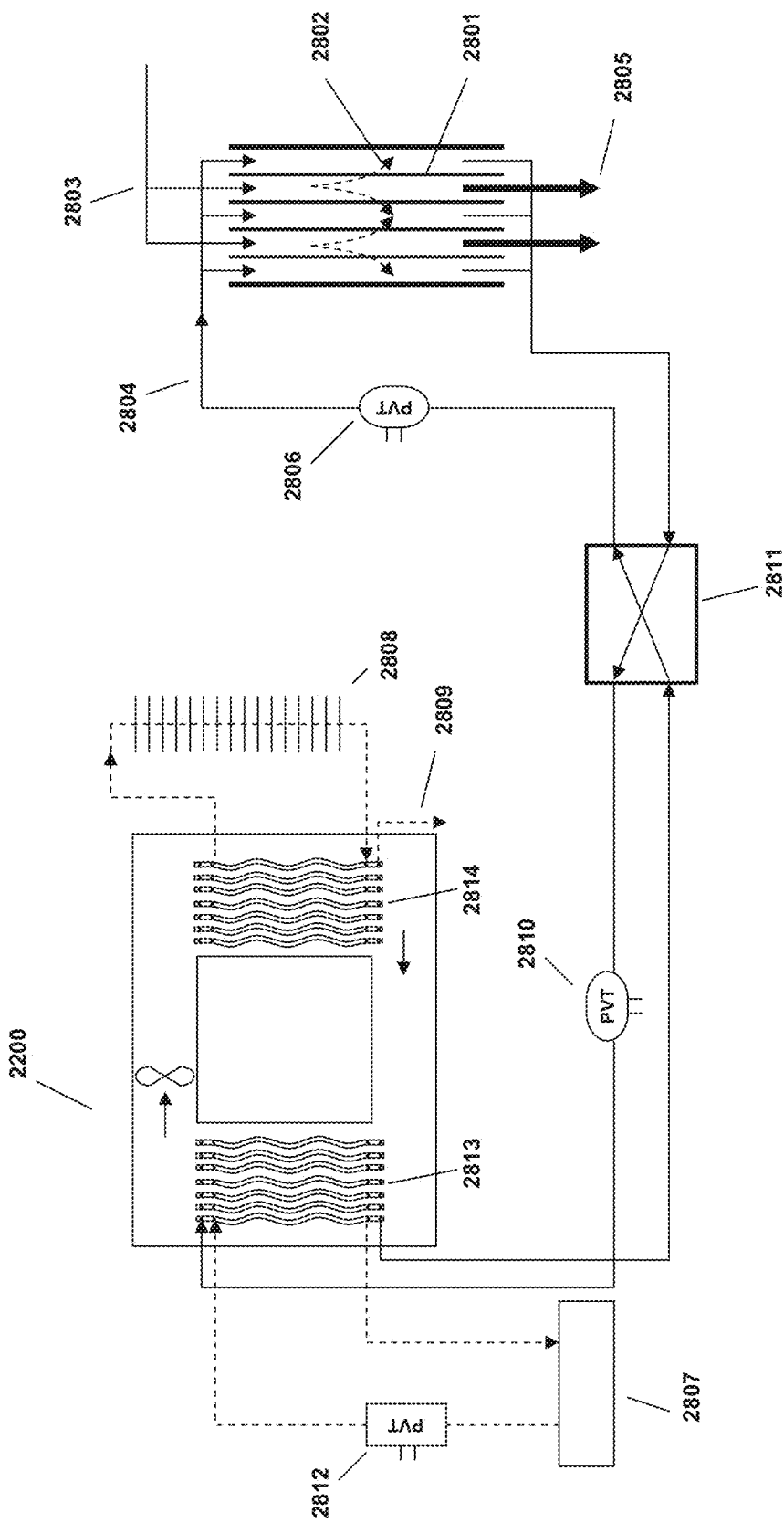
FIG. 28 shows the water recovery system of FIG. 22 integrated to a desalination system for water purification in accordance with one or more embodiments.

FIG. 28 shows how the water generator 2200 can be used in a desalination system. Seawater 2803 is guided between a set of membranes 2801 that have concentrated desiccant 2804 on the opposite side. The desiccant functions as a draw fluid attracting water 2802 through the membrane into the desiccant, thereby diluting the desiccant. An optional set of PVT modules 2806 can preheat some of the desiccant. The diluted desiccant is now guided through the heat exchanger 2811 to the regenerator 2200. A heating system 2807 heats a heat transfer fluid that is used in the regenerator wavy plates 2813. The heat transfer fluid can also be heated by the PVT modules 2812. The desiccant can also be heated by the PVT modules 2810. An external cooling loop 2808 can be employed to cool the condenser plates 2814. Pure water is recovered at point 2809. The advantage if the described system is that it can operate at significantly lower power levels than desalination systems that use osmosis, since solution pump power can be kept very low.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions. Accordingly, the foregoing description and attached drawings are by way of example only, and are not intended to be limiting.

The invention claimed is:

1. A liquid desiccant air conditioning system operable in a warm weather operation mode and/or a cold weather operation mode for treating an air stream entering a building space, comprising: a conditioner including a plurality of structures arranged in a substantially parallel orientation, said plurality of structures being spaced apart from each other with an air stream gap between each pair of adjacent structures, each of the plurality of structures having at least one outer surface facing an air stream gap across which a liquid desiccant flows, wherein the air stream flows through the air stream gaps between the plurality of structures such that the liquid desiccant dehumidifies the air stream in the warm weather operation mode and humidifies the air stream in the cold weather operation mode, wherein each of the plurality of structures includes a passage therein through which a conditioner heat transfer fluid flows, the conditioner heat transfer fluid for cooling the liquid desiccant used in the conditioner in the warm weather operation mode and heating the liquid desiccant used in the conditioner in the cold weather operation mode, the conditioner further comprising one or more liquid desiccant collectors for collecting the liquid desiccant that has flowed across the at least one outer surface of each of the plurality of structures; a regenerator connected to the conditioner for receiving the liquid desiccant used in the conditioner, treating the liquid desiccant, and returning the liquid desiccant to the conditioner, wherein the regenerator treats the liquid desiccant by causing the liquid desiccant to desorb water in the warm weather operation mode and to absorb water in the cold weather operation mode; a liquid desiccant heat exchanger connected between the conditioner and the regenerator for transferring heat from the liquid desiccant flowing from the regenerator to the conditioner to the liquid desiccant flowing from the conditioner to the regenerator in the warm weather operation mode, and for transferring heat from the liquid desiccant flowing from the conditioner to the regenerator to the liquid desiccant flowing from the regenerator to the conditioner in the cold weather operation mode; a heat pump for heating the liquid desiccant flowing from the conditioner to the regenerator and cooling the liquid desiccant flowing from the regenerator to the conditioner in the warm weather operation mode, and for cooling the liquid desiccant flowing from the conditioner to the regenerator and heating the liquid desiccant flowing from the regenerator to the conditioner in the cold weather operation mode; an apparatus for moving the air stream through the conditioner; and an apparatus for circulating the liquid desiccant between the conditioner and the regenerator.

2. The liquid desiccant air conditioning system of claim 1, wherein each of the plurality of structures includes a sheet of material positioned proximate to the at least one outer surface of each of the plurality of structures between the liquid desiccant and the air stream, each sheet of material permitting transfer of water vapor between the liquid desiccant and the air stream.

3. The liquid desiccant air conditioning system of claim 1, further comprising a cold source for cooling the conditioner heat transfer fluid in the warm weather operation mode, and a heat source for heating the conditioner heat transfer fluid in the cold weather operation mode.

4. The liquid desiccant air conditioning system of claim 1, wherein the heat pump includes heat exchanger coils for directly heating the liquid desiccant in the cold weather operation mode and directly cooling the liquid desiccant in the warm weather operation mode.

5. The liquid desiccant air conditioning system of claim 1, further comprising an evaporative chiller connected to the conditioner for receiving at least a portion of the dehumidified air stream exiting the conditioner in the warm weather operation mode, and wherein the evaporative chiller is configured to cause the portion of the dehumidified air stream to absorb water from a water source and thereby cool the conditioner heat transfer fluid cool the air stream in the conditioner.

6. The liquid desiccant air conditioning system of claim 1, wherein the plurality of structures in the conditioner have a substantially vertical orientation.

7. The liquid desiccant air conditioning system of claim 1, wherein the regenerator includes a plurality of regenerator structures arranged in a substantially parallel orientation, said plurality of regenerator structures being spaced apart from each other with an air stream gap between each pair of adjacent regenerator structures, each of the plurality of regenerator structures having at least one outer surface facing an air stream gap across which the liquid desiccant flows, wherein the air stream flows through the air stream gaps between the plurality of regenerator structures such that the liquid desiccant humidifies the air stream in the warm weather operation mode and dehumidifies the air stream in the cold weather operation mode.

8. The liquid desiccant air conditioning system of claim 7, wherein each of the plurality of regenerator structures includes a sheet of material positioned proximate to the at least one outer surface of each of the plurality of regenerator structures between the liquid desiccant and the air stream, each sheet of material permitting transfer of water vapor between the liquid desiccant and the air stream, wherein each of the plurality of regenerator structures includes a passage therein through which a regenerator heat transfer fluid flows, the regenerator heat transfer fluid for heating the liquid desiccant used in the regenerator in the warm weather operation mode and cooling the liquid desiccant used in the regenerator in the cold weather operation mode, the regenerator further comprising one or more liquid desiccant collectors for collecting liquid desiccant that has flowed across the at least one outer surface of each of the plurality of regenerator structures.

9. The liquid desiccant air conditioning system of claim 8, wherein the heat pump heats the conditioner heat transfer fluid and cools the regenerator heat transfer fluid in the cold weather operation mode, and wherein the heat pump heats the regenerator heat transfer fluid and cools the conditioner heat transfer fluid in the warm weather operation mode.

10. The liquid desiccant air conditioning system of claim 1, further comprising a tank for storing the liquid desiccant, wherein the liquid desiccant varies in concentration along the height of the tank, and a drain for drawing the liquid desiccant from the tank at different selected heights of the tank in order to obtain liquid desiccant having a desired concentration for use in the conditioner.

11. A method of using a liquid desiccant air conditioning system for treating an air stream entering a building space, the liquid desiccant air conditioning system including a conditioner, a regenerator, and a heat pump, wherein the conditioner includes a plurality of structures arranged in a substantially parallel orientation, said plurality of structures being spaced apart from each other with an air stream gap between each pair of adjacent structures, each of the plurality of structures having at least one outer surface facing an air stream gap, each of the plurality of structures including a passage therein, the method comprising: (a) flowing a liquid desiccant across the at least one outer surface of each of the plurality of structures and flowing a conditioner heat transfer fluid through the passage of each of the plurality of structures to cool the liquid desiccant flowing across the at least one outer surface in a warm weather operation mode and to heat the liquid desiccant flowing across the at least one outer surface in a cold weather operation mode; (b) flowing the air stream to be provided to the building space through the air stream gaps between the plurality of structures such that the liquid desiccant dehumidifies the air stream in the warm weather operation mode and humidifies the air stream in the cold weather operation mode; (c) collecting the liquid desiccant that has flowed across the at least one outer surface of each of the plurality of structures and transferring the liquid desiccant to a regenerator; (d) causing the liquid desiccant to desorb water in the warm weather operation mode and to absorb water in the cold weather operation mode in the regenerator; (e) heating the liquid desiccant flowing from the conditioner to the regenerator and cooling the liquid desiccant flowing from the regenerator to the conditioner in the warm weather operation mode using the heat pump; and cooling the liquid desiccant flowing from the conditioner to the regenerator and heating the liquid desiccant flowing from the regenerator to the conditioner in the cold weather operation mode using the heat pump; and (f) transferring heat from the liquid desiccant flowing from the regenerator to the conditioner to the liquid desiccant flowing from the conditioner to the regenerator in the warm weather operation mode, and transferring heat from the liquid desiccant flowing from the conditioner to the regenerator to the liquid desiccant flowing from the regenerator to the conditioner in the cold weather operation mode using a liquid desiccant heat exchanger.

12. The method of claim 11, wherein each of the plurality of structures includes a sheet of material positioned proximate to the at least one outer surface of each of the plurality of structures, each sheet of material permitting transfer of water vapor between the liquid desiccant and the air stream, and wherein step (b) comprises flowing the liquid desiccant between the sheet of material and the at least one outer surface of each of the plurality of structures.

13. The method of claim 11, further comprising cooling the conditioner heat transfer fluid in the warm weather operation mode, and heating the conditioner heat transfer fluid in the cold weather operation mode.

14. The method of claim 11, wherein step (e) comprises directly heating the liquid desiccant and directly cooling the liquid desiccant using heat exchanger coils in the heat pump.

15. The method of claim 11, further comprising diverting at least a portion of the dehumidified air stream exiting the conditioner in the warm weather operation mode and causing the portion of the dehumidified air stream to absorb water from a water source and thereby cool the conditioner heat transfer fluid to cool the air stream in the conditioner.

16. The method of claim 11, wherein the regenerator includes a plurality of regenerator structures arranged in a substantially parallel orientation, said plurality of regenerator structures being spaced apart from each other with an air stream gap between each pair of adjacent regenerator structures, each of the plurality of regenerator structures having at least one outer surface facing an air stream gap across which the liquid desiccant flows, wherein step (d) comprises flowing the air stream through the air stream gaps between the plurality of regenerator structures such that the liquid desiccant humidifies the air stream in the warm weather operation mode and dehumidifies the air stream in the cold weather operation mode.

17. The method of claim 16, wherein each of the plurality of regenerator structures includes a sheet of material positioned proximate to the at least one outer surface of each of the plurality of regenerator structures, each sheet of material permitting transfer of water vapor between the liquid desiccant and the air stream, and wherein step (d) comprises flowing the liquid desiccant between the sheet of material and the at least one outer surface of each of the plurality of regenerator structures.

18. The method of claim 11, further comprising storing the liquid desiccant in a tank, wherein the liquid desiccant varies in concentration along the height of the tank, and drawing the liquid desiccant from the tank at a given selected height of the tank in order to obtain liquid desiccant having a desired concentration for use in the conditioner.

19. The method of claim 16, wherein each of the plurality of regenerator structures includes a passage therein, and wherein step (d) further comprises flowing a regenerator heat transfer fluid through the passage of each of the plurality of regenerator structures to heat the liquid desiccant flowing across the at least one outer surface in the warm weather operation mode and to cool the liquid desiccant flowing across the at least one outer surface in the cold weather operation mode.

20. The method of claim 19, wherein step (e) comprises heating the conditioner heat transfer fluid and cooling the regenerator heat transfer fluid in the cold weather operation mode using the heat pump, and heating the regenerator heat transfer fluid and cooling the conditioner heat transfer fluid in the warm weather operation mode using the heat pump.

* * * * *